(12) United States Patent
Kim et al.

(10) Patent No.: US 10,982,042 B2
(45) Date of Patent: Apr. 20, 2021

(54) POLYMER AND ORGANIC SOLAR CELL INCLUDING SAME

(71) Applicant: LG CHEM, LTD., Seoul (KR)

(72) Inventors: Ji Hoon Kim, Daejeon (KR); Jiyoung Lee, Daejeon (KR); Songrim Jang, Daejeon (KR); Doowhan Choi, Daejeon (KR); Bogyu Lim, Daejeon (KR)

(73) Assignee: LG CHEM, LTD.

( * ) Notice: Subject to any disclaimer, the term of this patent is extended or adjusted under 35 U.S.C. 154(b) by 52 days.

(21) Appl. No.: 16/484,838

(22) PCT Filed: Sep. 11, 2018

(86) PCT No.: PCT/KR2018/010609
§ 371 (c)(1),
(2) Date: Aug. 9, 2019

(87) PCT Pub. No.: WO2019/066305
PCT Pub. Date: Apr. 4, 2019

(65) Prior Publication Data
US 2019/0359765 A1     Nov. 28, 2019

(30) Foreign Application Priority Data

Sep. 27, 2017 (KR) ............ 10-2017-0125116

(51) Int. Cl.
*C08G 61/12* (2006.01)
*H01L 31/0256* (2006.01)
*H01L 51/00* (2006.01)

(52) U.S. Cl.
CPC ........ *C08G 61/126* (2013.01); *H01L 31/0256* (2013.01); *H01L 51/0068* (2013.01); *H01L 51/0074* (2013.01); *C08G 2261/3241* (2013.01); *C08G 2261/3246* (2013.01); *H01L 2031/0344* (2013.01)

(58) Field of Classification Search
CPC ...... Y02E 10/549; C08G 2261/91; C08K 5/45
See application file for complete search history.

(56) References Cited

FOREIGN PATENT DOCUMENTS

| WO | 2017/047808 | 3/2017 | |
|---|---|---|---|
| WO | WO 2017-047808 A1 * | 3/2017 | ............ C08G 61/12 |

OTHER PUBLICATIONS

Lin et al. "High-Performance Electron Acceptor with Thienyl Side Chains for Organic Photovoltaics" Journal of the American Chemical Society,138(4): 4955-4961 (2016).
Li et al. "Energy-Level Modulation of Small-Molecule Electron Acceptors to Achieve Over 12% Efficiency in Polymer Solar Cells" Advanced Materials, 28(42): 9423-9429 (2016).
Zhao et al. "Molecular Optimization Enables Over 13% Efficiency in Organic Solar Cells" Journal of the American Chemical Society, 139(21): 7148-7151 (2017).

(Continued)

*Primary Examiner* — Khanh T Nguyen
(74) *Attorney, Agent, or Firm* — Myers Bigel, P.A.

(57) ABSTRACT

The present specification relates to a polymer including a first unit represented by Chemical Formula 1; a second unit represented by Chemical Formula 2; and a third unit represented by Chemical Formula 3 or 4, and an organic solar cell including the polymer in a photoactive layer.

16 Claims, 10 Drawing Sheets

(56) References Cited

OTHER PUBLICATIONS

Wang et al. "Efficient Fullerence-Free Polymer Solar Cells Based on Alkylthio Substituted Conjugated Polymers" The Journal of Physical Chemistry C, 121(9): 4825-4833 (2017).
Xu et al. "n-Type conjugated electrolytes cathode interlayer with thickness-insensitivity for highly efficient organic solar cells" Journal of Materials Chemistry A, 5(26): 13807-13816 (2017).
Bin et al. "Non-Fullerene Polymer Solar Cells Based on Alkylthio and Fluorine Substituted 2D-Conjugated Polymers Reach 9.5% Efficiency" Journal of the American Chemical Society, 138(13): 4657-4664 (2016).
Gao et al. "High-Efficiency Nonfullerene Polymer Solar Cells with Medium Bandgap Polymer Donor and Narrow Bandgap Organic Semiconductor Acceptor" Advanced Materials, 28(37): 8288-8295 (2016).
C.W. Tang. "Two-layer organic photovoltaic cell" Applied Physics Letters, 48(2): 183-185 (1986).
Yu et al. "Polymer Photovoltaic Cells: Enhanced Efficiencies via a Network of Internal Donor-Acceptor Heterojunctions" Science, 270(5243): 1789-1791 (1995).
International Search Report corresponding to PCT/KR2018/010609 (dated Dec. 18, 2018) (7 pages with English translation).

* cited by examiner

POLYMER AND ORGANIC SOLAR CELL INCLUDING SAME

CROSS REFERENCE TO RELATED APPLICATIONS

This application is a 35 U.S.C. § 371 national stage application of PCT International Application No. PCT/KR2018/010609, filed Sep. 11, 2018, which claims priority from Korean Patent Application No. 10-2017-0125116, filed Sep. 27, 2017, the contents of which are incorporated herein in their entireties by reference. The above-referenced PCT International Application was published in the Korean language as International Publication No. WO 2019/066305 on Apr. 4, 2019.

TECHNICAL FIELD

The present specification relates to a polymer and an organic solar cell including the same.

BACKGROUND ART

An organic solar cell is a device capable of directly converting solar energy to electric energy by applying a photovoltaic effect. Solar cells are divided into inorganic solar cells and organic solar cells depending on the materials forming a thin film, and since existing inorganic solar cells already have limits in economic feasibility and material supplies, organic solar cells that are readily processed, inexpensive and have various functions have been highly favored as a long-term alternative energy source.

For solar cells, it is important to increase efficiency so as to output as much electric energy as possible from solar energy, and fullerene-based compounds, an existing electron acceptor material, have problems such as having a low absorption rate in a visible region and having low thermal stability.

Accordingly, many examples of an organic solar cell using non-fullerene-based compounds as an electron acceptor material have been reported, and power conversion efficiency thereof has reached approximately 4% to 5.9%. However, non-fullerene-based compounds exhibit favorable efficiency only in combination with specific polymers at present, and therefore, finding novel polymers capable of exhibiting favorable efficiency with non-fullerene-based compounds have been an important challenge.

DISCLOSURE

Technical Problem

The present specification is directed to providing a polymer and an organic solar cell including the same.

Technical Solution

One embodiment of the present specification provides a polymer including a first unit represented by the following Chemical Formula 1; a second unit represented by the following Chemical Formula 2; and a third unit represented by the following Chemical Formula 3 or 4.

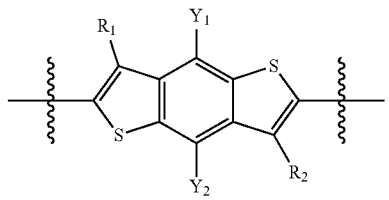

[Chemical Formula 1]

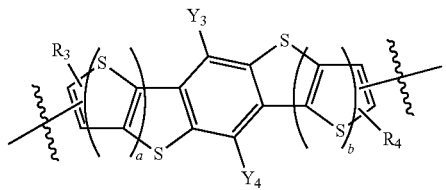

[Chemical Formula 2]

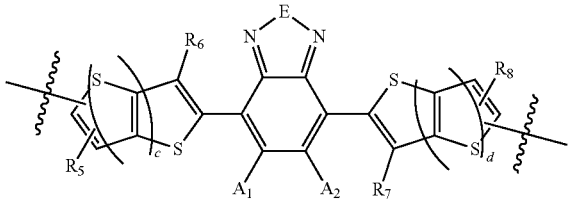

[Chemical Formula 3]

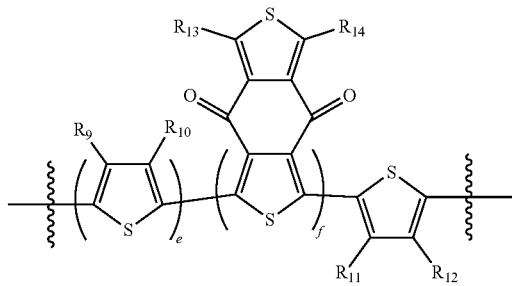

[Chemical Formula 4]

In Chemical Formulae 1 to 4, $R_1$ to $R_{14}$ are the same as or different from each other, and are each hydrogen; a substituted or unsubstituted alkyl group; a carboxyl group; or an ester group (—COOR'), E is S or NR", R' and R" are the same as or different from each other, and are each a substituted or unsubstituted alkyl group, $A_1$ and $A_2$ are the same as or different from each other, and are each hydrogen; a halogen group; a substituted or unsubstituted alkyl group; or a substituted or unsubstituted alkoxy group, a to f are each 0 or 1, and $Y_1$ to $Y_4$ are the same as or different from each other, and are each represented by the following Chemical Formula 5,

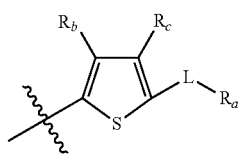

[Chemical Formula 5]

in Chemical Formula 5,

L is a direct bond, S or O, $R_a$ is a substituted or unsubstituted alkyl group, $R_b$ and $R_c$ are the same as or different from each other, and are each hydrogen; a halogen group; or a substituted or unsubstituted alkyl group, Chemical Formula 1 and Chemical Formula 2 have structures different from each other, and in Chemical Formulae 1 to 5,

is a site linked to other units or substituents.

Another embodiment of the present specification provides an organic solar cell including a first electrode; a second electrode disposed opposite to the first electrode; and one or more organic material layers disposed between the first electrode and the second electrode and including a photoactive layer, wherein the photoactive layer includes an electron donor and an electron acceptor, and the electron donor includes the polymer and the electron acceptor includes a non-fullerene-based compound.

Advantageous Effects

A polymer according to one embodiment of the present specification has a wide light absorption area and a high LUMO energy level, and as a result, an organic solar cell having a high level of photo-electric conversion efficiency can be manufactured when using the polymer in a photoactive layer.

In addition, by using the polymer as an electron donor and using a non-fullerene-based compound as an electron acceptor, the organic solar cell according to one embodiment of the present specification has excellent thermal stability and color properties.

REFERENCE NUMERAL

Figure 1:
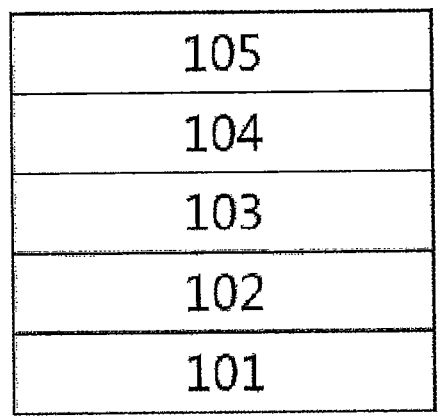
FIG. 1 is a diagram illustrating an organic solar cell according to one embodiment of the present specification.

101: First Electrode
102: Electron Transfer Layer
103: Photoactive Layer
104: Hole Transfer Layer
105: Second Electrode

MODE FOR DISCLOSURE

Hereinafter, the present specification will be described in more detail.

In the present specification, a 'unit' means a structure in which a compound is included in a divalent or higher group form in a polymer by a polymerization reaction.

In the present specification, the meaning of 'including a unit' means being included in a main chain in a polymer.

In the present specification, a description of a certain part 'including' certain constituents means capable of further including other constituents, and does not exclude other constituents unless particularly stated on the contrary.

In the present specification, a description of one member being placed 'on' another member includes not only a case of the one member adjoining the another member but a case of still another member being present between the two members.

In the present specification, an energy level means magnitude of energy. Accordingly, even when an energy level is expressed in a negative (−) direction from a vacuum level, the energy level is interpreted to mean an absolute value of the corresponding energy value. For example, a HOMO energy level means a distance from a vacuum level to a highest occupied molecular orbital. In addition, a LUMO energy level means a distance from a vacuum level to a lowest unoccupied molecular orbital.

In the present specification, the term 'substitution' means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, the term 'substituted or unsubstituted' means being substituted with one or more substituents selected from the group consisting of deuterium; a halogen group; a hydroxyl group; an alkyl group; a cycloalkyl group; an alkoxy group; an alyloxy group; an alkenyl group; an aryl group; and a heterocyclic group, or being substituted with a substituent linking two or more substituents among the substituents illustrated above, or having no substituents.

In the present specification, examples of the halogen group include fluorine, chlorine, bromine or iodine. In the present specification, the alkyl group may be linear or branched, and although not particularly limited thereto, the number of carbon atoms is preferably from 1 to 50. Specific examples thereof may include methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylhexyl, 4-methylhexyl, 5-methylhexyl and the like, but are not limited thereto.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

In the present specification, when the aryl group is a monocyclic aryl group, the number of carbon atoms is not particularly limited, but is preferably from 6 to 25. Specific examples of the monocyclic aryl group may include a phenyl group, a biphenyl group, a terphenyl group and the like, but are not limited thereto.

In the present specification, when the aryl group is a polycyclic aryl group, the number of carbon atoms is not particularly limited, but is preferably from 10 to 24. Specific examples of the polycyclic aryl group may include a naphthyl group, an anthracenyl group, a phenanthryl group, a pyrenyl group, a perylenyl group, a chrysenyl group, a fluorenyl group and the like, but are not limited thereto. The fluorenyl group may be substituted, and adjacent substituents may bond to each other to form a ring.

In the present specification, the arylene group means the aryl group having two bonding sites, that is, a divalent group. Descriptions on the aryl group provided above may be applied thereto except for these each being divalent.

In the present specification, the heterocyclic group is a group including one or more atoms that are not carbon, that is, heteroatoms, and specifically, the heteroatom may include one or more atoms selected from the group consisting of O, N, Se, S and the like. The number of carbon atoms of the heterocyclic group is not particularly limited, but is preferably from 2 to 60 Examples of the heterocyclic group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a phenothiazinyl group, a dibenzofuranyl group and the like, but are not limited thereto.

In the present specification,

means a site linked to other units or substituents.

One embodiment of the present specification provides a polymer including a first unit represented by Chemical Formula 1; a second unit represented by Chemical Formula 2; and a third unit represented by Chemical Formula 3 or 4.

In one embodiment of the present specification, $R_1$ to $R_4$ are each hydrogen.

In one embodiment of the present specification, $R_5$ to $R_{14}$ are the same as or different from each other, and are hydrogen; or an alkyl group having 1 to 20 carbon atoms.

In one embodiment of the present specification, E is S.

In one embodiment of the present specification, E is NR".

In one embodiment of the present specification, R' and R" are the same as or different from each other, and are each an alkyl group having 1 to 20 carbon atoms.

In one embodiment of the present specification, $A_1$ and $A_2$ are each hydrogen; a halogen group; or an alkoxy group having 1 to 20 carbon atoms.

In one embodiment of the present specification, $A_1$ and $A_2$ are the same as or different from each other, and are each hydrogen or fluorine.

In one embodiment of the present specification, $A_1$ and $A_2$ are the same as or different from each other, and are each fluorine or octyloxy.

In one embodiment of the present specification, $A_1$ and $A_2$ are each octyloxy.

In one embodiment of the present specification, a and b are each 0.

In one embodiment of the present specification, a and b are each 1.

In one embodiment of the present specification, c and d are each 0.

In one embodiment of the present specification, c and d are each 1.

In one embodiment of the present specification, e and f are each 0.

In one embodiment of the present specification, e and f are each 1.

In one embodiment of the present specification, $Y_1$ to $Y_4$ are the same as or different from each other, and are each represented by Chemical Formula 5.

In one embodiment of the present specification, $Y_1$ and $Y_2$ are the same as each other, $Y_3$ and $Y_4$ are the same as each other, and $Y_1$ and $Y_3$ are different from each other.

In one embodiment of the present specification, L is a direct bond or S.

In one embodiment of the present specification, $R_a$ is an alkyl group having 1 to 20 carbon atoms.

In one embodiment of the present specification, $R_a$ is an alkyl group having 1 to 10 carbon atoms.

In one embodiment of the present specification, $R_a$ is a 2-ethylhexyl group.

In one embodiment of the present specification, $R_a$ is an octyl group.

In one embodiment of the present specification, $R_b$ and $R_c$ are the same as or different from each other, and are each hydrogen or a halogen group.

In one embodiment of the present specification, $R_b$ and $R_c$ are the same as or different from each other, and are each hydrogen or fluorine.

In one embodiment of the present specification, $R_b$ and $R_c$ are each hydrogen.

In one embodiment of the present specification, Chemical Formula 2 is represented by the following Chemical Formula 2-1 or 2-2.

[Chemical Formula 2-1]

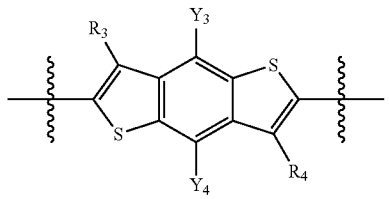

[Chemical Formula 2-2]

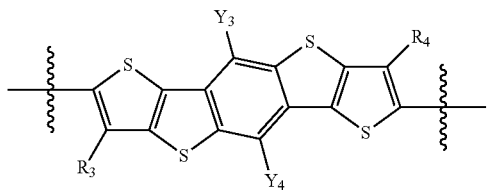

In Chemical Formulae 2-1 and 2-2, $Y_3$, $Y_4$, $R_3$ and $R_4$ have the same definitions as in Chemical Formula 2.

In one embodiment of the present specification, $R_3$ and $R_4$ are hydrogen.

In one embodiment of the present specification, Chemical Formula 3 is represented by any one of the following Chemical Formulae 3-1 to 3-3.

[Chemical Formula 3-1]

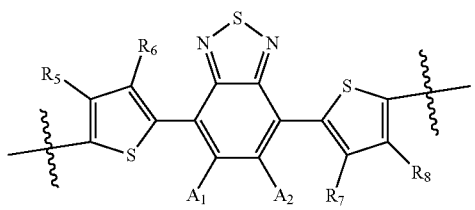

[Chemical Formula 3-2]

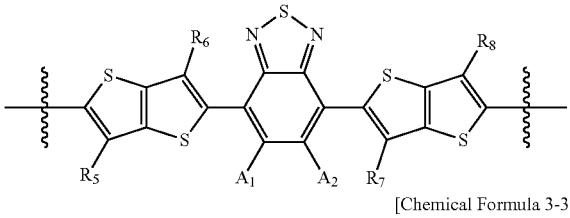

[Chemical Formula 3-3]

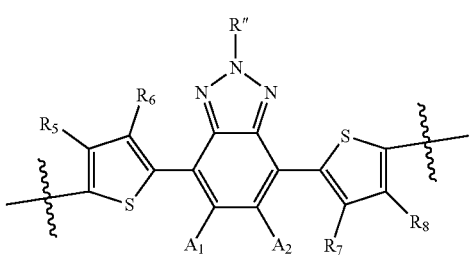

In Chemical Formulae 3-1 to 3-3, $R_5$ to $R_8$, R", $A_1$ and $A_2$ have the same definitions as in Chemical Formula 3.

In one embodiment of the present specification, $R_5$ to $R_8$ are the same as or different from each other, and are each hydrogen, or an alkyl group having 1 to 20 carbon atoms.

In one embodiment of the present specification, $R_5$ to $R_8$ are the same as or different from each other, and are each hydrogen, or an alkyl group having 1 to 10 carbon atoms.

In one embodiment of the present specification, $R_5$ to $R_8$ are the same as or different from each other, and are each hydrogen or an n-octyl group.

In one embodiment of the present specification, $R_5$ to $R_8$ are each hydrogen.

In one embodiment of the present specification, $R_5$ and $R_8$ are each an n-octyl group, and $R_6$ and $R_7$ are each hydrogen.

In one embodiment of the present specification, R" is an alkyl group having 1 to 15 carbon atoms.

In one embodiment of the present specification, Chemical Formula 4 is represented by the following Chemical Formula 4-1 or 4-2.

[Chemical Formula 4-1]

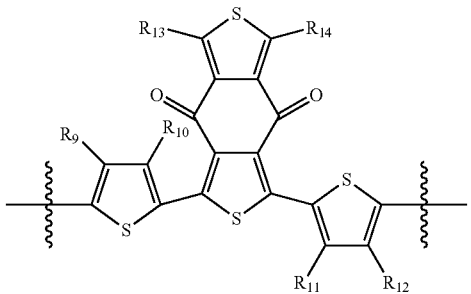

[Chemical Formula 4-2]

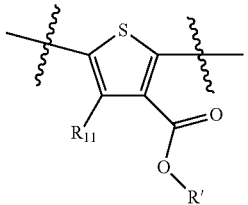

In Chemical Formulae 4-1 and 4-2, $R_9$ to $R_{14}$ and R' have the same definitions as in Chemical Formula 4.

In one embodiment of the present specification, $R_9$ to $R_{14}$ are the same as or different from each other, and are each hydrogen, or an alkyl group having 1 to 20 carbon atoms.

In one embodiment of the present specification, $R_9$ to $R_{14}$ are the same as or different from each other, and are each hydrogen, or an alkyl group having 5 to 15 carbon atoms.

In one embodiment of the present specification, $R_9$ to $R_{14}$ are the same as or different from each other, and are each hydrogen, or an alkyl group having 7 to 10 carbon atoms.

In one embodiment of the present specification, $R_9$ to $R_{14}$ are the same as or different from each other, and are each hydrogen or an ethylhexyl group.

In one embodiment of the present specification, $R_9$ to $R_{14}$ are the same as or different from each other, and are each hydrogen or a 2-ethylhexyl group.

In one embodiment of the present specification, $R_{12}$ is a carboxyl group.

In one embodiment of the present specification, $R_{12}$ is an ester (—COOR') group.

In one embodiment of the present specification, R' is an alkyl group having 1 to 15 carbon atoms.

In one embodiment of the present specification, Chemical Formula 5 is any one of the following Chemical Formulae 5-1 to 5-3.

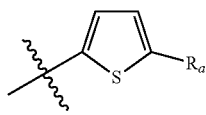

[Chemical Formula 5-1]

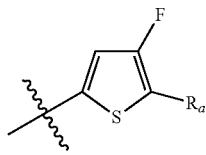

[Chemical Formula 5-2]

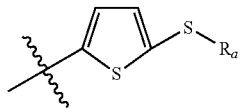

[Chemical Formula 5-3]

In Chemical Formulae 5-1 to 5-3, $R_a$ has the same definition as in Chemical Formula 5. In one embodiment of the present specification, Chemical Formula 5-1 is represented by any one of the following two chemical formulae.

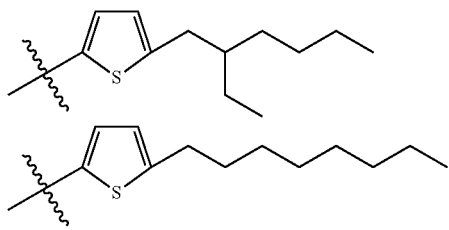

In one embodiment of the present specification, Chemical Formula 5-2 is represented by any one of the following two chemical formulae.

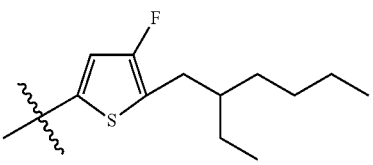

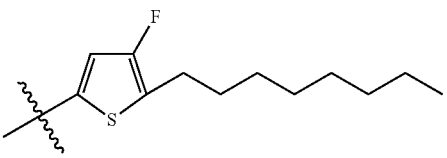

In one embodiment of the present specification, Chemical Formula 5-3 is represented by any one of the following two chemical formulae.

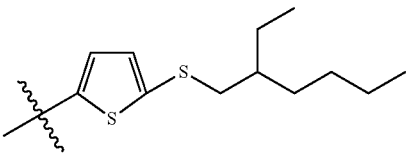

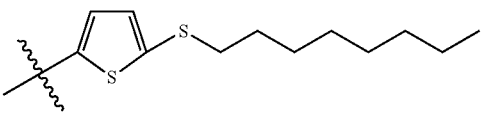

In one embodiment of the present specification, $Y_1$ to $Y_4$ are each represented by Chemical Formula 5-1, and $Y_1$ and $Y_3$ are different from each other.

In one embodiment of the present specification, $Y_1$ to $Y_4$ are each represented by Chemical Formula 5-2, and $Y_1$ and $Y_3$ are different from each other.

In one embodiment of the present specification, $Y_1$ to $Y_4$ are each represented by Chemical Formula 5-3, and $Y_1$ and $Y_3$ are different from each other.

In one embodiment of the present specification, $Y_1$ and $Y_2$ are each represented by Chemical Formula 5-1, and $Y_3$ and $Y_4$ are each represented by Chemical Formula 5-2.

In one embodiment of the present specification, $Y_1$ and $Y_2$ are each represented by Chemical Formula 5-1, and $Y_3$ and $Y_4$ are each represented by Chemical Formula 5-3.

In one embodiment of the present specification, $Y_1$ and $Y_2$ are each represented by Chemical Formula 5-2, and $Y_3$ and $Y_4$ are each represented by Chemical Formula 5-1.

In one embodiment of the present specification, $Y_1$ and $Y_2$ are each represented by Chemical Formula 5-2, and $Y_3$ and $Y_4$ are each represented by Chemical Formula 5-3.

In one embodiment of the present specification, $Y_1$ and $Y_2$ are each represented by Chemical Formula 5-3, and $Y_3$ and $Y_4$ are each represented by Chemical Formula 5-1.

In one embodiment of the present specification, $Y_1$ and $Y_2$ are each represented by Chemical Formula 5-3, and $Y_3$ and $Y_4$ are each represented by Chemical Formula 5-2.

In one embodiment of the present specification, the polymer includes a unit represented by the following Chemical Formula 6 or 7.

[Chemical Formula 6]

In Chemical Formulae 6 and 7, $Y_1$ to $Y_4$ and $R_1$ to $R_4$ have the same definitions as in Chemical Formulae 1 and 2, Qs are the same as or different from each other, and are each a unit represented by Chemical Formula 3 or 4, l and m represent a mole fraction, $0<l<1$, $0<m<1$, $0<l+m<1$, and k is, as a unit repetition number, an integer of 1 to 10,000.

In one embodiment of the present specification, the polymer includes the unit represented by Chemical Formula 6.

In one embodiment of the present specification, the polymer includes the unit represented by Chemical Formula 6, and Qs are each represented by Chemical Formula 3.

In one embodiment of the present specification, the polymer includes the unit represented by Chemical Formula 6, and Qs are each represented by Chemical Formula 4.

In one embodiment of the present specification, the polymer includes the unit represented by Chemical Formula 7.

In one embodiment of the present specification, the polymer includes the unit represented by Chemical Formula 7, and Qs are each represented by Chemical Formula 3.

In one embodiment of the present specification, the polymer includes the unit represented by Chemical Formula 7, and Qs are each represented by Chemical Formula 4.

In one embodiment of the present specification, Qs are each any one selected from among the following units.

In one embodiment of the present specification, l is 0.5.

In one embodiment of the present specification, m is 0.5.

In one embodiment of the present specification, k is an integer of 1 to 10,000, and preferably an integer of 500 to 5,000.

In one embodiment of the present specification, Chemical Formula 6 is represented by any one of the following Chemical Formulae 6-1 to 6-6.

[Chemical Formula 6-1]

[Chemical Formula 6-2]

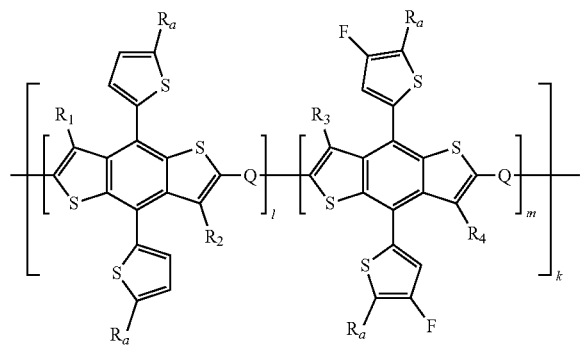

[Chemical Formula 6-3]

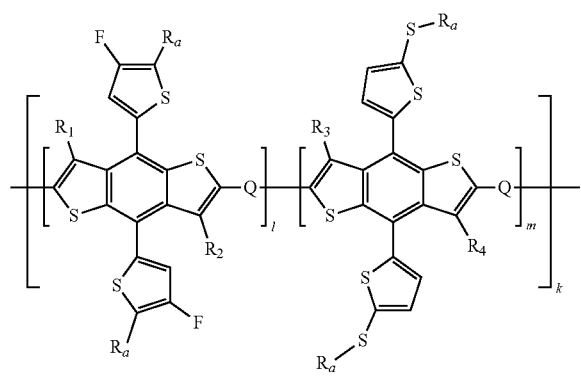

[Chemical Formula 6-4]

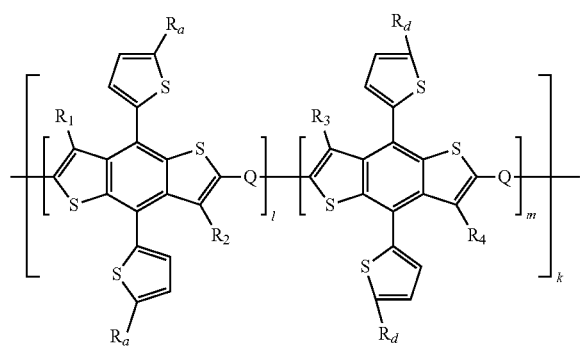

[Chemical Formula 6-5]

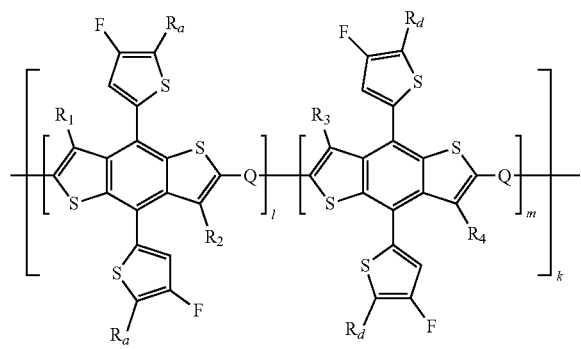

[Chemical Formula 6-6]

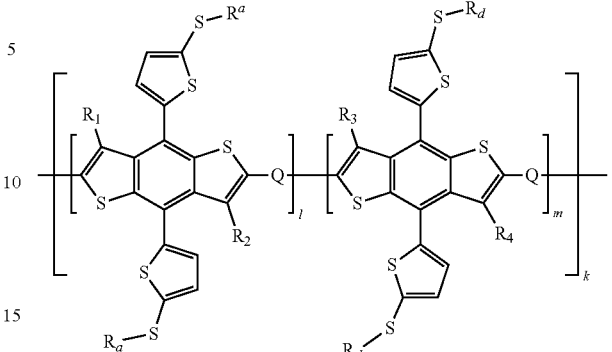

In Chemical Formulae 6-1 to 6-6, $R_1$ to $R_4$, $R_a$, l, m, k and Q have the same definitions as in Chemical Formulae 5 and 6, and $R_d$ is a substituted or unsubstituted alkyl group, and is different from $R_a$.

In one embodiment of the present specification, $R_d$ is a substituted or unsubstituted alkyl group having 1 to 20 carbon atoms.

In one embodiment of the present specification, $R_d$ is a substituted or unsubstituted alkyl group having 3 to 15 carbon atoms.

In one embodiment of the present specification, $R_d$ is a substituted or unsubstituted alkyl group having 5 to 10 carbon atoms.

In one embodiment of the present specification, $R_a$ is a linear alkyl group having 1 to 20 carbon atoms, and $R_d$ is a branched alkyl group having 1 to 20 carbon atoms.

In one embodiment of the present specification, $R_a$ is a linear alkyl group having 5 to 10 carbon atoms, and $R_d$ is a branched alkyl group having 5 to 10 carbon atoms.

In one embodiment of the present specification, $R_d$ is a 2-ethylhexyl group, and $R_d$ is an octyl group.

In one embodiment of the present specification, $R_d$ is a linear alkyl group having 1 to 20 carbon atoms, and $R_a$ is a branched alkyl group having 1 to 20 carbon atoms.

In one embodiment of the present specification, $R_d$ is a linear alkyl group having 5 to 10 carbon atoms, and $R_a$ is a branched alkyl group having 5 to 10 carbon atoms.

In one embodiment of the present specification, $R_d$ is a 2-ethylhexyl group, and $R_a$ is an octyl group.

In one embodiment of the present specification, Chemical Formula 6 is represented by Chemical Formula 6-1.

In one embodiment of the present specification, Chemical Formula 6 is represented by Chemical Formula 6-2.

In one embodiment of the present specification, Chemical Formula 6 is represented by Chemical Formula 6-3.

In one embodiment of the present specification, Chemical Formula 6 is represented by Chemical Formula 6-4.

In one embodiment of the present specification, Chemical Formula 6 is represented by Chemical Formula 6-5.

In one embodiment of the present specification, Chemical Formula 6 is represented by Chemical Formula 6-6.

In one embodiment of the present specification, Chemical Formula 7 is represented by any one of the following Chemical Formulae 7-1 to 7-10.

[Chemical Formula 7-1]
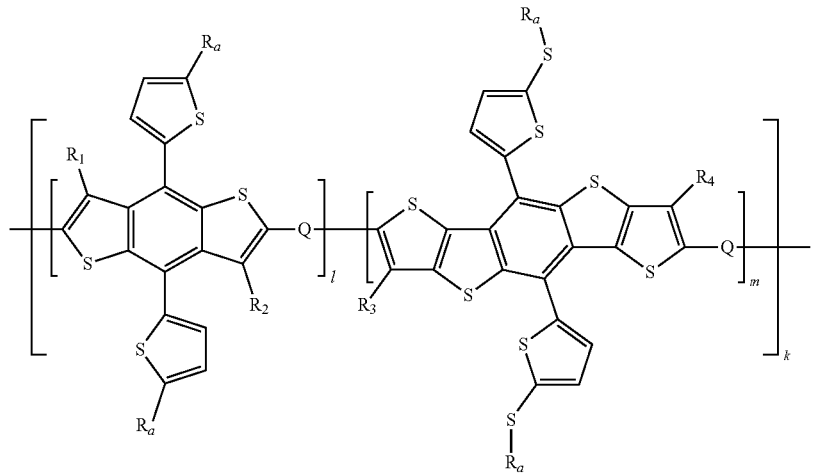
[Chemical Formula 7-2]
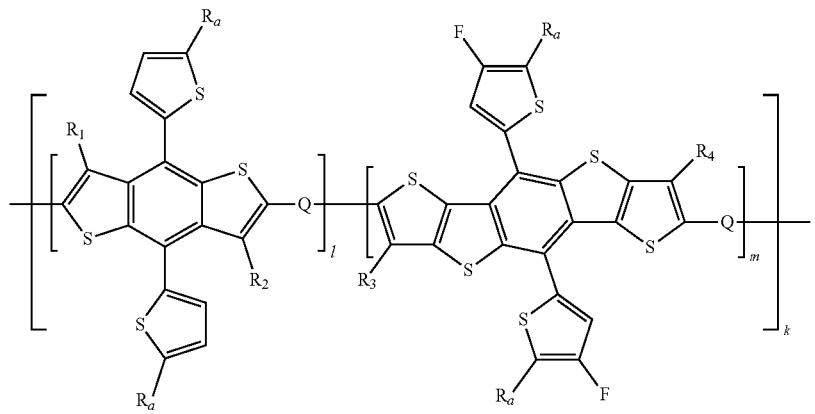
[Chemical Formula 7-3]
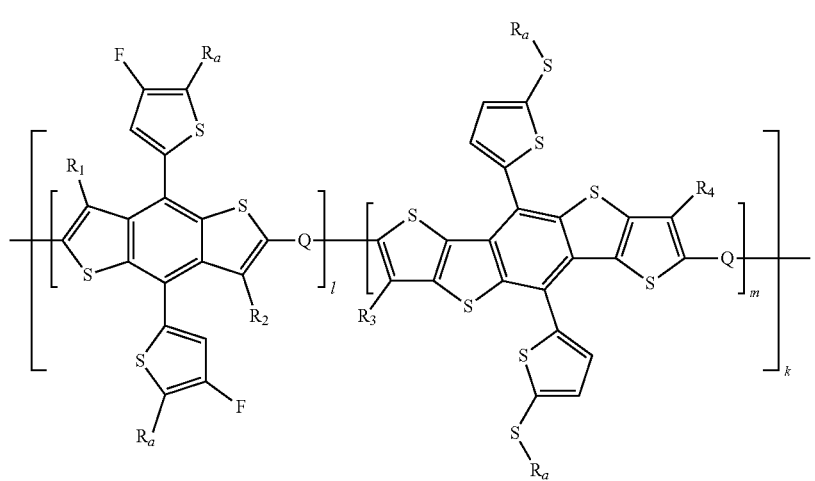

[Chemical Formula 7-4]
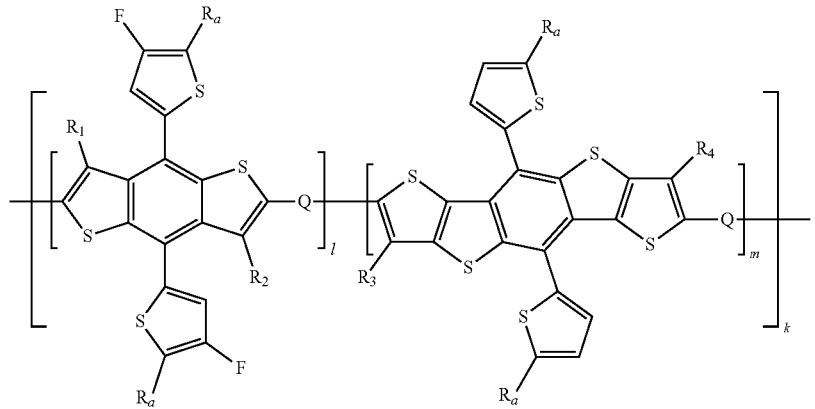
[Chemical Formula 7-5]
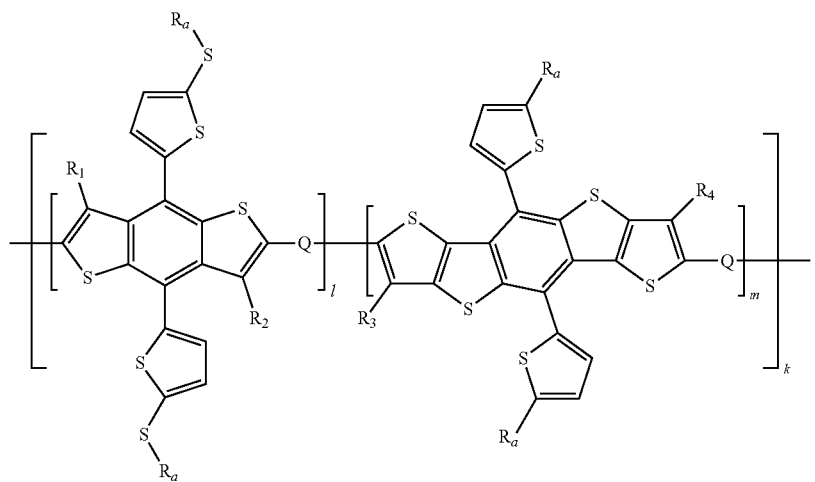
[Chemical Formula 7-6]
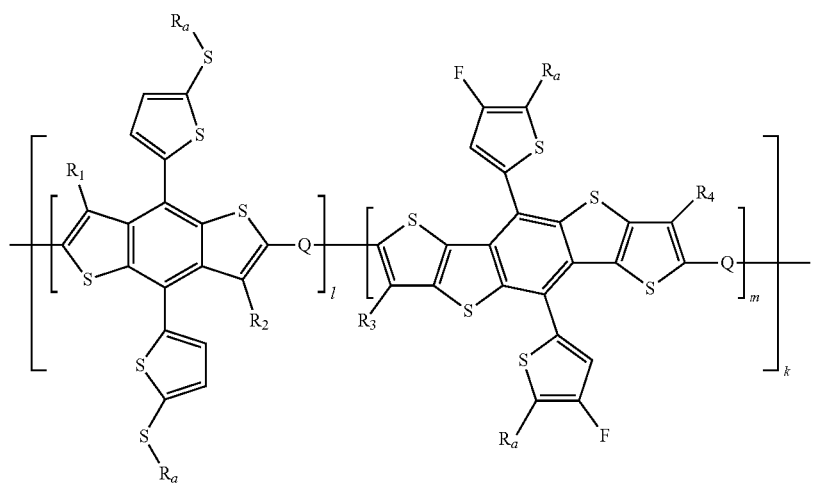

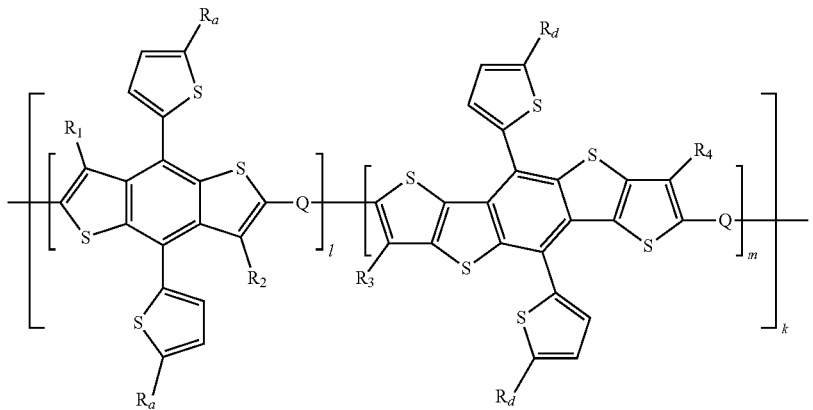
[Chemical Formula 7-7]
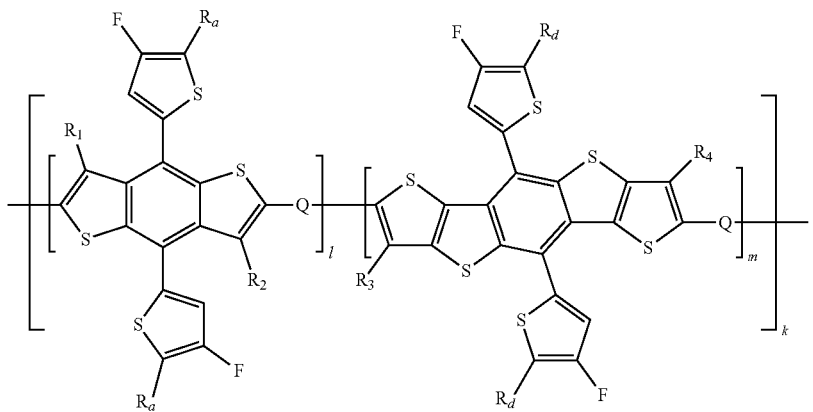
[Chemical Formula 7-8]
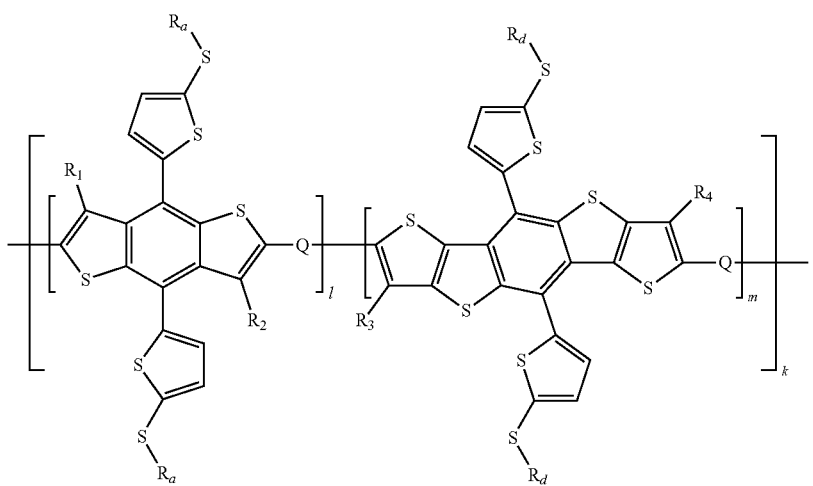
[Chemical Formula 7-9]

-continued

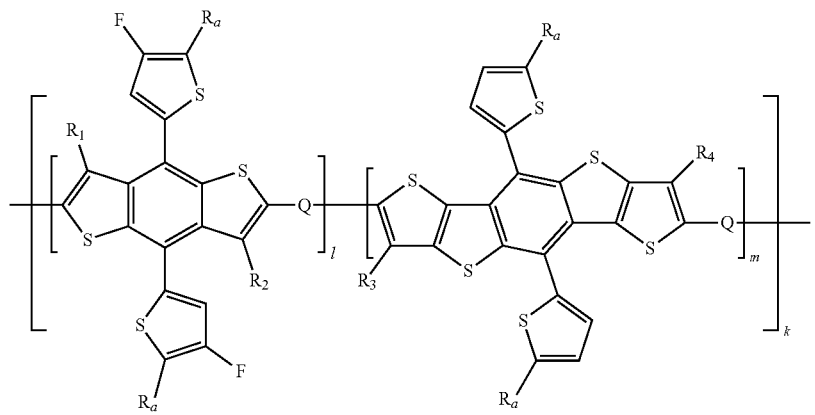

[Chemical Formula 7-10]

In Chemical Formulae 7-1 to 7-10, $R_1$ to $R_4$, $R_a$, l, m, k and Q have the same definitions as in Chemical Formulae 5 and 7, and $R_d$ is a substituted or unsubstituted alkyl group, and is different from $R_a$.

In one embodiment of the present specification, Chemical Formula 7 is represented by Chemical Formula 7-1.

In one embodiment of the present specification, Chemical Formula 7 is represented by Chemical Formula 7-2.

In one embodiment of the present specification, Chemical Formula 7 is represented by Chemical Formula 7-3.

In one embodiment of the present specification, Chemical Formula 7 is represented by Chemical Formula 7-4.

In one embodiment of the present specification, Chemical Formula 7 is represented by Chemical Formula 7-5.

In one embodiment of the present specification, Chemical Formula 7 is represented by Chemical Formula 7-6.

In one embodiment of the present specification, Chemical Formula 7 is represented by Chemical Formula 7-7.

In one embodiment of the present specification, Chemical Formula 7 is represented by Chemical Formula 7-8.

In one embodiment of the present specification, Chemical Formula 7 is represented by Chemical Formula 7-9.

In one embodiment of the present specification, Chemical Formula 7 is represented by Chemical Formula 7-10.

In one embodiment of the present specification, the polymer includes a unit represented by any one of the following Chemical Formulae 8 to 19.

[Chemical Formula 8]

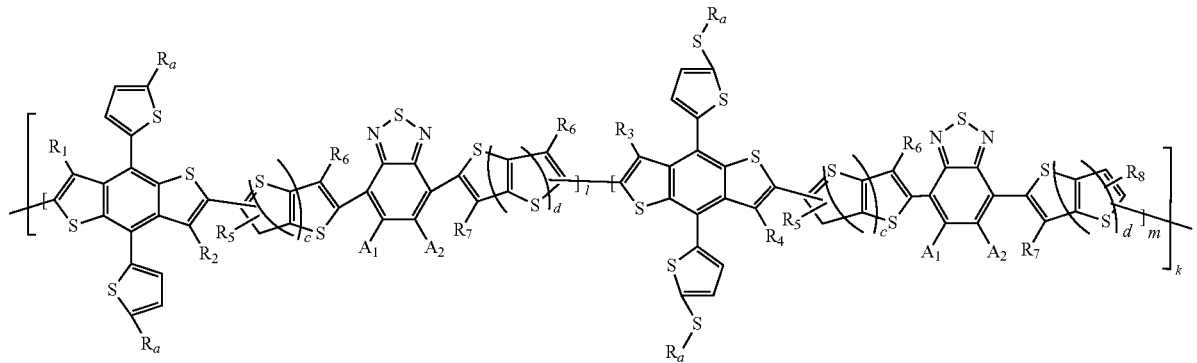

[Chemical Formula 9]

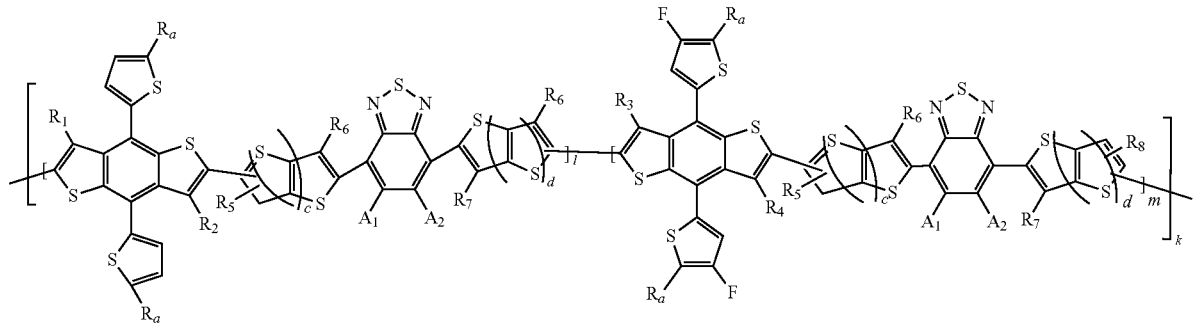

[Chemical Formula 10]
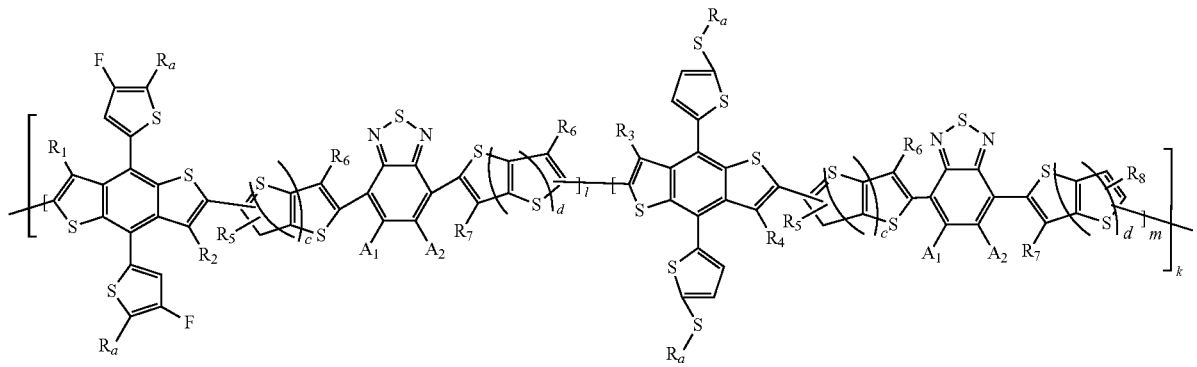
[Chemical Formula 11]
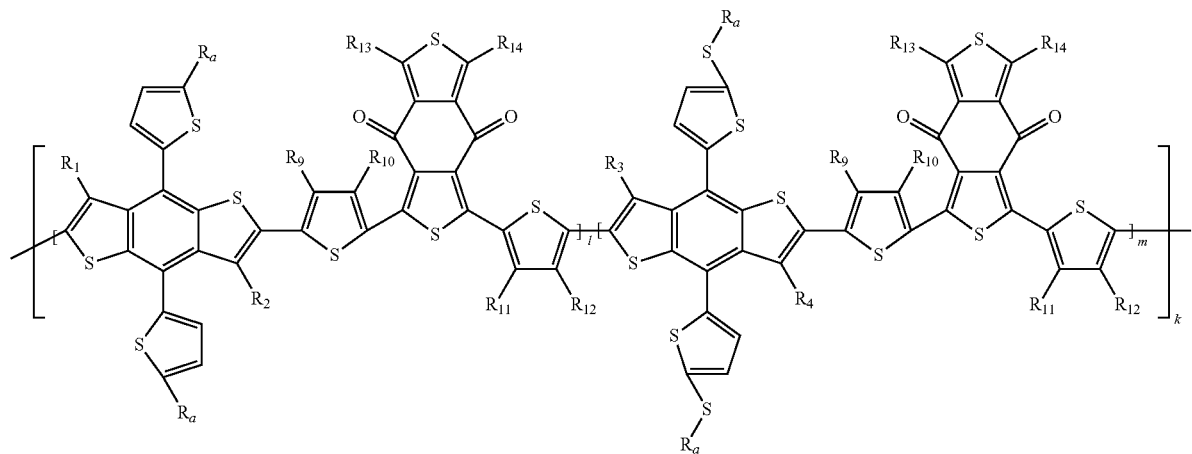
[Chemical Formula 12]
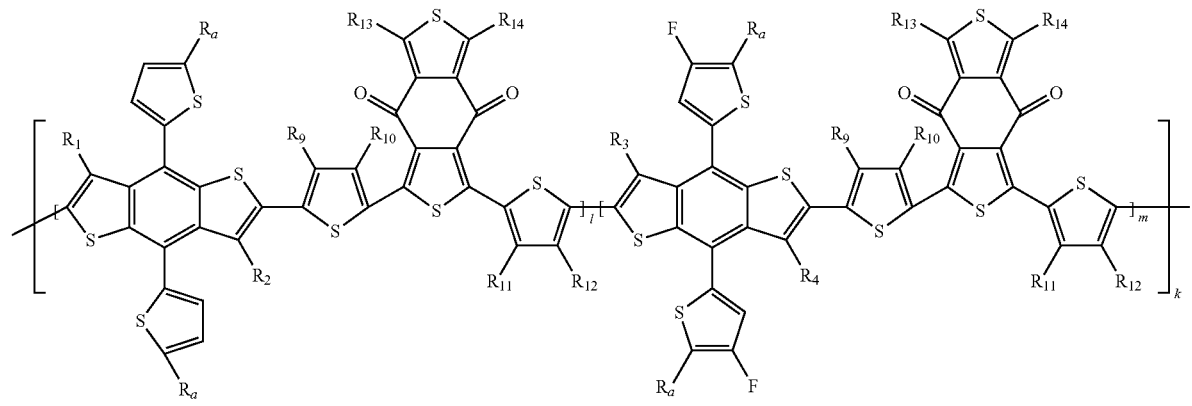

[Chemical Formula 13]
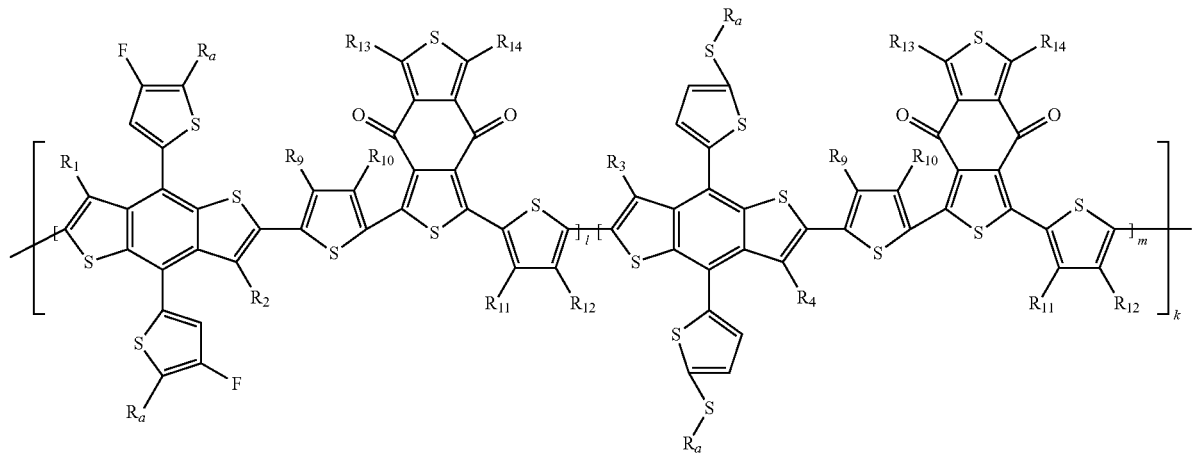
[Chemical Formula 14]
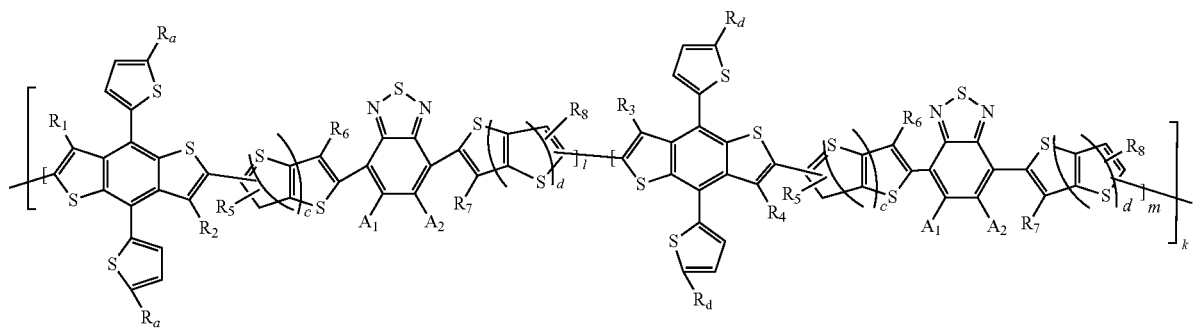
[Chemical Formula 15]
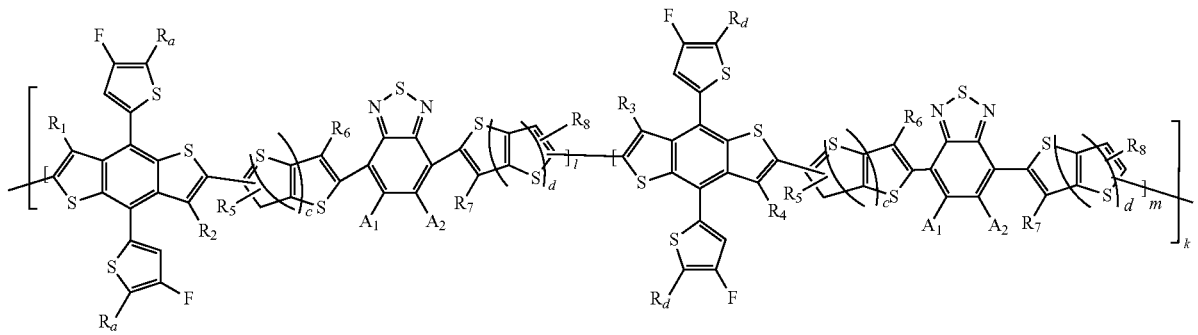
[Chemical Formula 16]
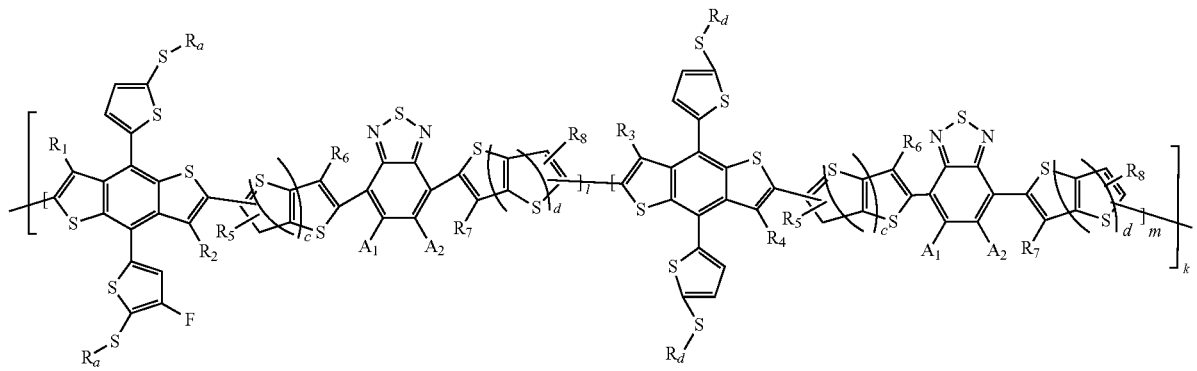

[Chemical Formula 17]

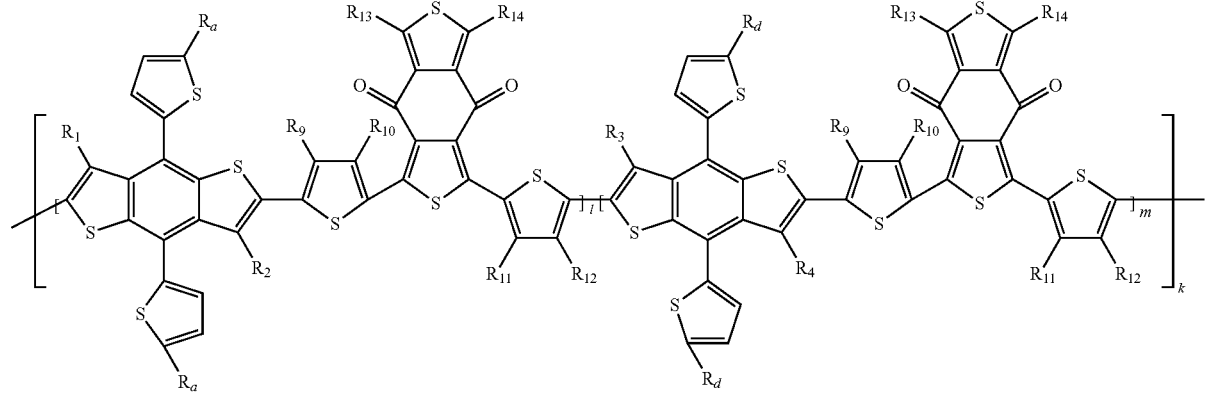

[Chemical Formula 18]

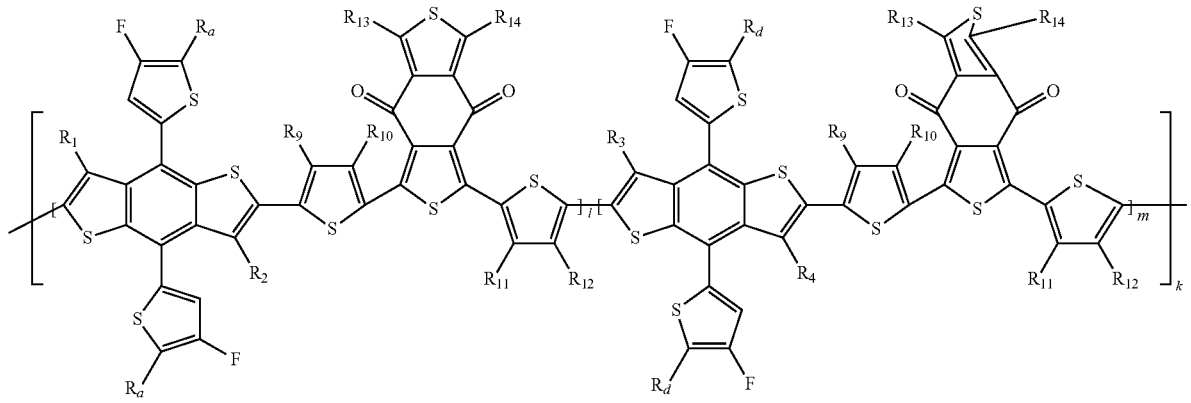

[Chemical Formula 19]

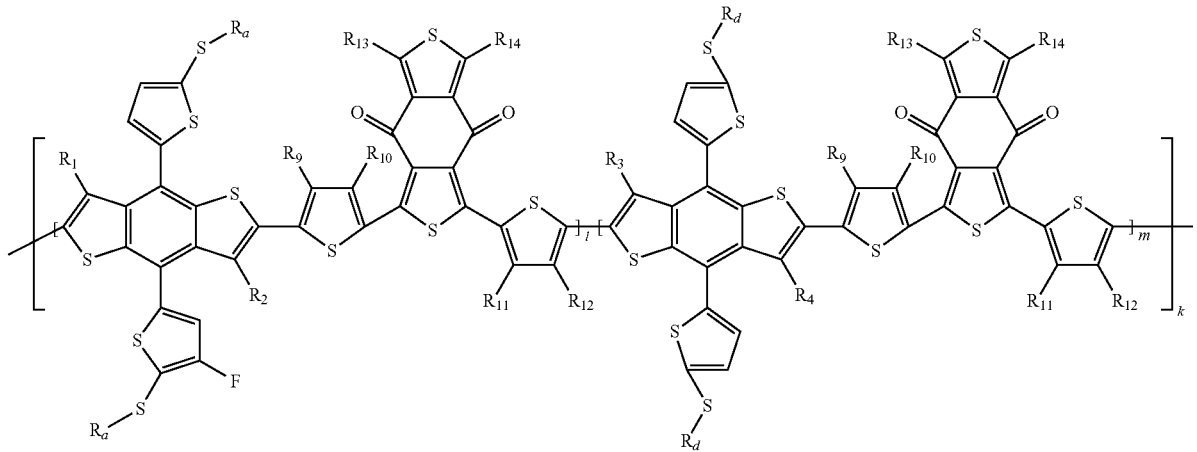

In Chemical Formulae 8 to 19, $R_1$ to $R_{14}$, $R_a$, $A_1$, $A_2$, c, d, l, m and k have the same definitions as in Chemical Formulae 1 to 6, and $R_d$ is a substituted or unsubstituted alkyl group, and is different from $R_a$.

In one embodiment of the present specification, the polymer includes a unit represented by any one of the following Chemical Formulae 20 to 37.

[Chemical Formula 20]
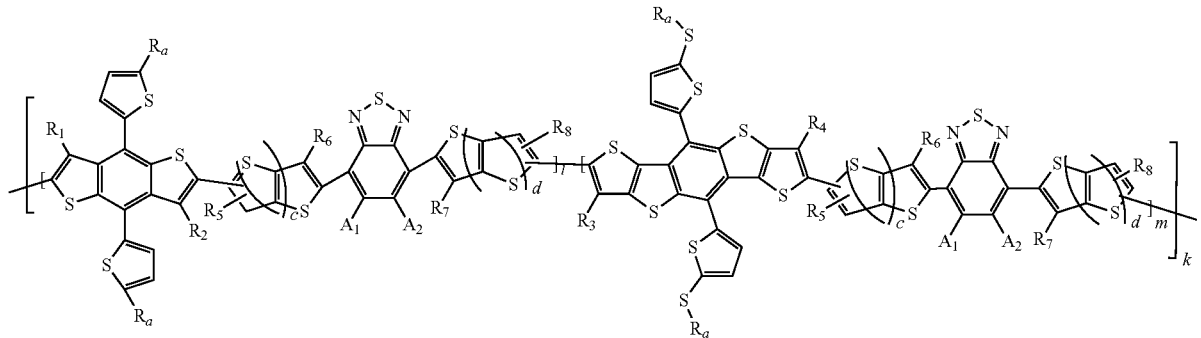
[Chemical Formula 21]
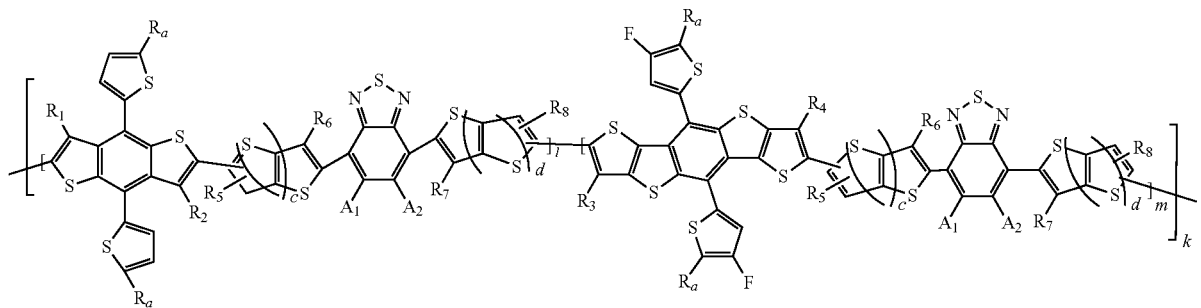
[Chemical Formula 22]
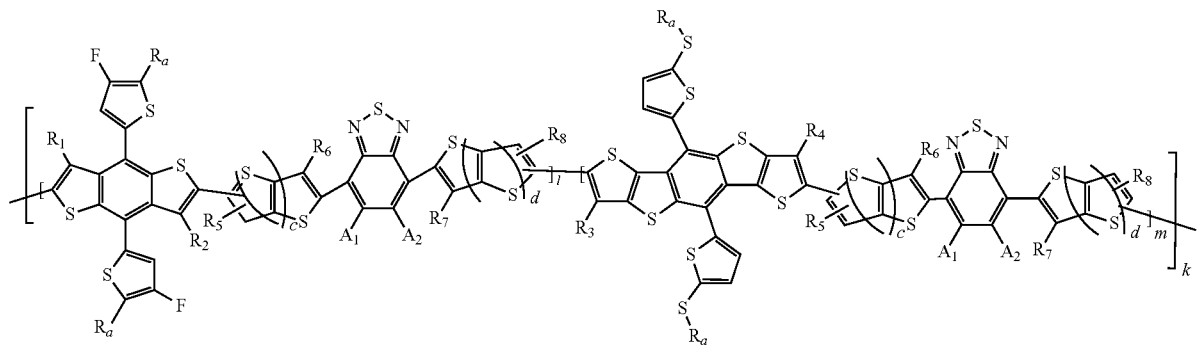
[Chemical Formula 23]
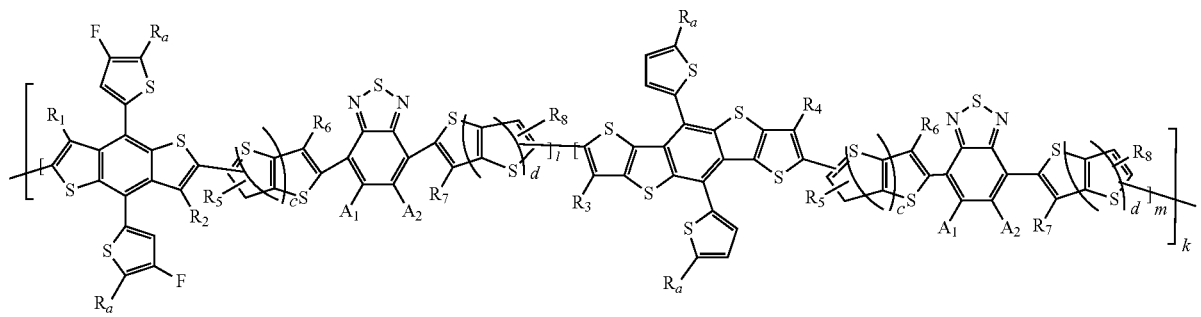

-continued
[Chemical Formula 24]
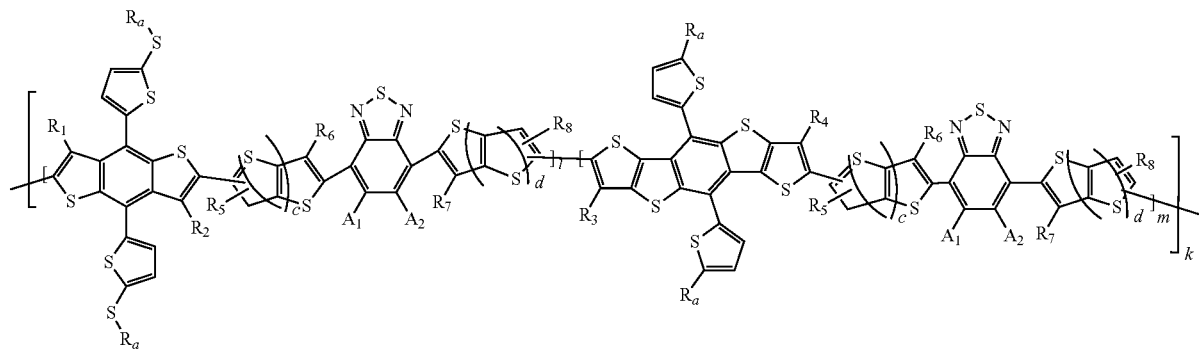
[Chemical Formula 25]
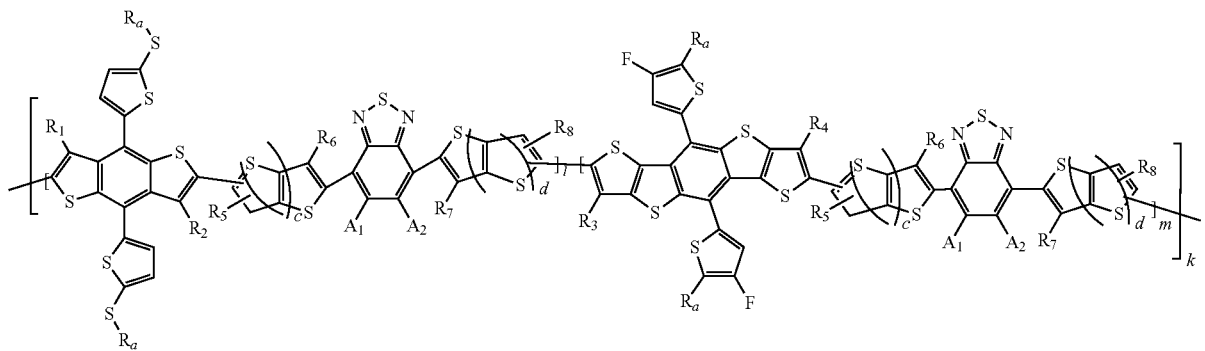
[Chemical Formula 26]
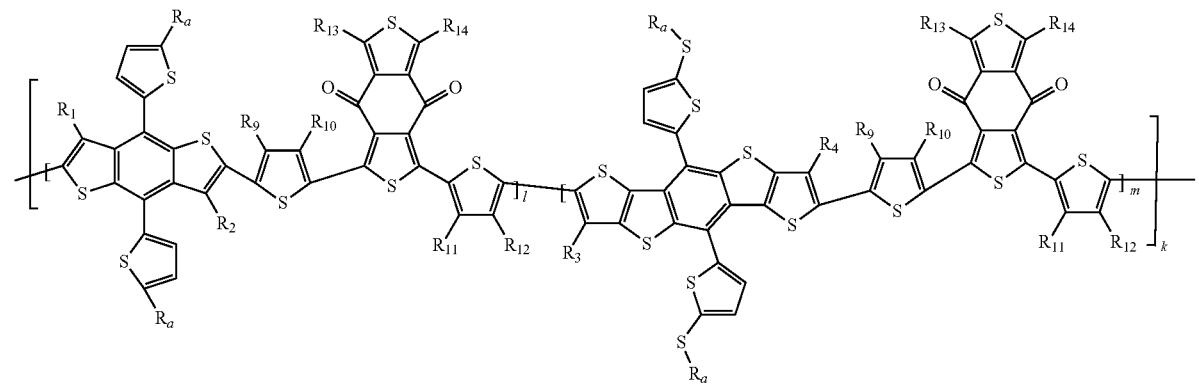
[Chemical Formula 27]
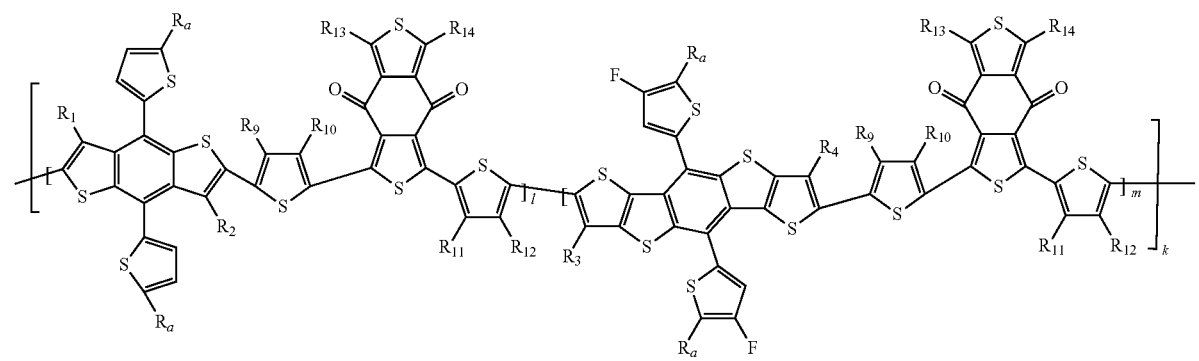

[Chemical Formula 28]
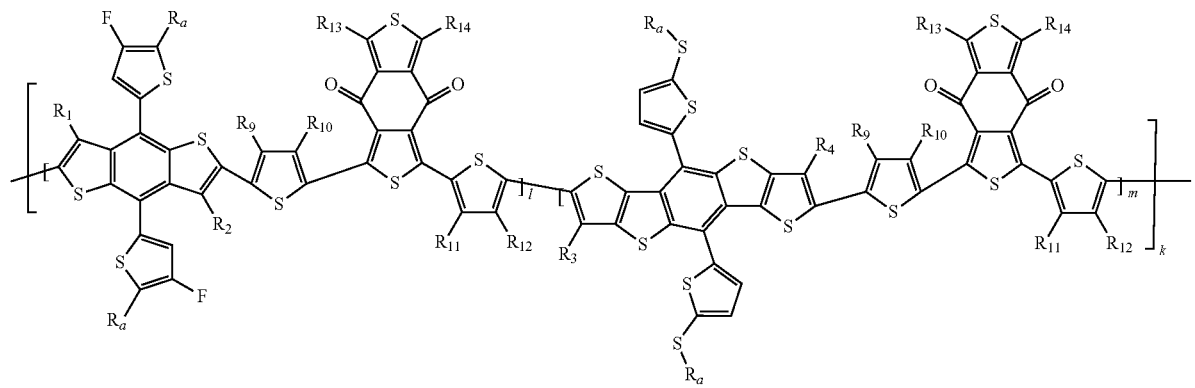
[Chemical Formula 29]
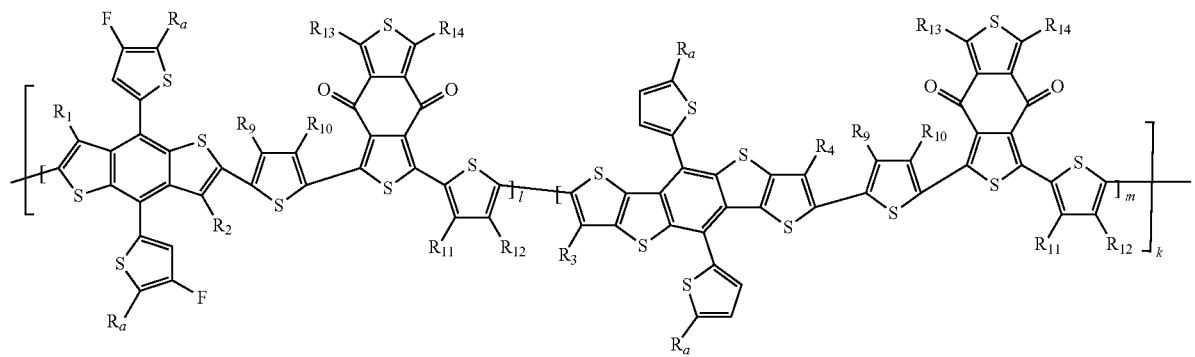
[Chemical Formula 30]
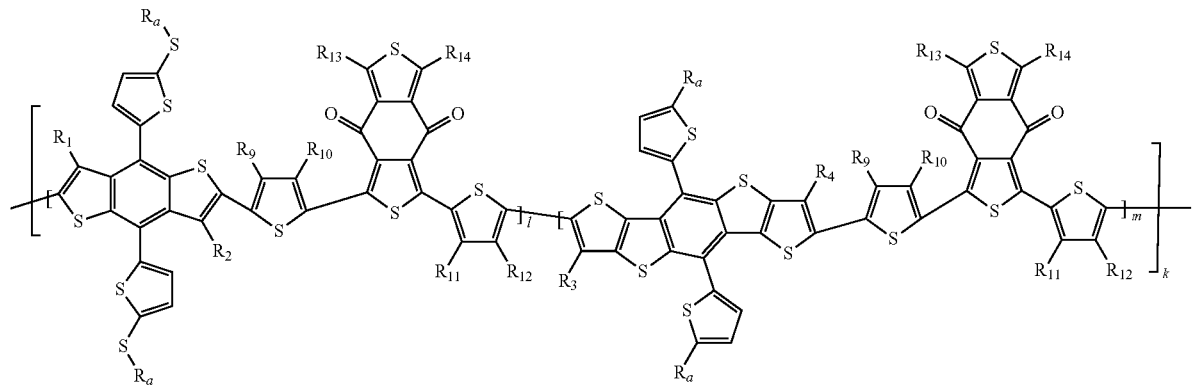
[Chemical Formula 31]
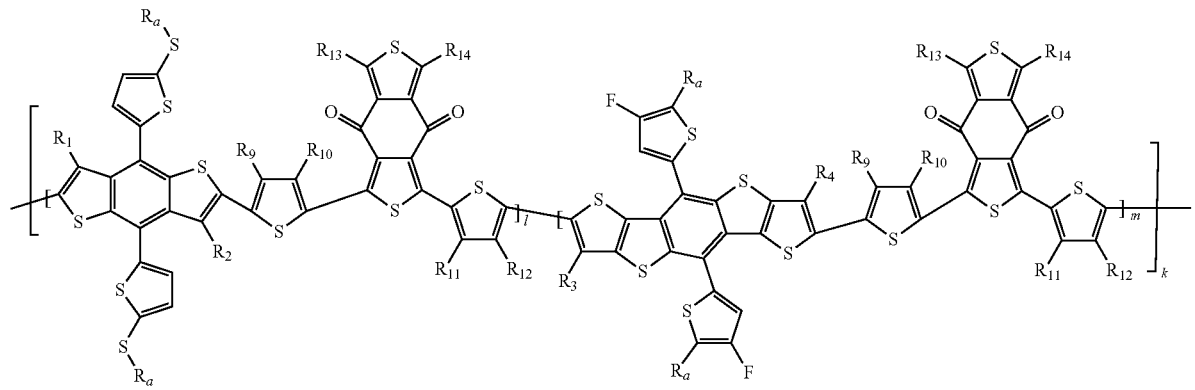

[Chemical Formula 32]
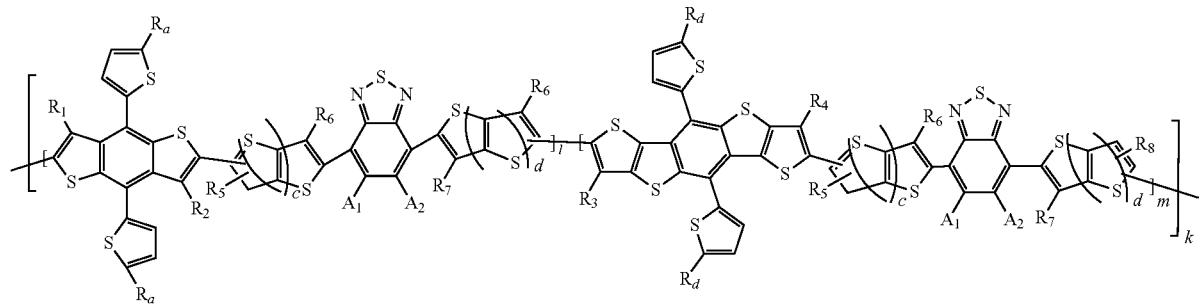
[Chemical Formula 33]
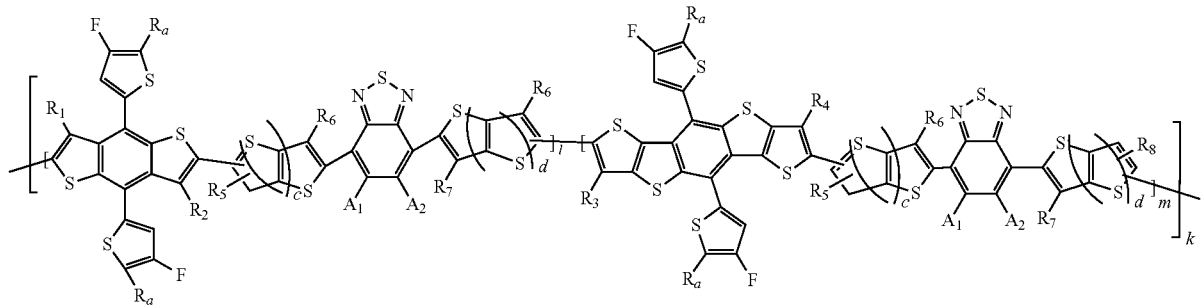
[Chemical Formula 34]
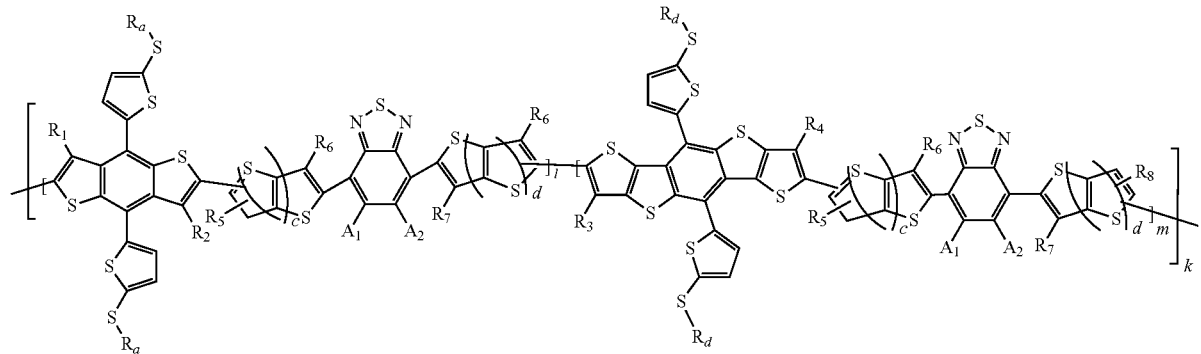
[Chemical Formula 35]
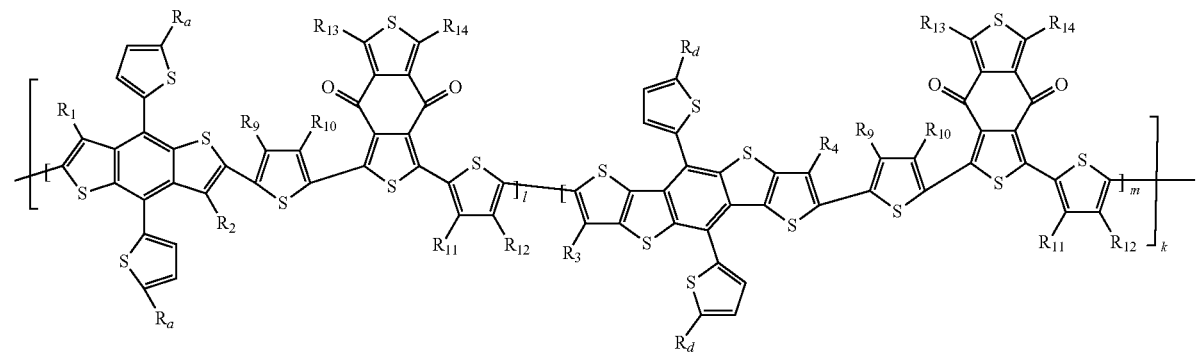

[Chemical Formula 36]

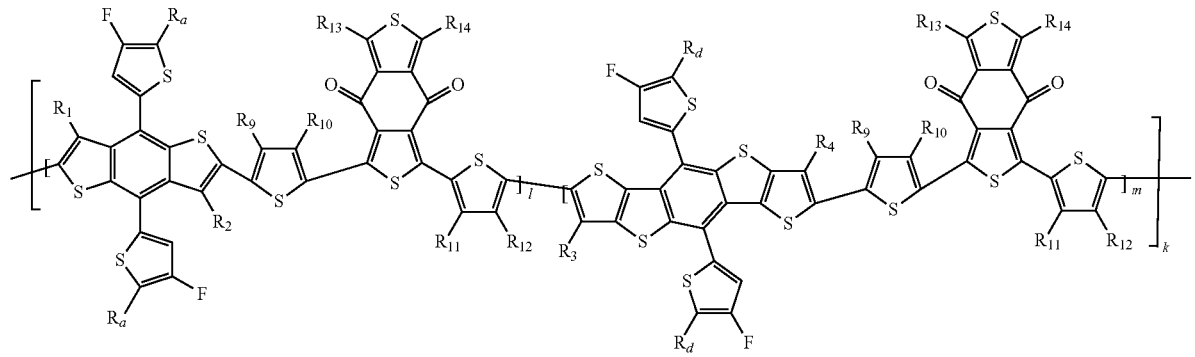

[Chemical Formula 37]

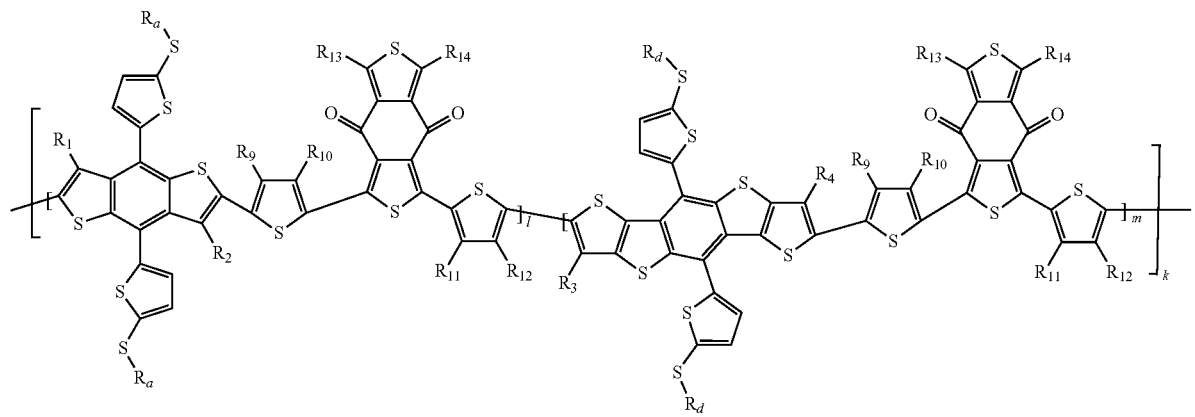

In Chemical Formulae 20 to 37, $R_1$ to $R_{14}$, $R_a$, $A_1$, $A_2$, c, d, l, m and k have the same definitions as in Chemical Formulae 1 to 7, and $R_d$ is a substituted or unsubstituted alkyl group, and is different from $R_a$.

In one embodiment of the present specification, the polymer is a random polymer. The random polymer has enhanced solubility, which is economically effective time- and cost-wise in terms to of a device manufacturing process.

In one embodiment of the present specification, an end group of the polymer is a substituted or unsubstituted heterocyclic group; or a substituted or unsubstituted aryl group.

In one embodiment of the present specification, an end group of the polymer is a 4-(trifluoromethyl)phenyl group.

In one embodiment of the present specification, an end group of the polymer is a bromo-thiophene group.

In one embodiment of the present specification, an end group of the polymer is a trifluoro-benzene group.

In one embodiment of the present specification, the polymer preferably has a number average molecular weight of 5,000 g/mol to 1,000,000 g/mol.

In one embodiment of the present specification, the polymer may have molecular weight distribution of 1 to 10. The polymer preferably has molecular weight distribution of 1 to 3.

Electrical properties and mechanical properties become better as the molecular weight distribution decreases and the number average molecular weight increases.

The polymer may be prepared by introducing monomers of each unit with $Pd_2(dba)_3$ and $P(o-tolyl)_3$ with chlorobenzene as a solvent, and polymerizing the result using a microwave reactor.

The polymer according to the present specification may be prepared through a multi-step chemical reaction. After preparing monomers through an alkylation reaction, a Grignard reaction, a Suzuki coupling reaction, a Stile coupling reaction and the like, final polymers may be prepared through a carbon-carbon coupling reaction such as a Stille coupling reaction. When a substituent to introduce is a boronic acid or boronic ester compound, the polymer may be prepared through a Suzuki coupling reaction, and when a substituent to introduce is a tributyltin or trimethyltin compound, the polymer may be prepared through a Stile coupling reaction, however, the preparation is not limited thereto.

One embodiment of the present specification provides an organic solar cell including a first electrode; a second electrode disposed opposite to the first electrode; and one or more organic material layers disposed between the first electrode and the second electrode and including a photoactive layer, wherein the photoactive layer includes an electron donor and an electron acceptor, and the electron donor includes the polymer and the electron acceptor includes a non-fullerene-based compound.

In one embodiment of the present specification, the electron donor is a polymer including a first unit represented by Chemical Formula 1; a second unit represented by Chemical Formula 2; and a third unit represented by Chemical Formula 3 or 4, and the electron acceptor is a non-fullerene-based compound.

The polymer according to one embodiment of the present specification is capable of exhibiting more enhanced performance when included as an electron donor material compared to existing electron donor materials due to benzodithiophene or dithienobenzodithiophene having substituents different from each other. Specifically, when using the polymer as an electron donor material of an organic solar cell, higher molecular weights are obtained compared to polymers obtained through cross polymerization, and a lower HOMO energy level and favorable molecular arrangements in the organic solar cell are obtained due to different substituents of benzodithiophene or dithienobenzodithiophene, for example, substituents such as thiolalkyl and fluorine. As a result, high short-circuit current density may be obtained, and in addition thereto, an enhanced open-circuit voltage may be obtained due to changes in the LUMO energy level, which ultimately enhances photo-electric conversion efficiency of the organic solar cell.

In one embodiment of the present specification, descriptions on the polymer are the same as the descriptions provided above.

In one embodiment of the present specification, the non-fullerene-based compound is represented by the following Chemical Formula A.

In another embodiment, $X_1$ to $X_4$ are the same as or different from each other, and are each an alkyl group having 1 to 10 carbon atoms.

In one embodiment of the present specification, $X_5$ and $X_6$ are each hydrogen.

In one embodiment of the present specification, $Z_1$ to $Z_4$ are the same as or different from each other, and are each an arylene group.

In another embodiment, $Z_1$ to $Z_4$ are the same as or different from each other, and are each an arylene group having 6 to 25 carbon atoms.

In another embodiment, $Z_1$ to $Z_4$ are each a phenylene group.

In another embodiment, $Z_1$ to $Z_4$ are the same as or different from each other, and are each a divalent heterocyclic group.

In another embodiment, $Z_1$ to $Z_4$ are the same as or different from each other, and are each a divalent heterocyclic group having 2 to 30 carbon atoms.

In another embodiment, $Z_1$ to $Z_4$ are the same as or different from each other, and are each a divalent heterocyclic group having 2 to 10 carbon atoms.

[Chemical Formula A]

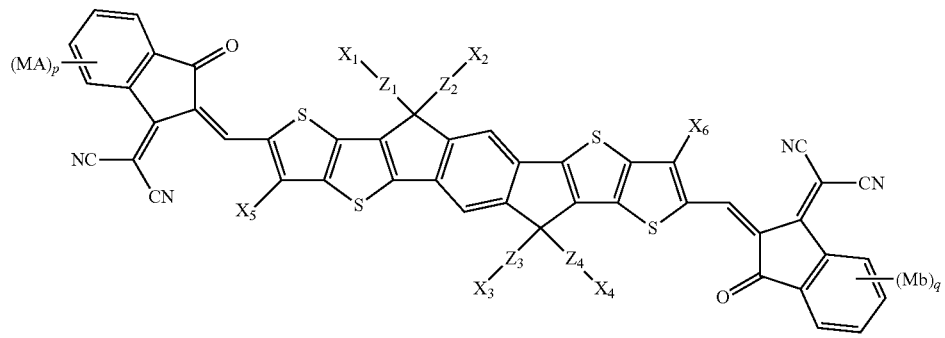

In Chemical Formula A, $X_1$ to $X_6$ are the same as or different from each other, and each independently hydrogen; or a substituted or unsubstituted alkyl group, $Z_1$ to $Z_4$ are the same as or different from each other, and each independently a substituted or unsubstituted arylene group; or a substituted or unsubstituted divalent heterocyclic group, Ma and Mb are the same as or different from each other, and each independently hydrogen; a halogen group; or a substituted or unsubstituted alkyl group, p and q are the same as or different from each other, and each independently an integer of 0 to 2, and when p or q is 2, structures in the parentheses are the same as each other.

In one embodiment of the present specification, $X_1$ to $X_4$ are the same as or different from each other, and are each an alkyl group.

In another embodiment, $X_1$ to $X_4$ are the same as or different from each other, and are each an alkyl group having 1 to 30 carbon atoms.

In another embodiment, $Z_1$ to $Z_4$ are a divalent thiophene group.

In one embodiment of the present specification, Ma and Mb are each hydrogen.

In another embodiment, Ma and Mb are the same as or different from each other, and are each an alkyl group.

In another embodiment, Ma and Mb are the same as or different from each other, and are each an alkyl group having 1 to 10 carbon atoms.

In another embodiment, Ma and Mb are a methyl group.

In another embodiment, Ma and Mb are the same as or different from each other, and are each a halogen group.

In another embodiment, Ma and Mb are each fluorine.

In one embodiment of the present specification, p and q are each 0.

In another embodiment, p and q are each 1.

In another embodiment, p and q are each 2.

In one embodiment of the present specification, the compound represented by Chemical Formula A is any one of the following Chemical Formulae A-1 to A-5.

[Chemical Formula A-1]
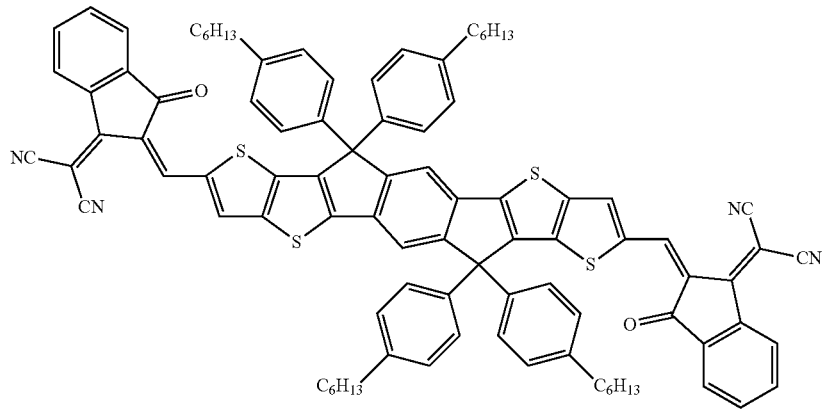
[Chemical Formula A-2]
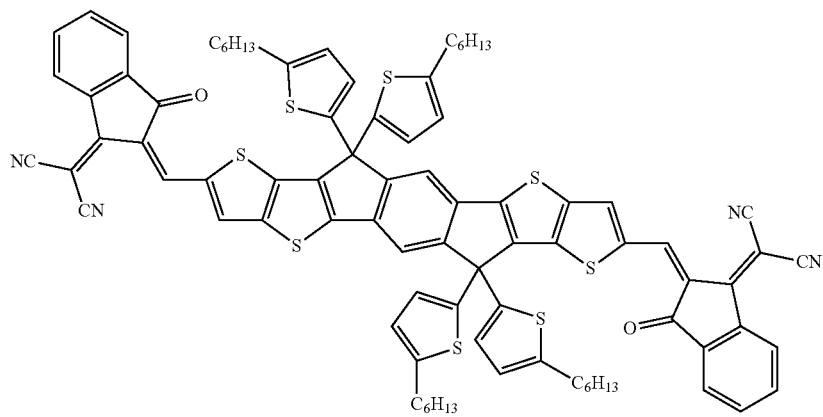
[Chemical Formula A-3]
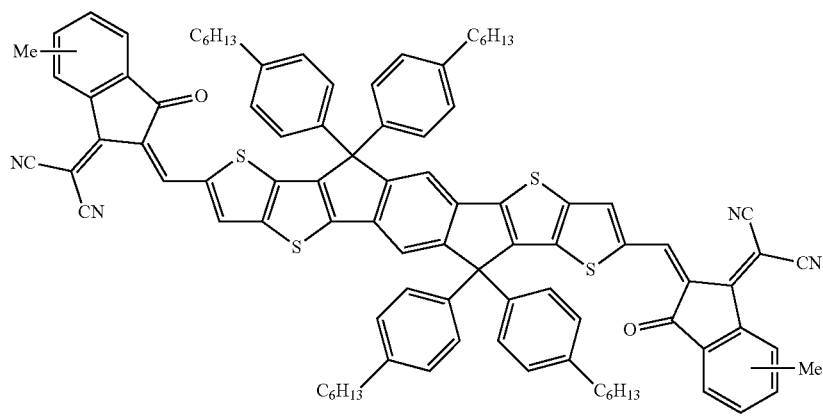

-continued

[Chemical Formula A-4]

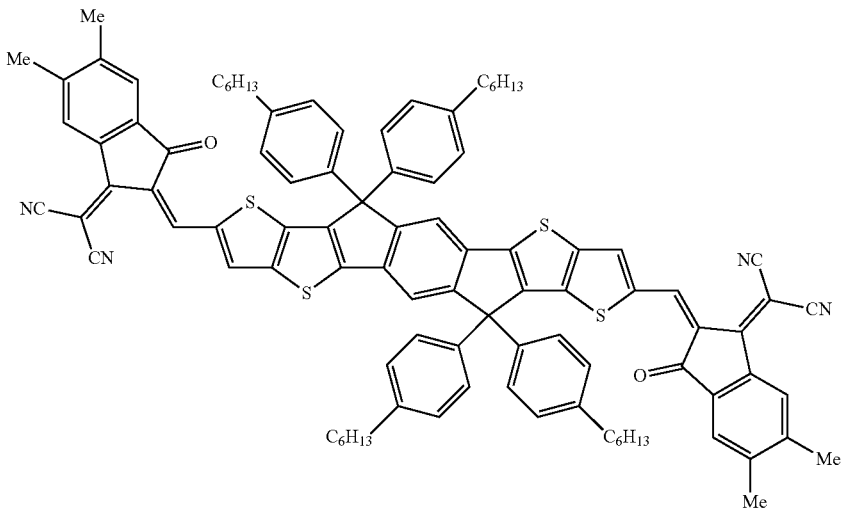

[Chemical Formula A-5]

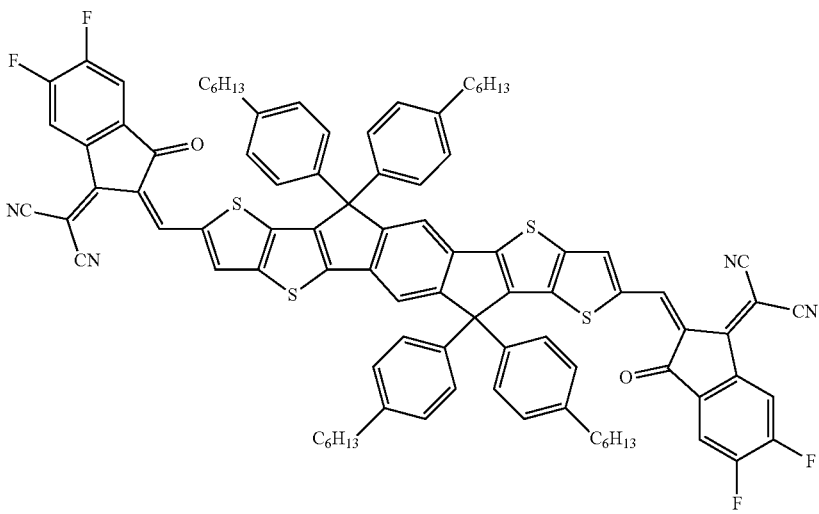

In the present specification, Me means a methyl group.

In one embodiment of the present specification, the non-fullerene-based compound has higher thermal stability compared to fullerene-based compounds.

In addition, in one embodiment of the present specification, the organic solar cell including the non-fullerene-based compound as an electron acceptor of a photoactive layer and including the polymer as an electron donor of a photoactive layer has excellent thermal stability and excellent power conversion efficiency.

In another embodiment, the electron donor is the polymer, and the electron acceptor is the compound represented by Chemical Formula A-1.

In one embodiment of the present specification, the electron donor and the electron acceptor have a mass ratio of 1:2 to 2:1, preferably 1:1.5 to 1.5:1, and more preferably 1:1.

In one embodiment of the present specification, the electron donor and the electron acceptor may form a bulk heterojunction (BHJ).

A bulk heterojunction means an electron donor material and an electron acceptor material being mixed together in a photoactive layer.

In one embodiment of the present specification, the electron donor may be a p-type organic material layer, and the electron acceptor may be an n-type organic material layer.

In one embodiment of the present specification, the photoactive layer may further include an additive.

In one embodiment of the present specification, the additive has a molecular weight of 50 g/mol to 300 g/mol.

In one embodiment of the present specification, the additive is an organic material having a boiling point of 30° C. to 300° C.

In the present specification, the organic material means a material including at least one or more carbon atoms.

In one embodiment, the additive may further include one or more types of additives among additives selected from the group consisting of 1,8-diiodooctane (DIO), 1-chloronaphthalene (1-CN), diphenyl ether (DPE), octanedithiol and tetrabromothiophene.

An organic solar cell according to one embodiment of the present specification includes a first electrode, a photoactive layer and a second electrode. The organic solar cell may further include a substrate, a hole transfer layer and/or an electron transfer layer.

In one embodiment of the present specification, the substrate may be a glass substrate or a transparent plastic substrate having excellent transparency, surface smoothness, handling easiness and water resistance, but is not limited thereto, and substrates typically used in organic solar cells may be used without limit. Specific examples thereof include glass, polyethylene terphthalate (PET), polyethylene naphthalate (PEN), polypropylene (PP), polyimide (PI), triacetyl cellulose (TAC) and the like, but are not limited thereto.

In one embodiment of the present specification, when the organic solar cell receives photons from an external light source, electrons and holes are generated between an electron donor and an electron acceptor. The generated holes are transferred to an anode through an electron donor layer.

In one embodiment of the present specification, the organic solar cell may further include additional organic material layers. The organic solar cell may reduce the number of organic material layers by using organic materials having various functions at the same time.

In one embodiment of the present specification, the first electrode is an anode, and the second electrode is a cathode. In another embodiment, the first electrode is a cathode, and the second electrode is an anode.

In one embodiment of the present specification, in the organic solar cell, the layers may be arranged in the order of a cathode, a photoactive layer and an anode, or may also be arranged in the order of an anode, a photoactive layer and a cathode, however, the disposition is not limited thereto.

In another embodiment, in the organic solar cell, the layers may be arranged in the order of an anode, a hole transfer layer, a photoactive layer, an electron transfer layer and a cathode, or may also be arranged in the order of a cathode, an electron transfer layer, a photoactive layer, a hole transfer layer and an anode, however, the disposition is not limited thereto.

FIG. 1 is a diagram illustrating the organic solar cell according to one embodiment of the present specification including a first electrode (101), an electron transfer layer (102), a photoactive layer (103), a hole transfer layer (104) and a second electrode (105).

In one embodiment of the present specification, the organic solar cell may have a normal structure having a structure of substrate-first electrode-hole transfer layer-photoactive layer-electron transfer layer-second electrode.

In one embodiment of the present specification, the organic solar cell may have an inverted structure having a structure of substrate-first electrode-electron transfer layer-photoactive layer-hole transfer layer-second electrode.

In one embodiment of the present specification, the organic solar cell has a tandem structure. In this case, the organic solar cell may include two or more layers of photoactive layers. The organic solar cell according to one embodiment of the present specification may have a photoactive layer in one, or two or more layers.

In another embodiment, a buffer layer may be disposed between a photoactive layer and a hole transfer layer, or between a photoactive layer and an electron transfer layer. Herein, a hole injection layer may be further disposed between an anode and the hole transfer layer. In addition, an electron injection layer may be further disposed between a cathode and the electron transfer layer.

A material of the first electrode may include a material that is transparent and has excellent conductivity, however, the material is not limited thereto. Examples thereof may include metals such as vanadium, chromium, copper, zinc or gold, or alloys thereof; metal oxides such as zinc oxide, indium oxide, indium tin oxide (ITO) or indium zinc oxide (IZO); combinations of metals and oxides such as ZnO:Al or SnO$_2$:Sb; conductive polymers such as poly(3-methylthiophene), poly[3,4-(ethylene-1,2-dioxy)thiophene] (PEDOT), polypyrrole and polyaniline, and the like, but are not limited thereto.

A method of forming the first electrode is not particularly limited, however, a method of for example, sputtering, E-beam, thermal deposition, spin coating, screen printing, inkjet printing, doctor blade or gravure printing may be used.

When forming the first electrode on a substrate, the result may go through processes of cleaning, dehydrating and modifying to be hydrophilic.

For example, after a patterned ITO substrate is cleaned with a cleaning agent, acetone and isopropyl alcohol (IPA) in consecutive order, the ITO substrate is dried for 1 minute to 30 minutes at 100° C. to 150° C., preferably for 10 minutes at 120° C., on a heating plate in order to dehydrate, and when the substrate is completely cleaned, the surface of the substrate is modified to be hydrophilic.

Through the surface modification such as above, the junctional surface potential may be maintained at a level suitable as surface potential of a photoactive layer. In addition, when a surface is modified, a polymer thin film may be readily formed on a first electrode, and the quality of the thin film may be improved.

Preprocessing technologies for the first electrode include a) a surface oxidation method using parallel plate discharge, b) a method of oxidizing the surface through ozone generated using UV rays in a vacuum state, and c) an oxidation method using oxygen radicals generated by plasma.

One of the methods described above may be selected depending on the condition of the first electrode or the substrate. However, it is commonly preferred to prevent the leave of oxygen on the surface of the first electrode or the substrate and to suppress the remaining of moisture and organic materials as much as possible, no matter which method is used. Practical effects of the preprocessing may be maximized in this case.

As a specific example, a method of oxidizing the surface through ozone generated using UV may be used. Herein, a patterned ITO substrate may be fully dried by baking the patterned ITO substrate on a hot plate after being ultrasonic cleaned, and the patterned ITO substrate is introduced into a chamber and then may be cleaned by the ozone generated by reacting oxygen gas with UV light using a UV lamp.

However, the method of surface modification of the patterned ITO substrate in the present specification is not particularly limited, and any method oxidizing a substrate may be used.

The second electrode may include a metal having small work function, but is not limited thereto. Specific examples thereof may include metals such as magnesium, calcium, sodium, potassium, titanium, indium, yttrium, lithium, gadolinium, aluminum, silver, tin and lead, or alloys thereof; or multilayer-structured materials such as LiF/Al, LiO$_2$/Al, LiF/Fe, Al:Li, Al:BaF$_2$ and Al:BaF$_2$:Ba, but are not limited thereto.

The second electrode may be formed by being deposited inside a thermal depositor having a vacuum degree of 5×10$^{-7}$ torr or less, however, the formation is not limited to this method.

The hole transfer layer and/or the electron transfer layer play a role of efficiently transferring the electrons and the holes separated in a photoactive layer to an electrode, and the material is not particularly limited.

The hole transfer layer material may include poly(3,4-ethylenedioxythiophene) doped with poly(styrenesulfonic acid) (PEDOT:PSS), molybdenum oxide (MoO$_x$); vanadium oxide (V$_2$O$_5$); nickel oxide (NiO); tungsten oxide (O$_x$) and the like, but is not limited thereto.

The electron transfer layer material may include electron-extracting metal oxides, and may specifically include a metal complex of 8-hydroxyquinoline; a complex including Alq$_3$; a metal complex including Liq; LW; Ca; titanium oxide (TiO$_x$); zinc oxide (ZnO); cesium carbonate (Cs$_2$CO$_3$), and the like, but is not limited thereto.

The photoactive layer may be formed by dissolving a photoactive material such as an electron donor and/or an electron acceptor in an organic solvent, and then applying the solution using a method such as spin coating, dip coating, screen printing, spray coating, doctor blade and brush painting, however, the method is not limited thereto.

Hereinafter, the present specification will be described in detail with reference to examples in order to specifically describe the present specification. However, examples according to the present specification may be modified to various different forms, and the scope of the present specification is not construed as being limited to the examples described below. The examples of the present specification are provided in order to more fully describe the present specification to those having average knowledge in the art.

Preparation Example: Synthesis of Polymers 1 to 9

Preparation Example 1. Synthesis of Polymer 1

To a round flask equipped with a condenser, (4,8-bis(5-(2-ethylhexyl)thiophen-2-yl)benzo[1,2-b:4,5-b']dithiophene-2,6-diyl)bis(trimethylstannane) (117.9 mg, 0.5 eq.), (4,8-bis(5-((2-ethylhexyl)thio)thiophen-2-yl)benzo[1,2-b:4,5-b']dithiophene-2,6-diyl)bis(trimethylstannane) (126.31 mg, 0.5 eq.), 1,3-bis(5-bromothiophen-2-yl)-5,7-bis(2-ethylhexyl)-4H,8H-benzo[1,2-c:4,5-c']dithiophene-4,8-dione (200 mg, 1.0 eq.) and Pd(PPh$_3$)$_4$ (0.01 g, 0.03 eq.) were injected, and then toluene (16 mL) and dimethylformamide (DMF) (1 mL) were injected thereto. After that, the result was refluxed for 17 hours at 100° C., and after terminating the reaction through methanol, the synthesized polymer (following Polymer 1) was purified through methanol, hexane and acetone.

[Polymer 1]

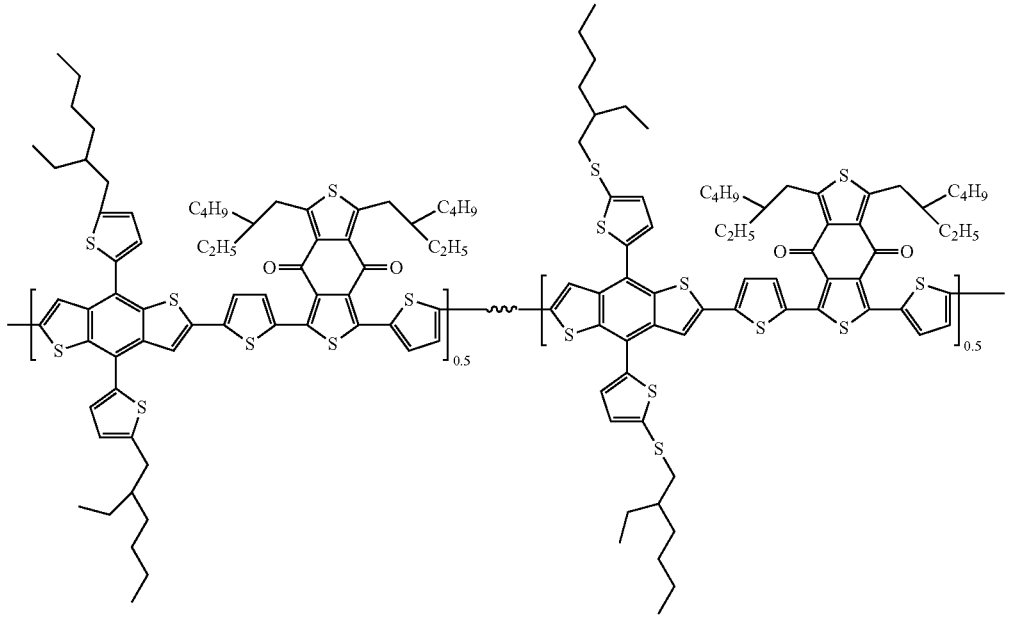

Figure 2:
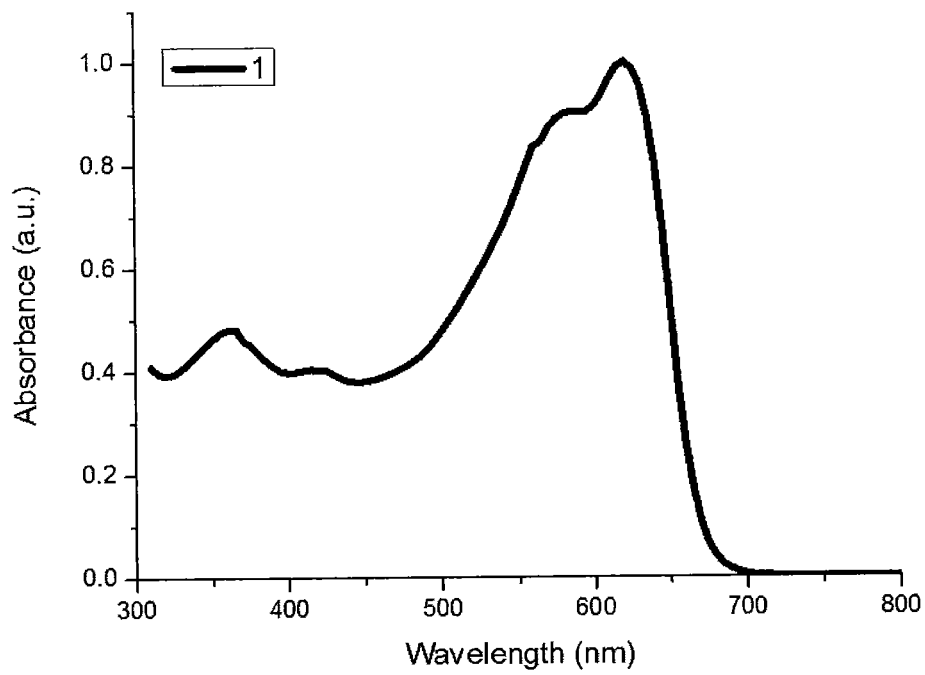
FIG. 2 is a diagram showing a UV-Vis absorption spectrum in a solution state of Polymer 1 synthesized in Preparation Example 1 of the present specification.
Figure 3:
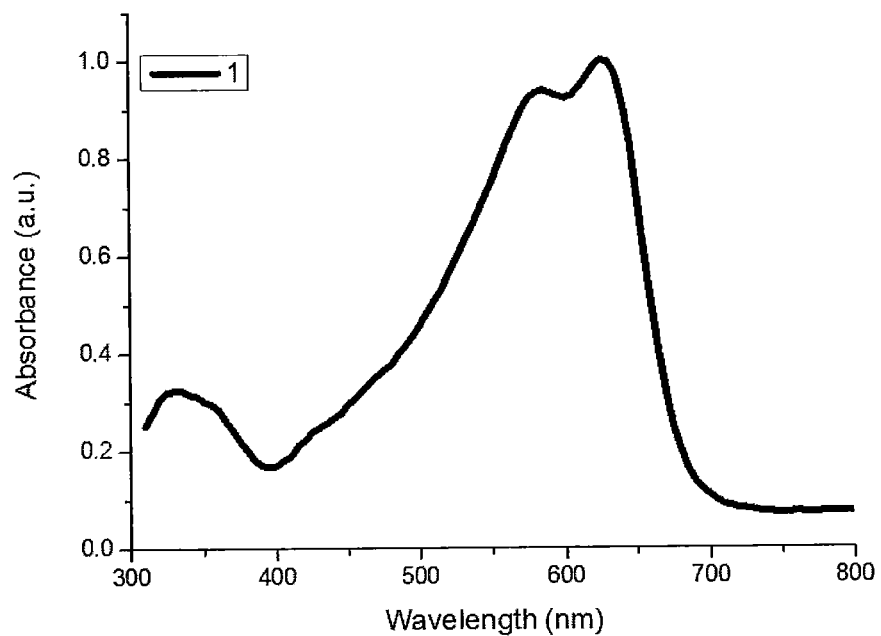
FIG. 3 is a diagram showing a UV-Vis absorption spectrum in a film state of Polymer 1 synthesized in Preparation Example 1 of the present specification.

FIG. 2 and FIG. 3 are diagrams showing UV-Vis absorption spectra in a solution state and a film state, respectively, of Polymer 1.

Preparation Example 2. Synthesis of Polymer 2

To a round flask equipped with a condenser, (4,8-bis(5-(2-ethylhexyl)thiophen-2-yl)benzo[1,2-b:4,5-b']dithiophene-2,6-diyl)bis(trimethylstannane) (117.9 mg, 0.5 eq.), (4,8-bis(5-(2-ethylhexyl)-4-fluorothiophen-2-yl)benzo[1,2-b:4,5-b']dithiophene-2,6-diyl)bis(trimethylstannane) (122.64 mg, 0.5 eq.), 1,3-bis(5-bromothiophen-2-yl)-5,7-bis(2-ethylhexyl)-4H,8H-benzo[1,2-c:4,5-c']dithiophene-4,8-dione (200 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 2) was purified through methanol, hexane and acetone.

[Polymer 2]

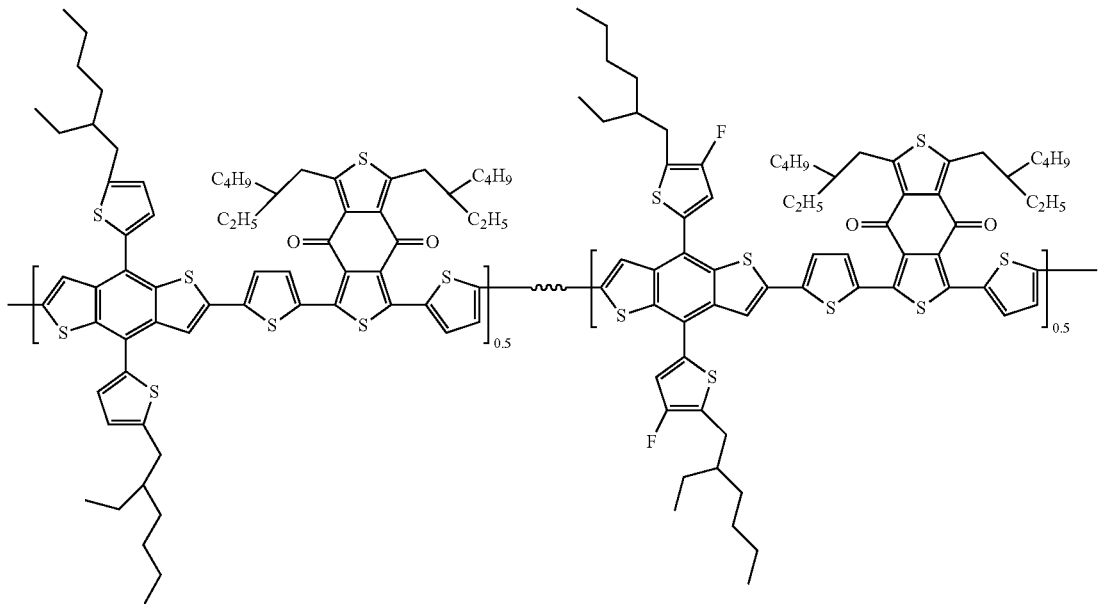

Figure 4:
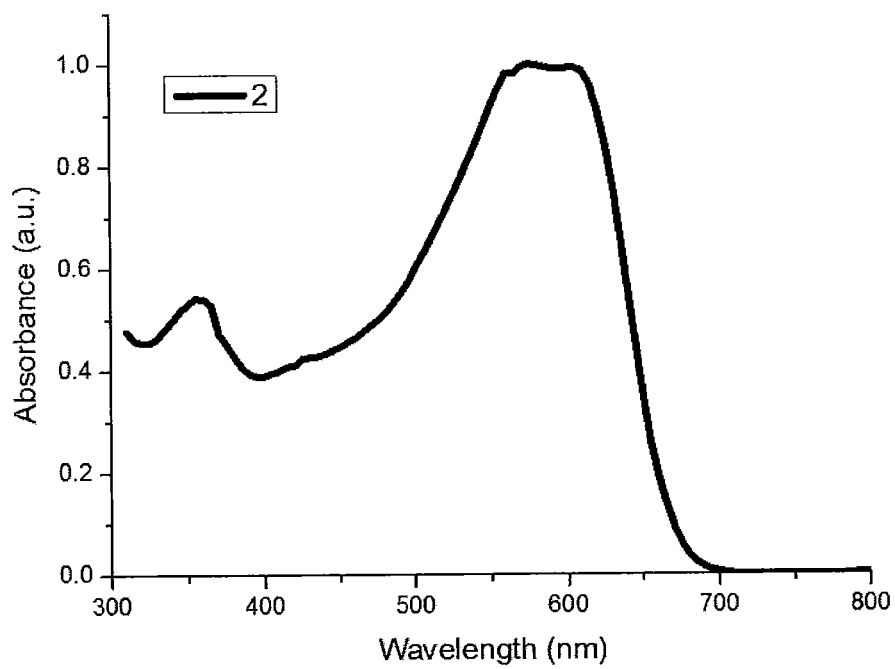
FIG. 4 is a diagram showing a UV-Vis absorption spectrum in a solution state of Polymer 2 synthesized in Preparation Example 2 of the present specification.
Figure 5:
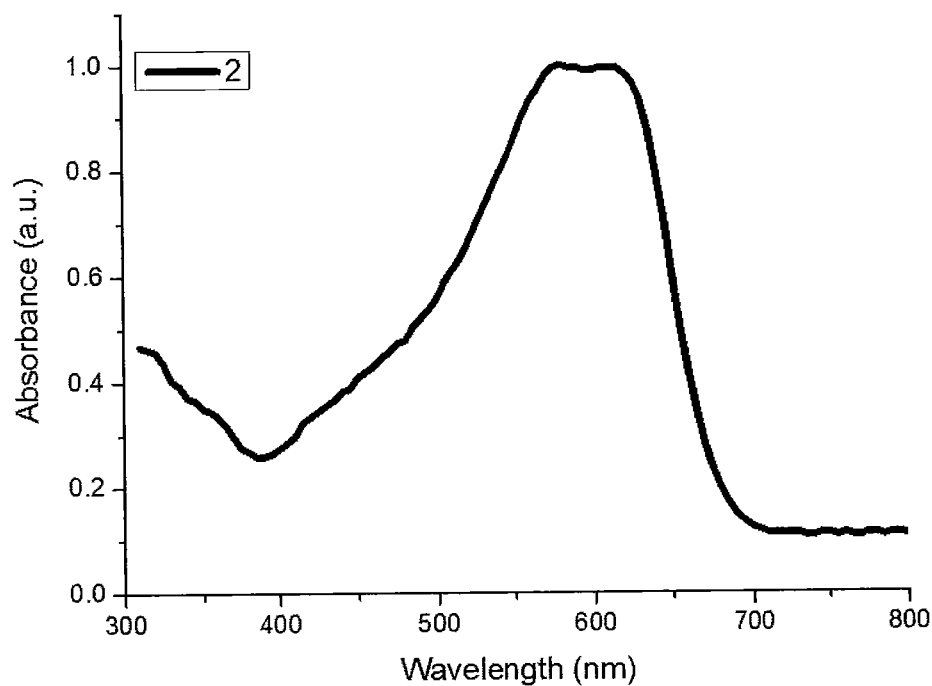
FIG. 5 is a diagram showing a UV-Vis absorption spectrum in a film state of Polymer 2 synthesized in Preparation Example 2 of the present specification.

FIG. 4 and FIG. 5 are diagrams showing UV-Vis absorption spectra in a solution state and a film state, respectively, of Polymer 2.

Preparation Example 3. Synthesis of Polymer 3

To a round flask equipped with a condenser, (4,8-bis(5-(2-ethylhexyl)thiophen-2-yl)benzo[1,2-b:4,5-b']dithiophene-2,6-diyl)bis(trimethylstannane) (117.9 mg, 0.5 eq.), 4,8-bis(5-(octyl)thiophen-2-yl)dithienobenzo[1,2-b:4,5-b']dithiophene-2,6-diyl)bis(trimethylstannane) (132.58 mg, 0.5 eq.), 1,3-bis(5-bromothiophen-2-yl)-5,7-bis(2-ethylhexyl)-4H,8H-benzo[1,2-c:4,5-c']dithiophene-4,8-dione (200 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 3) was purified through methanol, hexane and acetone.

[Polymer 3]

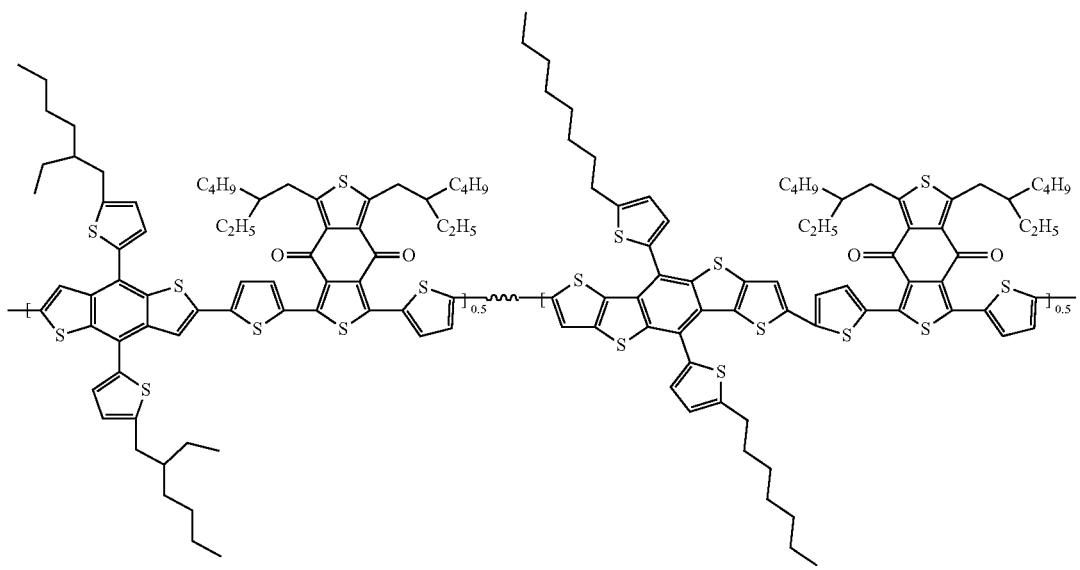

Figure 6:
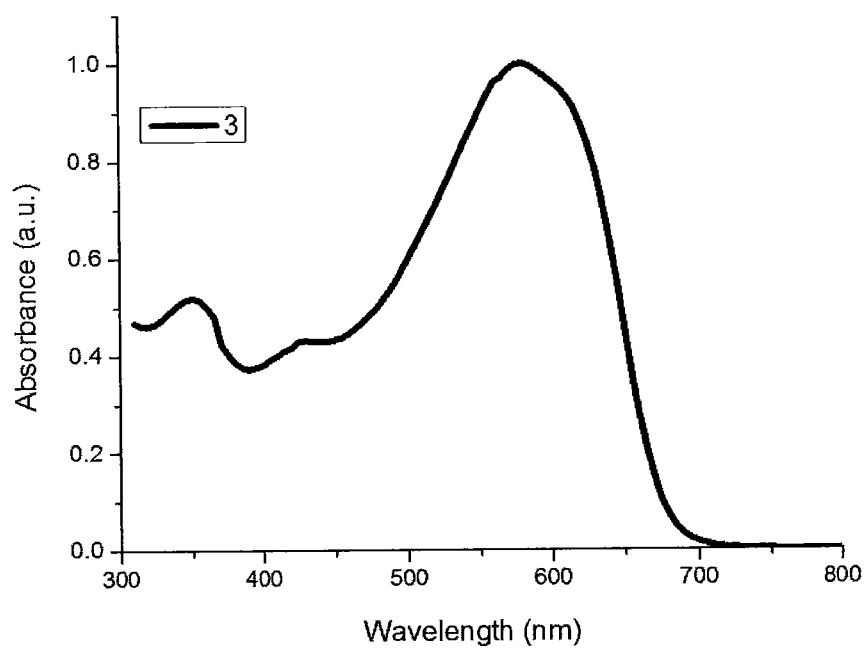
FIG. 6 is a diagram showing a UV-Vis absorption spectrum in a solution state of Polymer 3 synthesized in Preparation Example 3 of the present specification.
Figure 7:
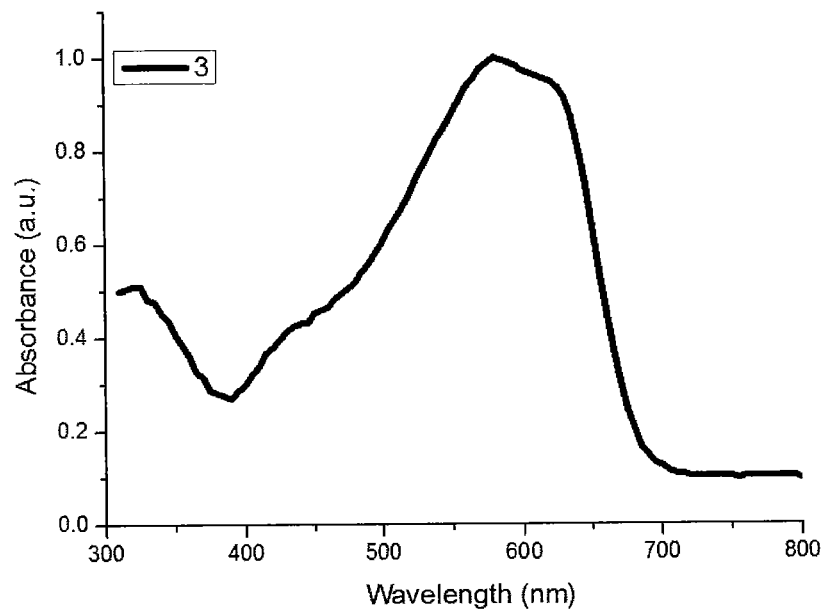
FIG. 7 is a diagram showing a UV-Vis absorption spectrum in a film state of Polymer 3 synthesized in Preparation Example 3 of the present specification.

FIG. 6 and FIG. 7 are diagrams showing UV-Vis absorption spectra in a solution state and a film state, respectively, of Polymer 3.

Preparation Example 4. Synthesis of Polymer 4

To a round flask equipped with a condenser, (4,8-bis(5-(2-ethylhexyl)thiophen-2-yl)benzo[1,2-b:4,5-b']dithiophene-2,6-diyl)bis(trimethylstannane) (117.9 mg, 0.5 eq.), 4,8-bis(5-((octyl)thio)thiophen-2-yl)dithienobenzo[1,2-b:4,5-b']dithiophene-2,6-diyl)bis(trimethylstannane) (140.94 mg, 0.5 eq.), 1,3-bis(5-bromothiophen-2-yl)-5,7-bis(2-ethylhexyl)-4H-8H-benzo[1,2-c:4,5-c']dithiophene-4,8-dione (200 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 4) was purified through methanol, hexane and acetone.

[Polymer 4]

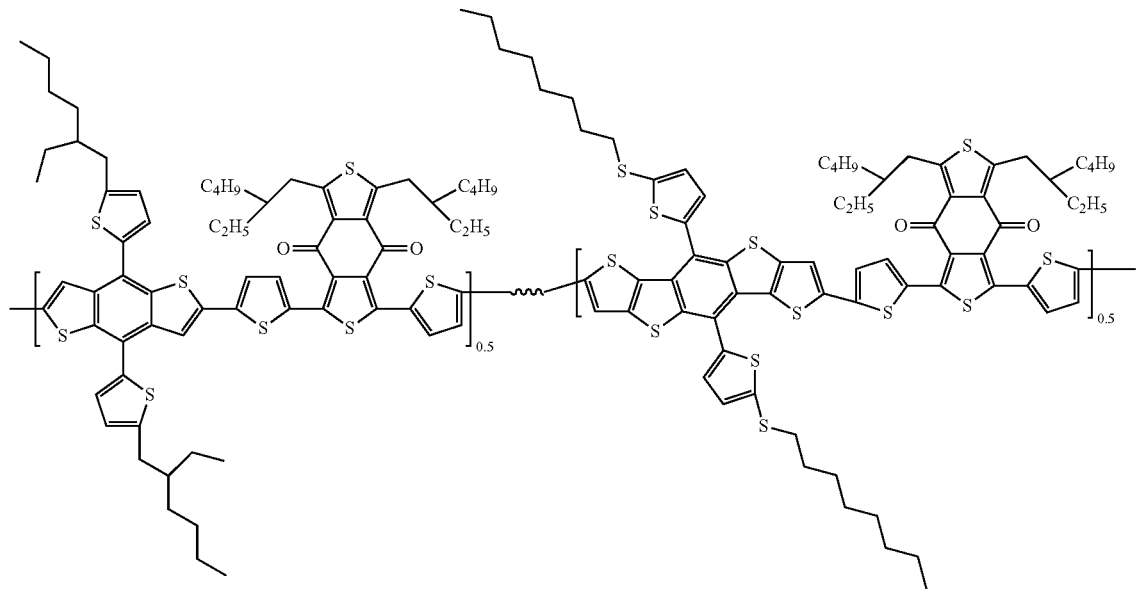

Figure 8:
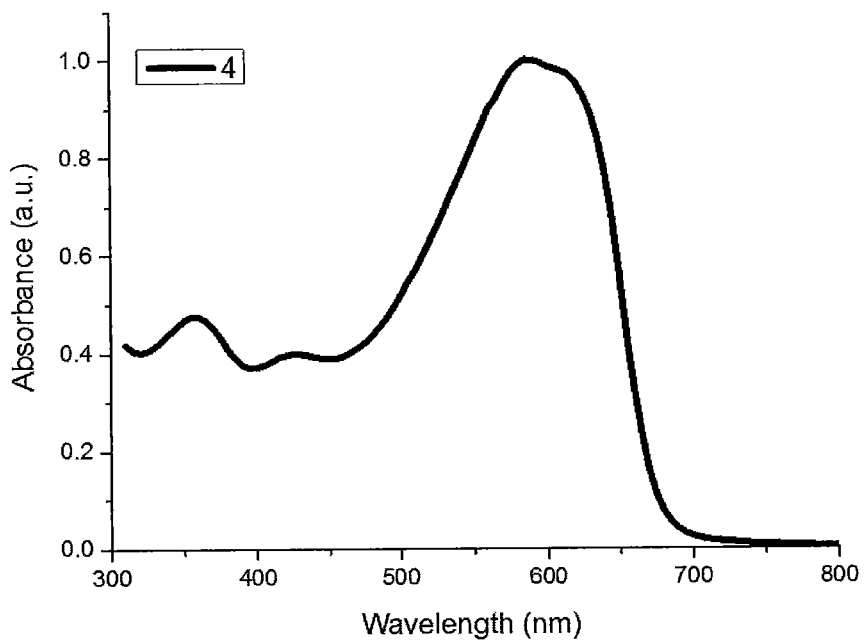
FIG. 8 is a diagram showing a UV-Vis absorption spectrum in a solution state of Polymer 4 synthesized in Preparation Example 4 of the present specification.
Figure 9:
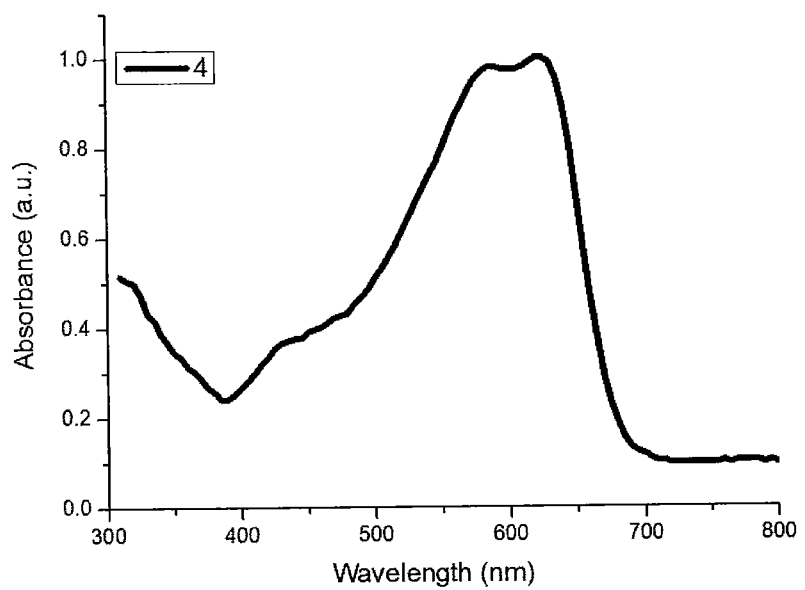
FIG. 9 is a diagram showing a UV-Vis absorption spectrum in a film state of Polymer 4 synthesized in Preparation Example 4 of the present specification.

FIG. 8 and FIG. 9 are diagrams showing UV-Vis absorption spectra in a solution state and a film state, respectively, of Polymer 4.

Preparation Example 5. Synthesis of Polymer 5

To a round flask equipped with a condenser, (4,8-bis(5-(2-ethylhexyl)thio)thiophen-2-yl)benzo[1,2-b:4,5-b']dithiophene-2,6-diyl)bis(trimethylstannane) (126.31 mg, 0.5 eq.), (4,8-bis(5-(2-ethylhexyl)-4-fluorothiophen-2-yl)benzo[1,2-b:4,5-b']dithiophene-2,6-diyl)bis(trimethylstannane) (122.64 mg, 0.5 eq.), 1,3-bis(5-bromothiophen-2-yl)-5,7-bis(2-ethylhexyl)-4H,8H-benzo[1,2-c:4,5-c']dithiophene-4,8-dione (200 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 5) was purified through methanol, hexane and acetone.

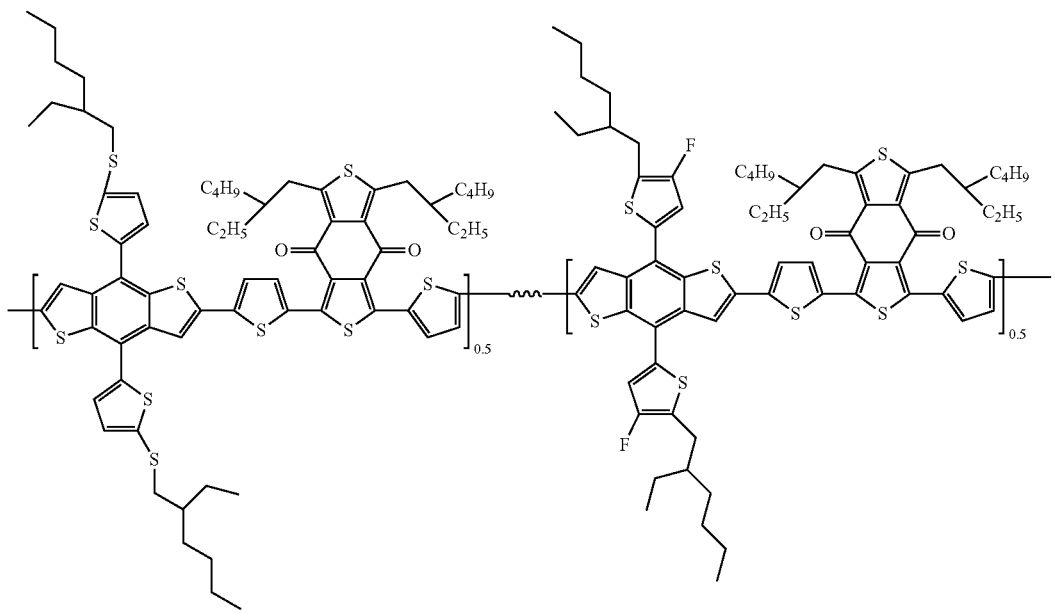

[Polymer 5]

Figure 10:
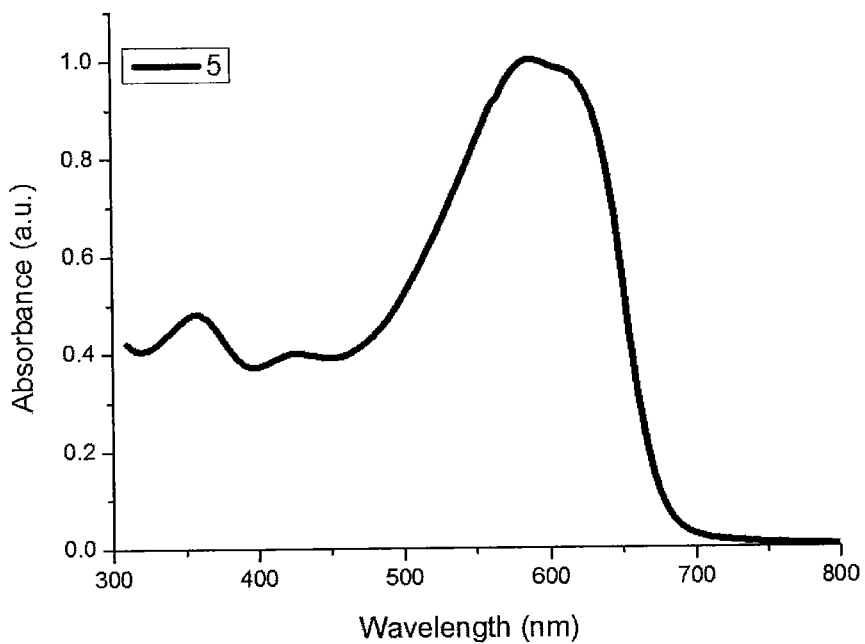
FIG. 10 is a diagram showing a UV-Vis absorption spectrum in a solution state of Polymer 5 synthesized in Preparation Example 5 of the present specification.
Figure 11:
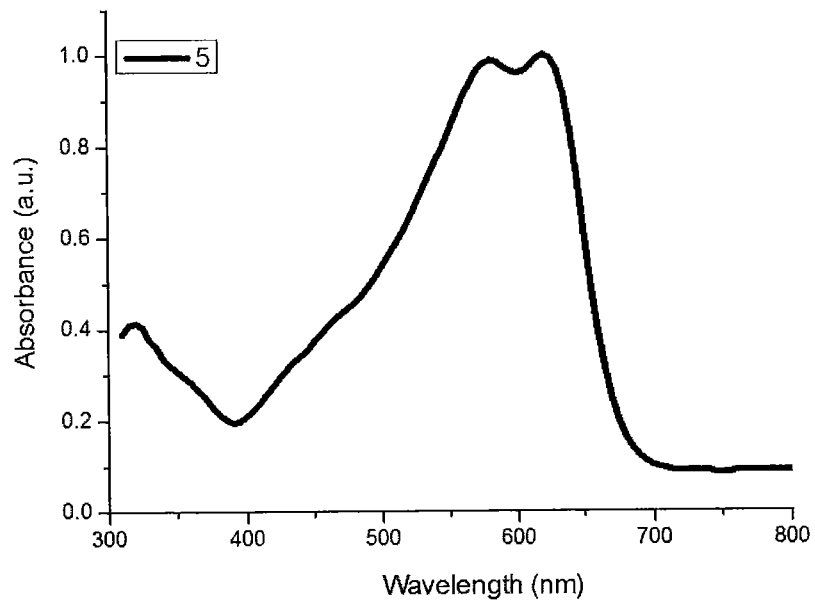
FIG. 11 is a diagram showing a UV-Vis absorption spectrum in a film state of Polymer 5 synthesized in Preparation Example 5 of the present specification.

FIG. 10 and FIG. 11 are diagrams showing UV-Vis absorption spectra in a solution state and a film state, respectively, of Polymer 5.

Preparation Example 6. Synthesis of Polymer 6

To a round flask equipped with a condenser, (4,8-bis(5-((2-ethylhexyl)thio)thiophen-2-yl)benzo[1,2-b:4,5-b']dithiophene-2,6-diyl)bis(trimethylstannane) (126.31 mg, 0.5 eq.), 4,8-bis(5-(octyl)thiophen-2-yl)dithienobenzo[1,2-b:4,5-b']dithiophene-2,6-diyl)bis(trimethylstannane) (132.58 mg, 0.5 eq.), 1,3-bis(5-bromothiophen-2-yl)-5,7-bis(2-ethylhexyl)-4H,8H-benzo[1,2-e:4,5-c']dithiophene-4,8-dione (200 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 6) was purified through methanol, hexane and acetone.

[Polymer 6]

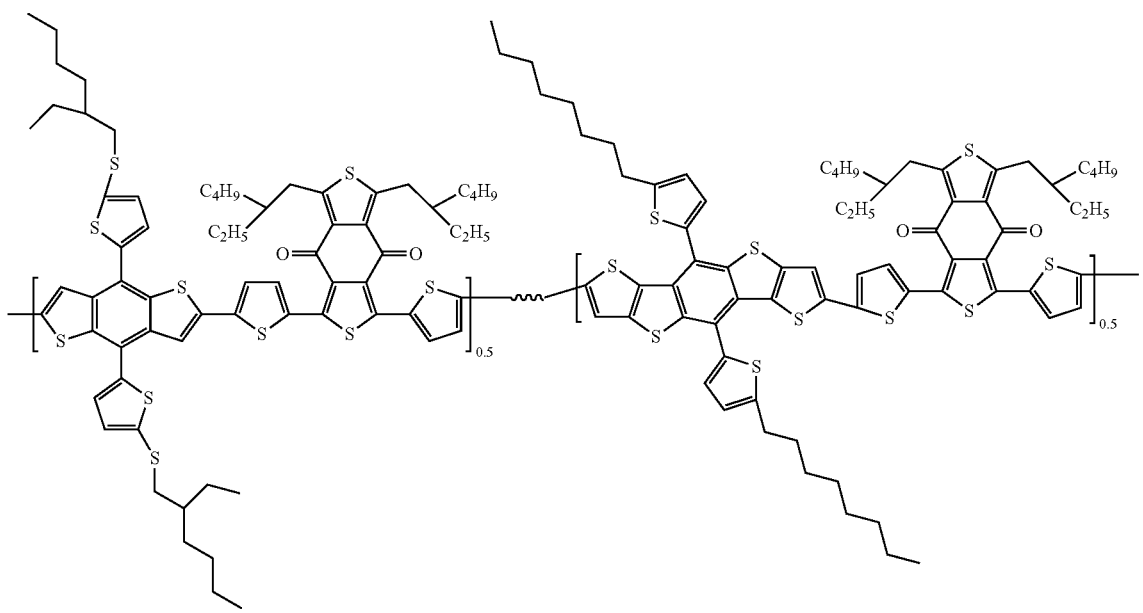

Figure 12:
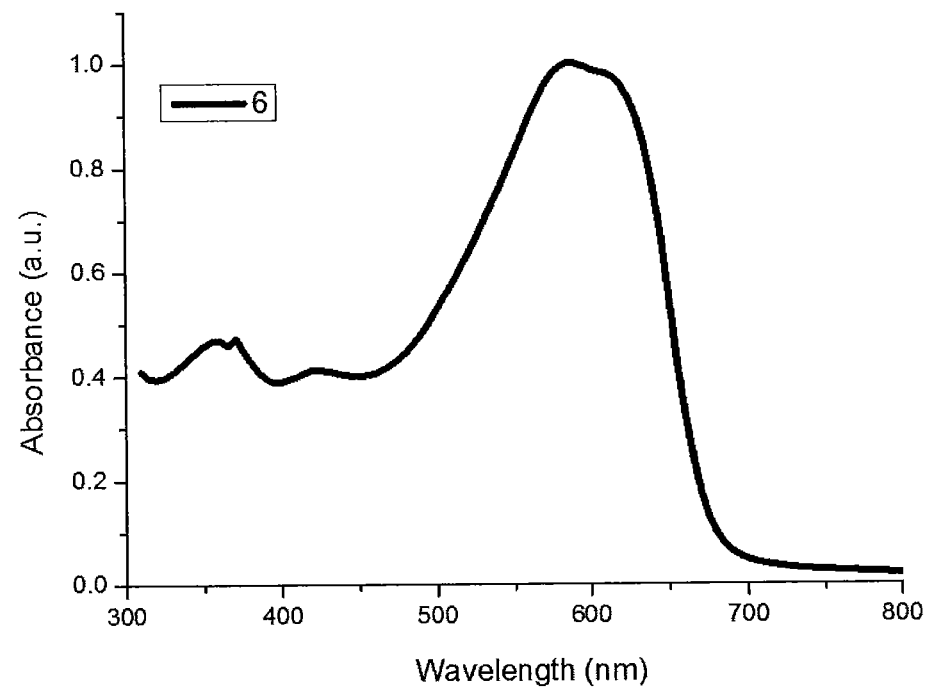
FIG. 12 is a diagram showing a UV-Vis absorption spectrum in a solution state of Polymer 6 synthesized in Preparation Example 6 of the present specification.
Figure 13:
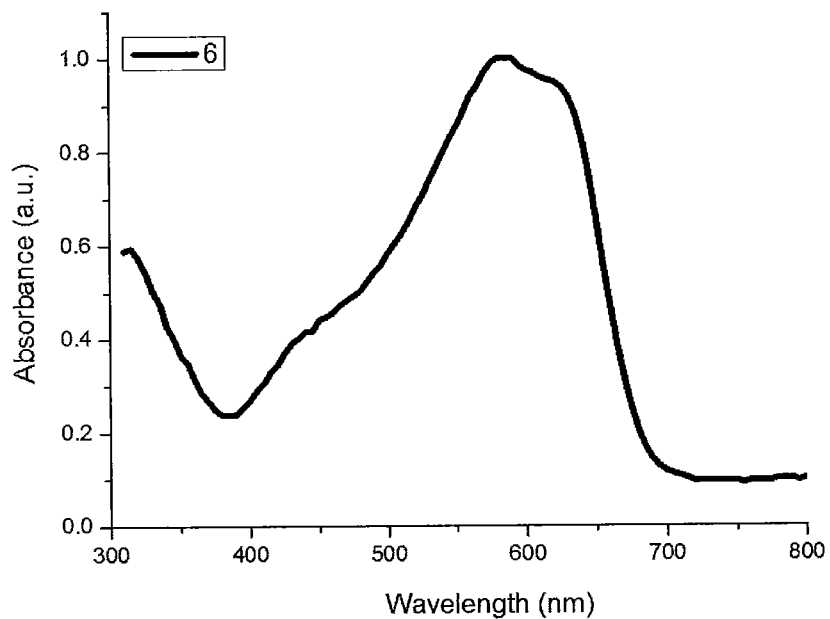
FIG. 13 is a diagram showing a UV-Vis absorption spectrum in a film state of Polymer 6 synthesized in Preparation Example 6 of the present specification.

FIG. 12 and FIG. 13 are diagrams showing UV-Vis absorption spectra in a solution state and a film state, respectively, of Polymer 6.

Preparation Example 7. Synthesis of Polymer 7

To a round flask equipped with a condenser, (4,8-bis(5-((2-ethylhexyl)thio)thiophen-2-yl)benzo[1,2-b:4,5-b']dithiophene-2,6-diyl)bis(trimethylstannane) (126.31 mg, 0.5 eq.), 4,8-bis(5-((octyl)thio)thiophen-2-yl)dithienobenzo[1,2-b:4,5-b']dithiophene-2,6-diyl)bis(trimethylstannane) (140.94 mg, 0.5 eq.), 1,3-bis(5-bromothiophen-2-yl)-5,7-bis(2-ethylhexyl)-4H, 8H-benzo[1,2-c:4,5-c']dithiophene-4,8-dione (200 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 7) was purified through methanol, hexane and acetone.

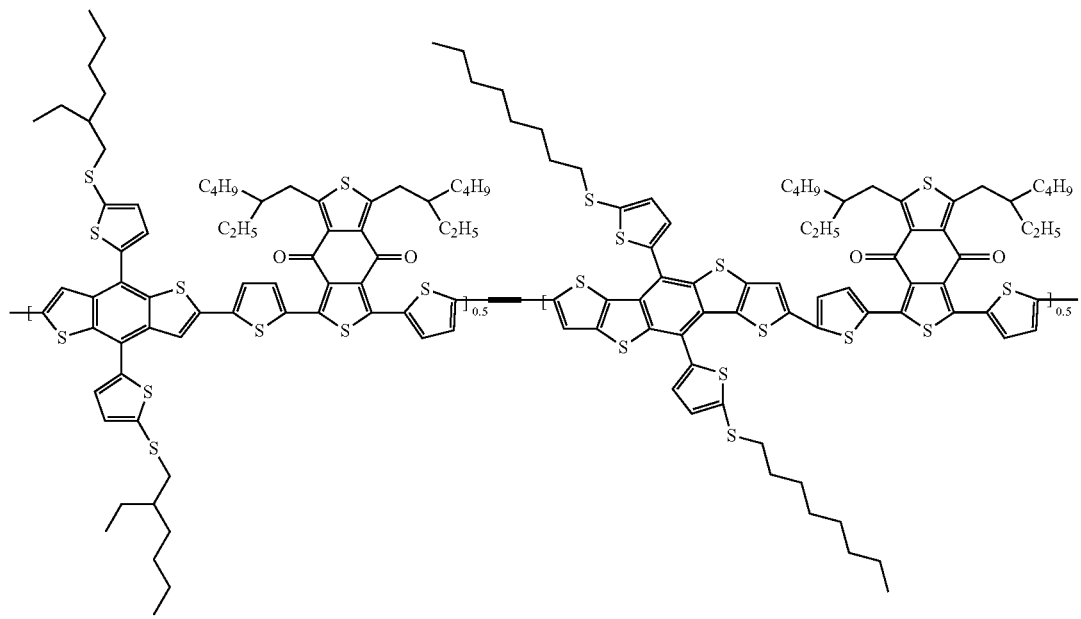

[Polymer 7]

Figure 14:
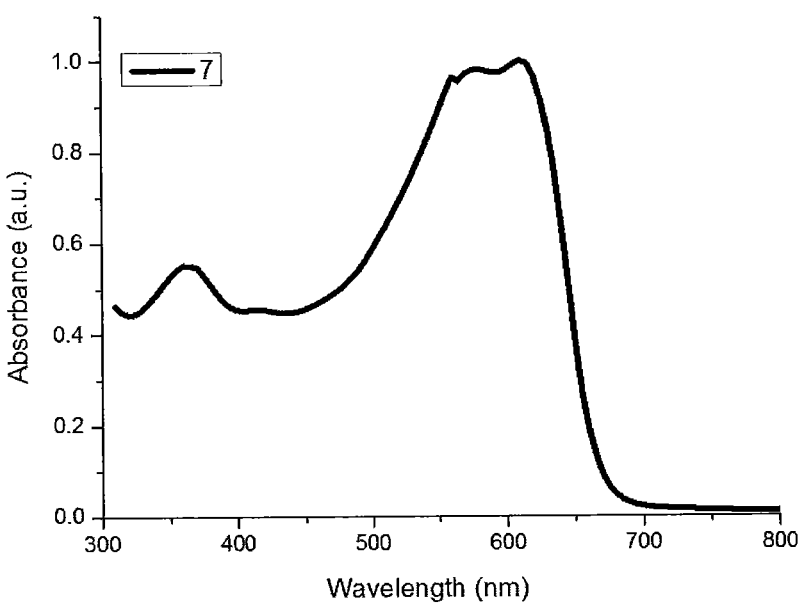
FIG. 14 is a diagram showing a UV-Vis absorption spectrum in a solution state of Polymer 7 synthesized in Preparation Example 7 of the present specification.
Figure 15:
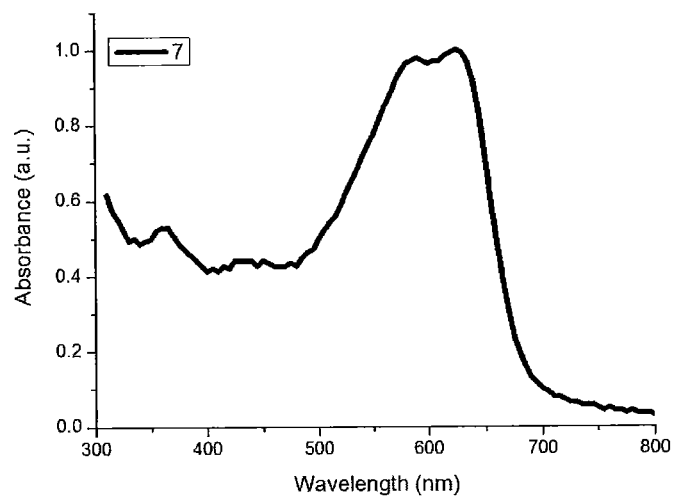
FIG. 15 is a diagram showing a UV-Vis absorption spectrum in a film state of Polymer 7 synthesized in Preparation Example 7 of the present specification.

FIG. 14 and FIG. 15 are diagrams showing UV-Vis absorption spectra in a solution state and a film state, respectively, of Polymer 7.

Preparation Example 8. Synthesis of Polymer 8

To a round flask equipped with a condenser, (4,8-bis(5-(2-ethylhexyl)-4-fluorothiophen-2-yl)benzo[1,2-b:4,5-b']dithiophene-2,6-diyl)bis(trimethylstannane) (122.64 mg, 0.5 eq.), 4,8-bis(5-(octyl)thiophen-2-yl)dithienobenzo[1,2-b:4,5-b']dithiophene-2,6-diyl)bis(trimethylstannane) (132.58 mg, 0.5 eq.), 1,3-bis(5-bromothiophen-2-yl)-5,7-bis(2-ethylhexyl)-4H,8H-benzo[1,2-c:4,5-c']dithiophene-4,8-dione (200 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 8) was purified through methanol, hexane and acetone.

[Polymer 8]

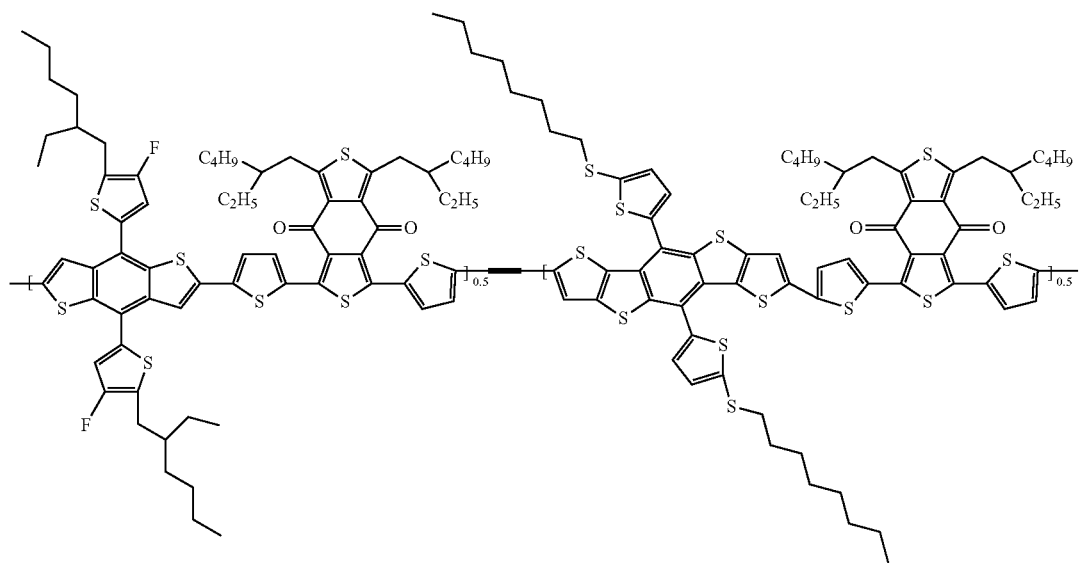

Figure 16:
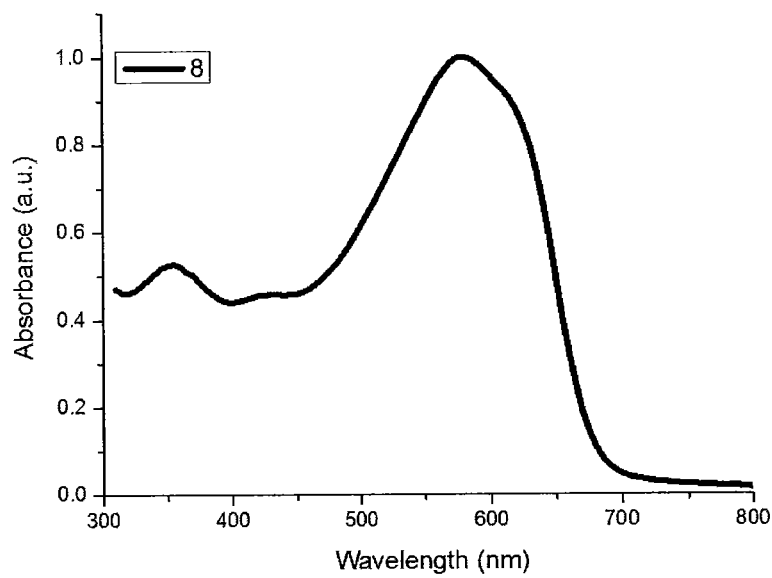
FIG. 16 is a diagram showing a UV-Vis absorption spectrum in a solution state of Polymer 8 synthesized in Preparation Example 8 of the present specification.
Figure 17:
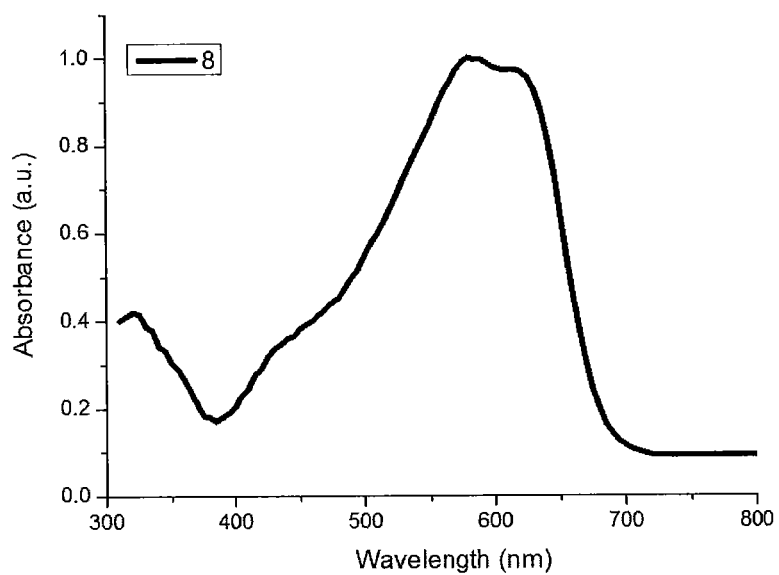
FIG. 17 is a diagram showing a UV-Vis absorption spectrum in a film state of Polymer 8 synthesized in Preparation Example 8 of the present specification.

FIG. 16 and FIG. 17 are diagrams showing UV-Vis absorption spectra in a solution state and a film state, respectively, of Polymer 8.

Preparation Example 9. Synthesis of Polymer 9

To a round flask equipped with a condenser, (4,8-bis(5-(2-ethylhexyl)-4-fluorothiophen-2-yl)benzo[1,2-b:4,5-b']dithiophene-2,6-diyl)bis(trimethylstannane) (122.64 mg, 0.5 eq.), 4,8-bis(5-((octyl)thio)thiophen-2-yl)dithienobenzo[1,2-b:4,5-b]dithiophene-2,6-diyl)bis(trimethylstannane) (140.94 mg, 0.5 eq.), 1,3-bis(5-bromothiophen-2-yl)-5,7-bis(2-ethylhexyl)-4H,8H-benzo[1,2-c:4,5-c]dithiophene-4,8-dione (200 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 9) was purified through methanol, hexane and acetone.

[Polymer 9]

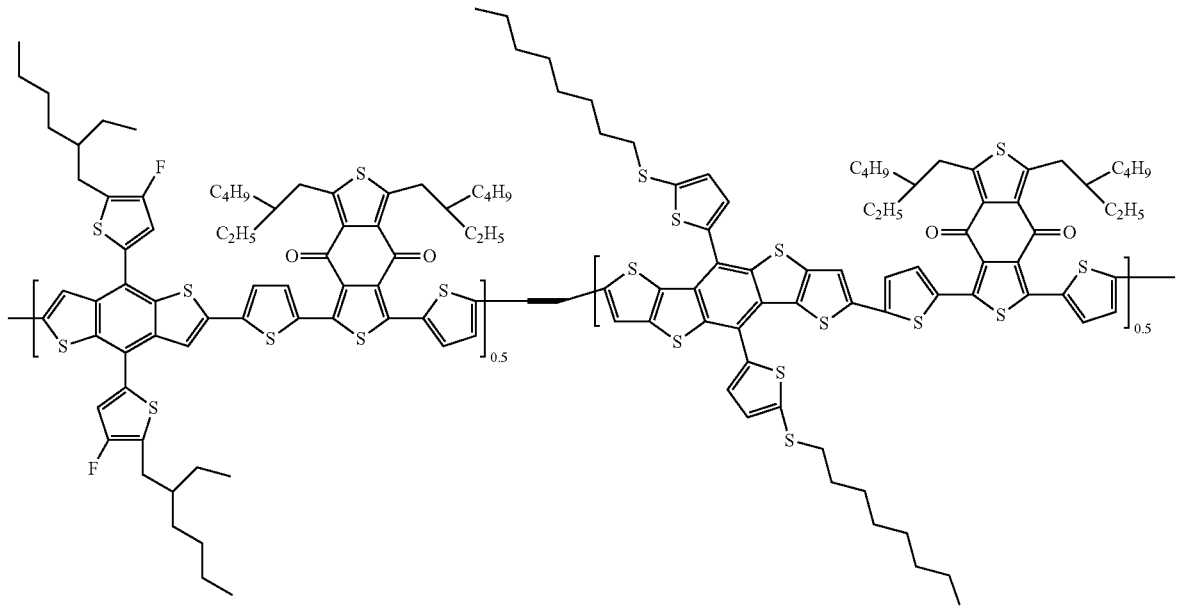

Figure 18:
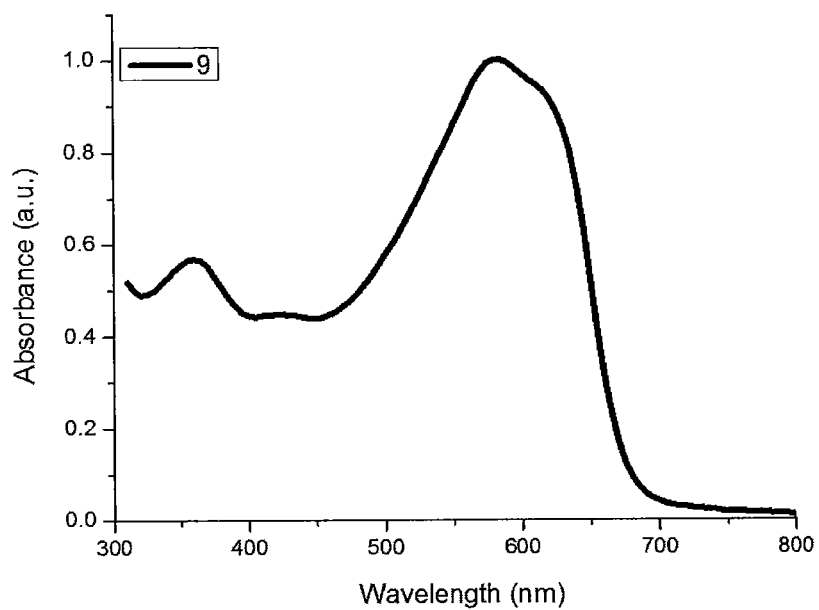
FIG. 18 is a diagram showing a UV-Vis absorption spectrum in a solution state of Polymer 9 synthesized in Preparation Example 9 of the present specification
Figure 19:
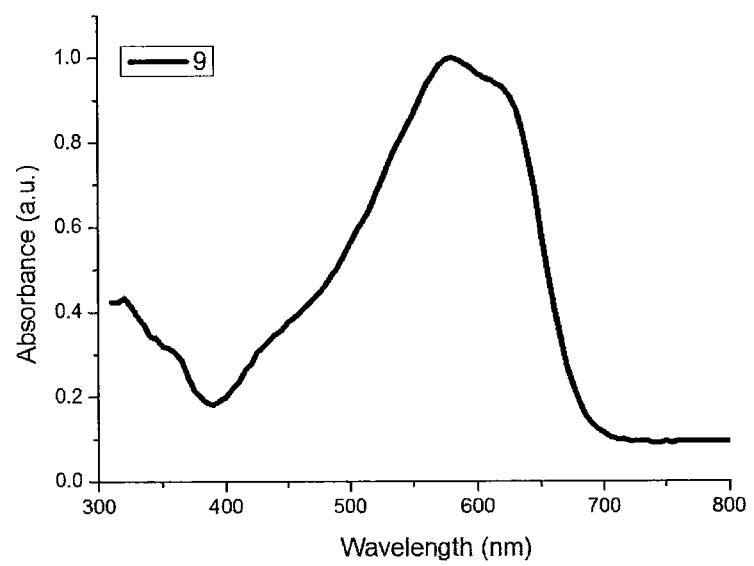
FIG. 19 is a diagram showing a UV-Vis absorption spectrum in a film state of Polymer 9 synthesized in Preparation Example 9 of the present specification.

FIG. 18 and FIG. 19 are diagrams showing UV-Vis absorption spectra in a solution state and a film state, respectively, of Polymer 9.

Preparation Example 10. Synthesis of Polymer 10

To a round flask equipped with a condenser, (4,8-bis(5-(2-ethylhexyl)thiophen-2-yl)benzo[1,2-b:4,5-b']dithiophene-2,6-diyl)bis(trimethylstannane) (321 mg, 1.0 eq.), 1,3-bis(5-bromothiophen-2-yl)-5,7-bis(2-ethylhexyl)-4H,8H-benzo[1,2-c:4,5-c']dithiophene-4,8-dione (272.08 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 10) was purified through methanol, hexane and acetone.

Preparation Example 11. Synthesis of Polymer 11

To a round flask equipped with a condenser, (4,8-bis(5-((2-ethylhexyl)thio)thiophen-2-yl)benzo[1,2-b:4,5-b]dithiophene-2,6-diyl)bis(trimethylstannane) (133 mg, 1.0 eq.), 1,3-bis(5-bromothiophen-2-yl)-5,7-bis(2-ethylhexyl)-4H,8H-benzo[1,2-c:4,5-c']dithiophene-4,8-dione (105.2 mg, 1.0 eq.) and Pd(PPh$_3$)$_4$ (0.01 g, 0.03 eq.) were injected, and then toluene (16 mL) and DMF (1 mL) were injected thereto. After that, the result was refluxed for 17 hours at 100° C., and after terminating the reaction through methanol, the synthesized polymer (following Polymer 11) was purified through methanol, hexane and acetone.

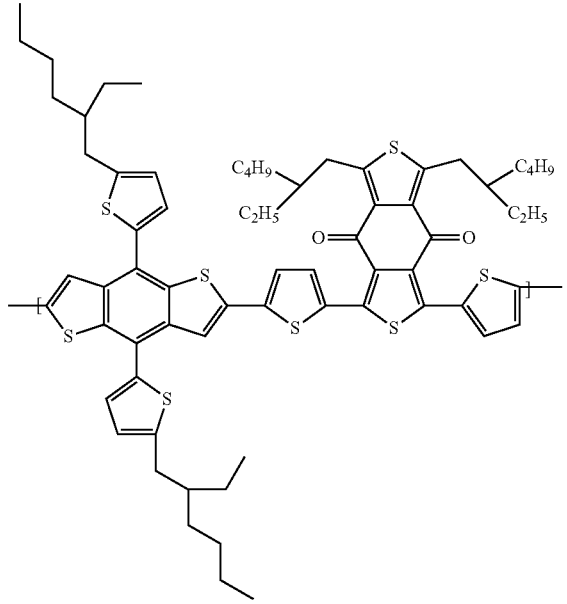

[Polymer 10]

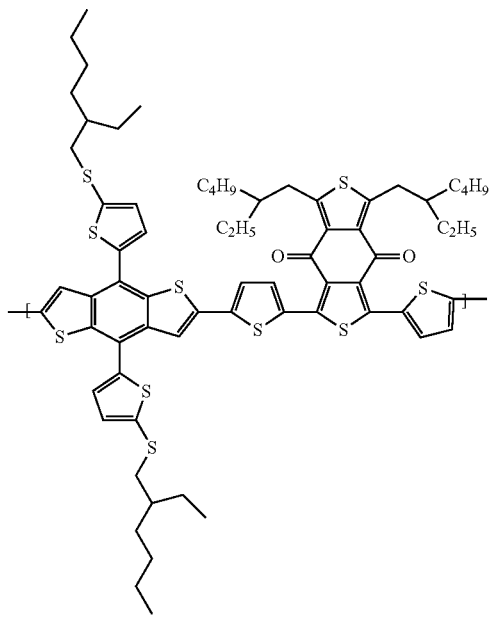

[Polymer 11]

Polymers 1 to 9 were formed through random copolymerization, and Polymers 10 and 11 were formed through cross copolymerization.

TABLE 1

| | | Solution | Film | | Optical |
| | Mn/Mw/D (g/mol) | $\lambda_{max}$ (nm) | $\lambda_{max}$ (nm) | $\lambda_{edge}$ (nm) | $E_g^{opt}$ (eV) |
|---|---|---|---|---|---|
| Polymer 1 | 65432/72582/1.10 | 620 | 625 | ~694 | 1.78 |
| Polymer 2 | 50401/63262/1.25 | 576 | 609 | | |
| Polymer 3 | 57107/67802/1.18 | 581 | 579 | | |
| Polymer 4 | 62242/70939/1.13 | 586 | 623 | | |
| Polymer 5 | 51200/62100/1.21 | 586 | 619 | | |
| Polymer 6 | 60509/68836/1.13 | 581 | 586 | | |
| Polymer 7 | 53798/64269/1.19 | 610 | 624 | | |
| Polymer 8 | 56991/67502/1.18 | 579 | 581 | | |
| Polymer 9 | 43645/56718/1.29 | 584 | 581 | | |
| Polymer 10 | 21600/54100/2.51 | 565 | 625 | | |
| Polymer 11 | 18000/43200/2.38 | 621 | 630 | | |

In Table 1, Mn means a number average molecular weight, Mw means a weight average molecular weight, and D means molecular weight distribution. In addition, Solution $\lambda_{max}$ means a maximum absorption wavelength of the polymer in a solution state, Film $\lambda_{max}$ means a maximum absorption wavelength of the polymer in a film state, Film $\lambda_{edge}$ means an absorption edge in a film state, and Optical $E_g^{opt}$ means a HOMO and LUMO energy band gap of the polymer in a film state.

Example: Manufacture of Organic Solar Cell

Example 1

(1) Preparation of Composite Solution

Polymer 1 and the following Chemical Formula A-1 annealed at 140° C. were dissolved in chlorobenzene (CB) in 1:1 to prepare a composite solution. Herein, the concentration was adjusted to 2 wt %, and 0.5 vol % of 1,8-diiodooctane (IMO) was added to the composite solution.

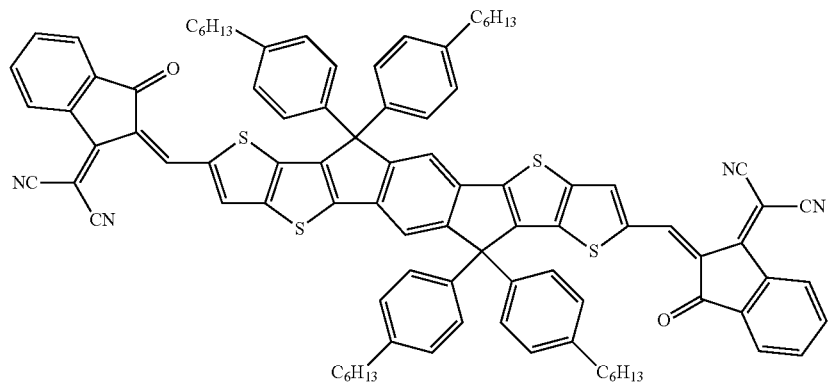

[Chemical Formula A-1]

(2) Manufacture of Organic Solar Cell

A glass substrate (11.5Ω/□) coated with ITO in a bar-type of 1.5 cm×1.5 cm was ultrasonic cleaned using distilled water, acetone and 2-propanol, and the ITO surface was ozone treated for 10 minutes to form a first electrode.

On the first electrode, a ZnO nanoparticle solution (N-10, Nanograde Ltd, 2.5 wt % in 1-butanol, filtered through 0.45 μm PTFE) was spin-coated for 40 seconds at 4,000 rpm, and by removing a residual solvent through heat treating the result for 10 minutes at 80° C., an electron transfer layer was formed.

After that, on the electron transfer layer, the composite solution prepared in (1) was spin-coated for 25 seconds at 1,700 rpm at 70° C. to form a photoactive layer having a thickness of 80 nm to 100 nm, and on the photoactive layer, $MoO_3$ was thermal deposited to a thickness of 10 nm at a 0.2 Å/s rate and under $10^{-7}$ torr vacuum to form a hole transfer layer.

After that, inside a thermal depositor, Ag was deposited to a thickness of 100 nm at a 1 Å/s rate to form a second electrode, and as a result, an inverted-structured organic solar cell was manufactured.

Example 2

An organic solar cell was manufactured in the same manner as in Example 1 except that Polymer 2 was used instead of Polymer 1.

Example 3

An organic solar cell was manufactured in the same manner as in Example 1 except that Polymer 3 was used instead of Polymer 1.

Example 4

An organic solar cell was manufactured in the same manner as in Example 1 except that Polymer 4 was used instead of Polymer 1.

Example 5

An organic solar cell was manufactured in the same manner as in Example 1 except that Polymer 5 was used instead of Polymer 1.

Example 6

An organic solar cell was manufactured in the same manner as in Example 1 except that Polymer 6 was used instead of Polymer 1.

Example 7

An organic solar cell was manufactured in the same manner as in Example 1 except that Polymer 7 was used instead of Polymer 1.

Example 8

An organic solar cell was manufactured in the same manner as in Example 1 except that Polymer 8 was used instead of Polymer 1.

Example 9

An organic solar cell was manufactured in the same manner as in Example 1 except that Polymer 9 was used instead of Polymer 1.

Comparative Example 1

An organic solar cell was manufactured in the same manner as in Example 1 except that Polymer 10 was used instead of Polymer 1.

Comparative Example 2

An organic solar cell was manufactured in the same manner as in Example 1 except that Polymer 11 was used instead of Polymer 1.

Photoelectric conversion properties of the organic solar cells manufactured in Examples 1 to 9 and Comparative Examples 1 and 2 were measured under a 100 mW/cm² (AM 1.5) condition, and the results are shown in the following Table 2.

TABLE 2

| | Spin-speed (rpm) | $V_{oc}$ (V) | $J_{sc}$ (mA/cm²) | FF | η (%) | Average η (%) |
|---|---|---|---|---|---|---|
| Example 1 | 1700 | 0.918 | 14.563 | 0.588 | 7.86 | 8.06 |
| | | 0.918 | 14.788 | 0.609 | 8.26 | |
| Example 2 | 1700 | 0.927 | 14.890 | 0.622 | 8.58 | 8.45 |
| | | 0.926 | 14.796 | 0.607 | 8.32 | |
| Example 3 | 1700 | 0.915 | 15.350 | 0.592 | 8.32 | 8.60 |
| | | 0.913 | 15.755 | 0.617 | 8.89 | |
| Example 4 | 1700 | 0.908 | 14.865 | 0.646 | 8.72 | 8.75 |
| | | 0.905 | 15.235 | 0.637 | 8.78 | |
| Example 5 | 1700 | 0.902 | 15.232 | 0.654 | 8.98 | 9.14 |
| | | 0.899 | 16.018 | 0.646 | 9.30 | |
| Example 6 | 1700 | 0.909 | 15.467 | 0.652 | 9.17 | 9.19 |
| | | 0.907 | 15.833 | 0.641 | 9.21 | |
| Example 7 | 1700 | 0.913 | 15.195 | 0.655 | 9.09 | 8.68 |
| | | 0.888 | 15.298 | 0.609 | 8.27 | |
| Example 8 | 1700 | 0.899 | 14.907 | 0.612 | 8.20 | 8.20 |
| | | 0.896 | 14.903 | 0.613 | 8.19 | |
| Example 9 | 1700 | 0.908 | 14.670 | 0.659 | 8.78 | 9.00 |
| | | 0.901 | 15.534 | 0.659 | 9.22 | |
| Comparative Example 1 | 1700 | 0.905 | 14.476 | 0.570 | 7.47 | 7.43 |
| | | 0.895 | 10.352 | 0.79 | 7.21 | |
| Comparative Example 2 | 1700 | 0.916 | 13.943 | 0.616 | 7.87 | 7.87 |
| | | 0.915 | 14.000 | 0.613 | 7.89 | |

In Table 2, the spin-speed means a rotational speed of the device when forming the photoactive layer through spin-coating the composite solution on the electron transfer layer, $V_{oc}$ means an open circuit voltage, $J_{sc}$ means a short-circuit current, FF means a fill factor, and η means energy conversion efficiency. The open circuit voltage and the short-circuit current are each an x-axis and a y-axis intercept in the four quadrants of a voltage-current density curve, and as these two values increase, solar cell efficiency is preferably enhanced. In addition, the fill factor is a value dividing the rectangle area that may be drawn inside the curve by the product of the short-circuit current and the open circuit voltage. The energy conversion efficiency (η) may be obtained by dividing the product of the open circuit voltage ($V_{oc}$), the short-circuit current ($J_{sc}$) and the fill factor (FF) by intensity of the incident light ($P_{in}$), and it is preferred as this value is higher.

$$\eta = \frac{V_{oc} J_{sc} FF}{P_{in}}$$

Based on the results of Table 2, it was seen that the organic solar cells of Examples 1 to 9 using Polymers 1 to 9 according to one embodiment of the present specification as an electron donor had a higher open circuit voltage, had excellent device efficiency such as a fill factor, and had excellent energy conversion efficiency compared to the organic solar cells of Comparative Examples 1 and 2 using Polymers 10 and 11 as an electron donor.

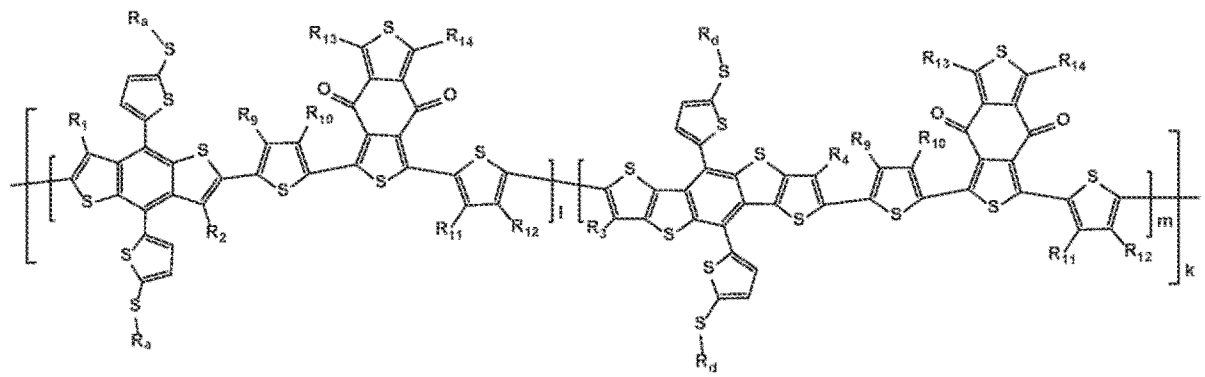

What is claimed is:

1. A polymer comprising:
   a first unit of Chemical Formula 1;
   a second unit of Chemical Formula 2; and
   a third unit of Chemical Formula 3 or 4:

[Chemical Formula 1]

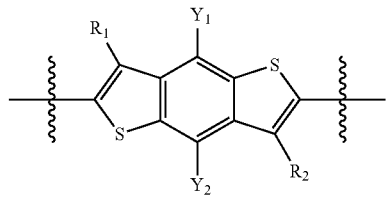

[Chemical Formula 2]

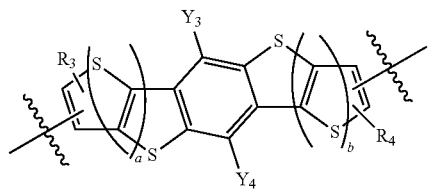

[Chemical Formula 3]

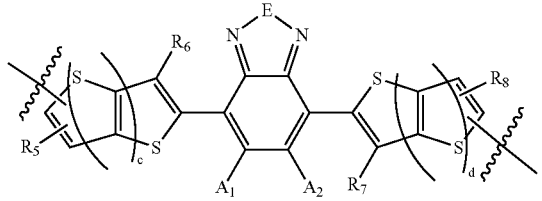

[Chemical Formula 4]

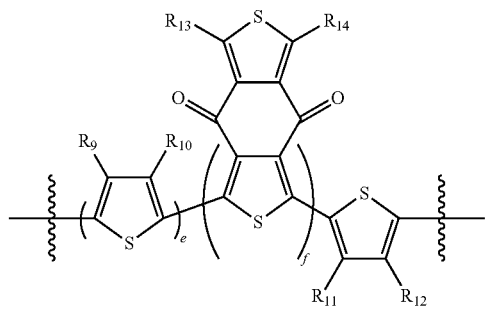

wherein;
$R_1$ to $R_{14}$ are the same as or different from each other, and are each hydrogen, a substituted or unsubstituted alkyl group, a carboxyl group, or an ester group (—COOR');

E is S or NR";

R' and R" are the same as or different from each other, and are each a substituted or unsubstituted alkyl group;

$A_1$ and $A_2$ are the same as or different from each other, and are each hydrogen, a halogen group, a substituted or unsubstituted alkyl group, or a substituted or unsubstituted alkoxy group;

a to f are each 0 or 1; and
Y$_1$ to Y$_4$ are the same as or different from each other, and are each a compound of Chemical Formula 5,

[Chemical Formula 5]

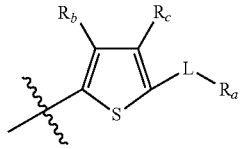

wherein:
L is a direct bond, S or O;
R$_a$ is a substituted or unsubstituted alkyl group;
R$_b$ and R$_c$ are the same as or different from each other, and are each hydrogen, a halogen group, or a substituted or unsubstituted alkyl group;
Chemical Formula 1 and Chemical Formula 2 have structures different from each other; and

is a site linked to other units or substituents.

2. The polymer of claim 1, wherein Chemical Formula 2 is a compound of Chemical Formula 2-1 or 2-2:

[Chemical Formula 2-1]

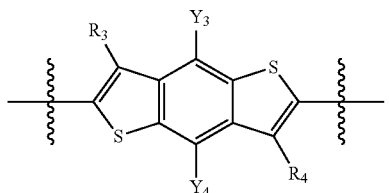

[Chemical Formula 2-2]

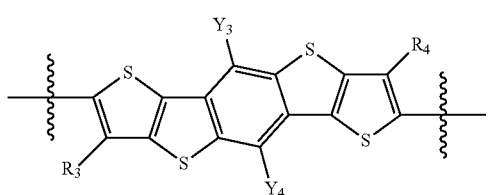

wherein Y$_3$, Y$_4$, R$_3$ and R$_4$ have the same definitions as in Chemical Formula 2.

3. The polymer of claim 1, wherein Chemical Formula 3 is a compound of any one of Chemical Formulae 3-1 to 3-3:

[Chemical Formula 3-1]

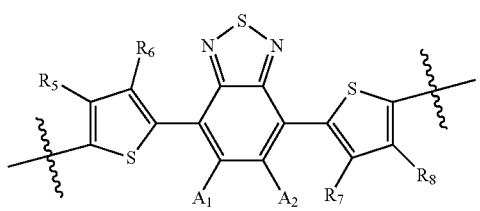

[Chemical Formula 3-2]

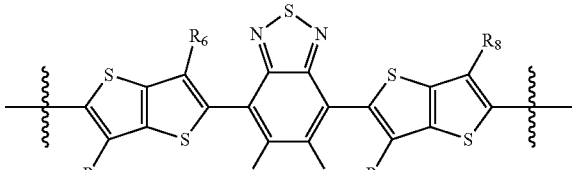

[Chemical Formula 3-3]

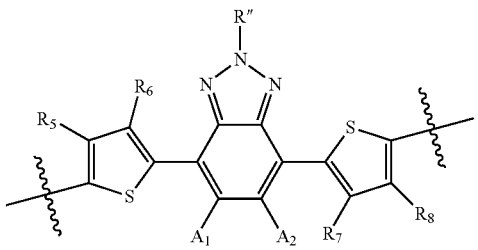

wherein R$_5$ to R$_8$, R'', A$_1$ and A$_2$ have the same definitions as in Chemical Formula 3.

4. The polymer of claim 1, wherein Chemical Formula 4 is a compound of Chemical Formula 4-1 or 4-2:

[Chemical Formula 4-1]

[Chemical Formula 4-2]

wherein R$_9$ to R$_{14}$ and R' have the same definitions as in Chemical Formula 4.

5. The polymer of claim 1, wherein Chemical Formula 5 is a compound of any one of Chemical Formulae 5-1 to 5-3:

[Chemical Formula 5-1]

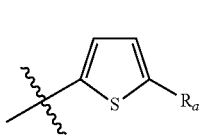

-continued

[Chemical Formula 5-2]

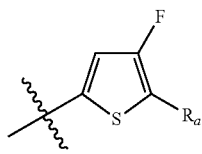

[Chemical Formula 5-3]

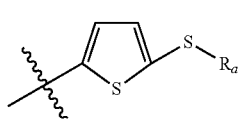

wherein $R_a$ has the same definition as in Chemical Formula 5.

6. The polymer of claim 1, wherein the polymer comprises a unit of Chemical Formula 6 or 7:

[Chemical Formula 6]

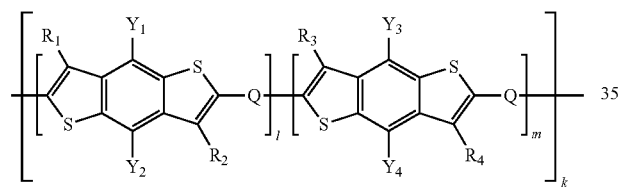

[Chemical Formula 7]

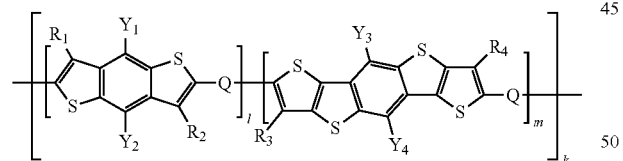

wherein:

$Y_1$ to $Y_4$ and $R_1$ to $R_4$ have the same definitions as in Chemical Formulae 1 and 2;

Qs are the same as or different from each other, and are each a unit represented by Chemical Formula 3 or 4;

l and m represent a mole fraction;

$0<l<1$;

$0<m<1$;

$0<l+m\leq1$; and k is, as a unit repetition number, an integer of 1 to 10,000.

7. The polymer of claim 6, wherein Chemical Formula 6 is a compound of any one of Chemical Formulae 6-1 to 6-6:

[Chemical Formula 6-1]

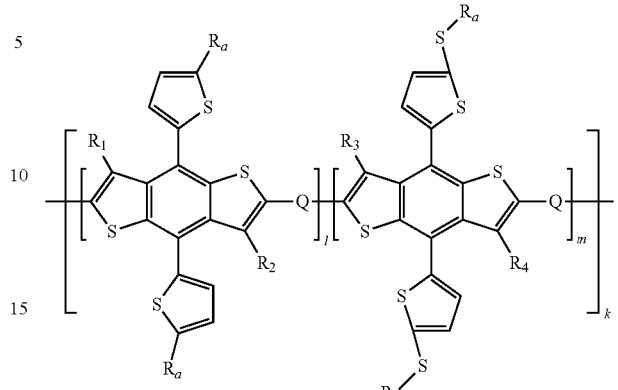

[Chemical Formula 6-2]

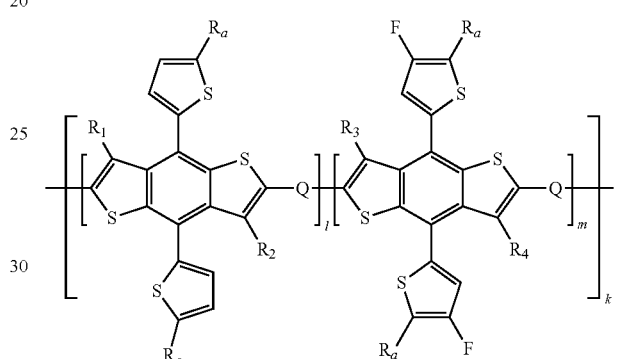

[Chemical Formula 6-3]

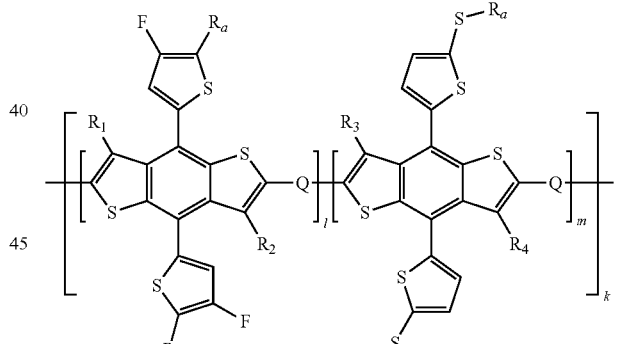

[Chemical Formula 6-4]

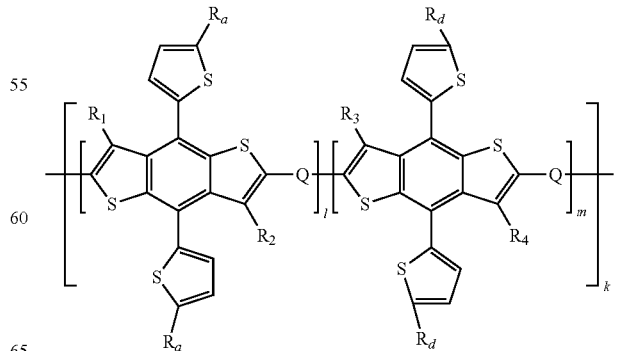

[Chemical Formula 6-5]
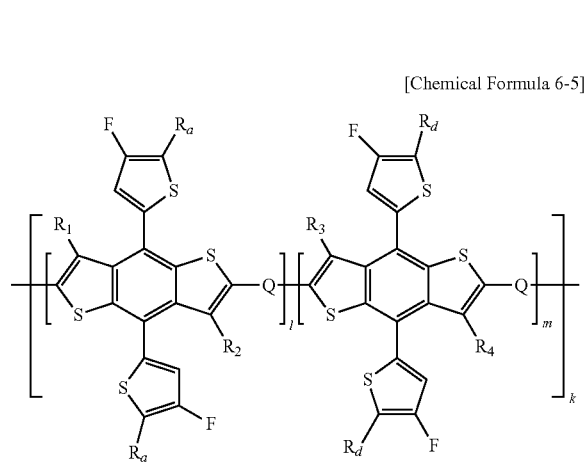
[Chemical Formula 6-6]
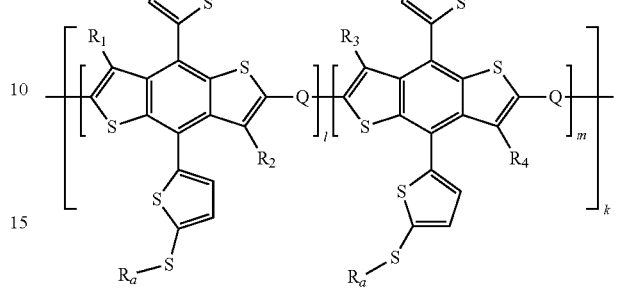
wherein:
R$_1$ to R$_4$, R$_a$, l, m, k and Q have the same definitions as in Chemical Formulae 5 and 6; and
R$_d$ is a substituted or unsubstituted alkyl group, and is different from R$_a$.
8. The polymer of claim 6, wherein Chemical Formula 7 is a compound of any one of Chemical Formulae 7-1 to 7-10:
[Chemical Formula 7-1]
[Chemical Formula 7-2]
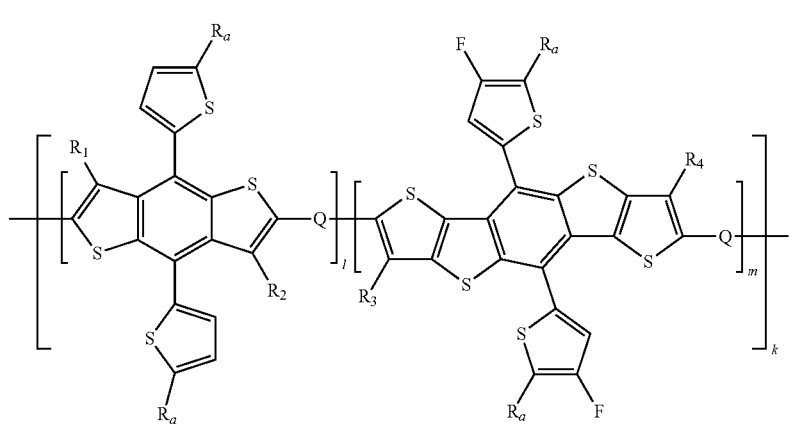

-continued
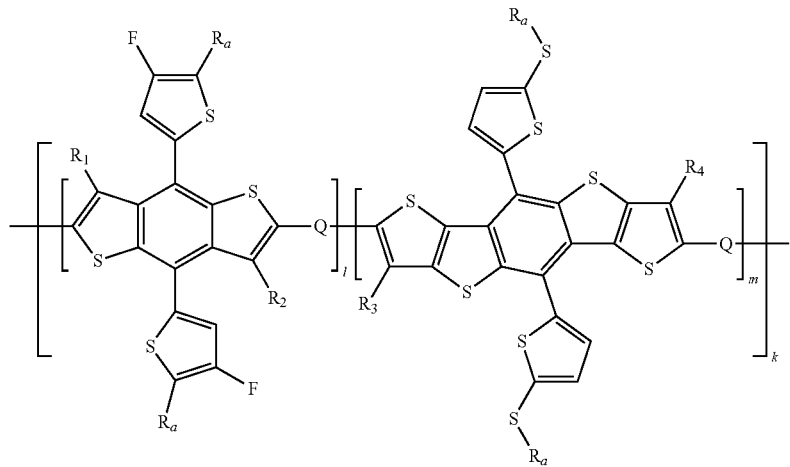
[Chemical Formula 7-3]
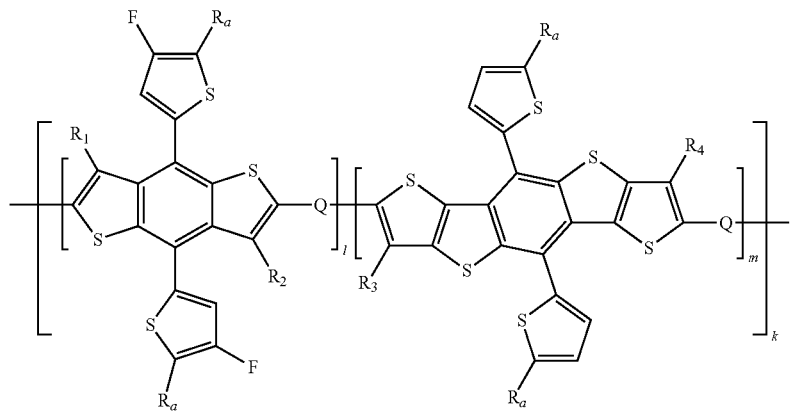
[Chemical Formula 7-4]
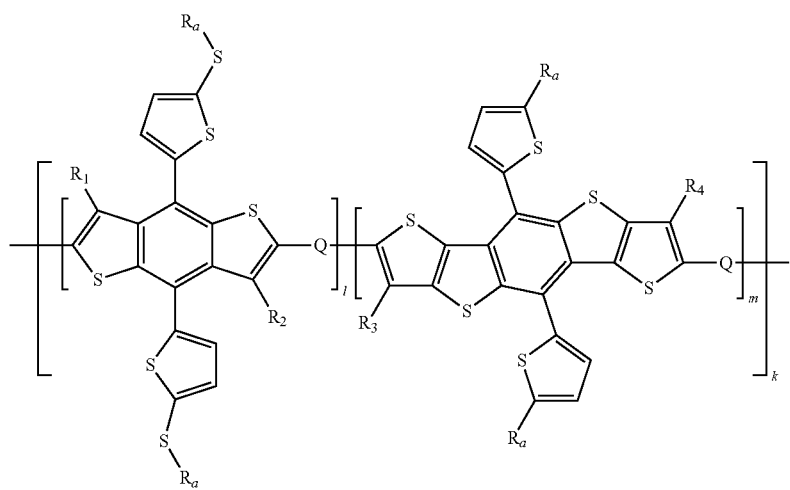
[Chemical Formula 7-5]

[Chemical Formula 7-6]
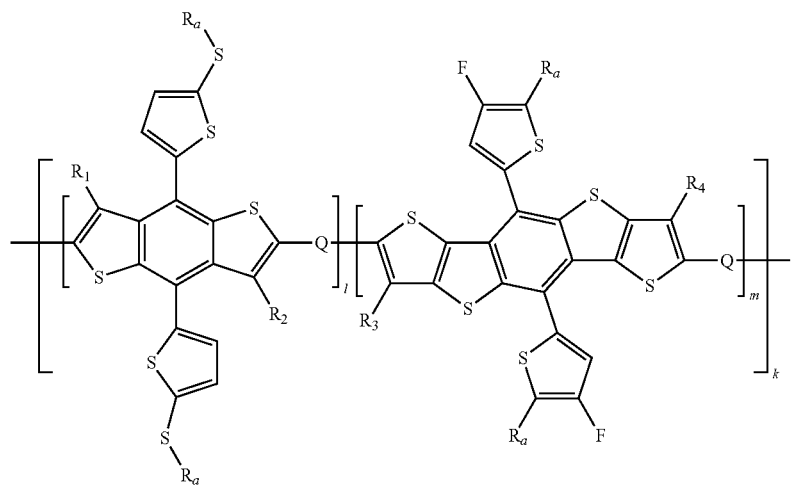
[Chemical Formula 7-7]
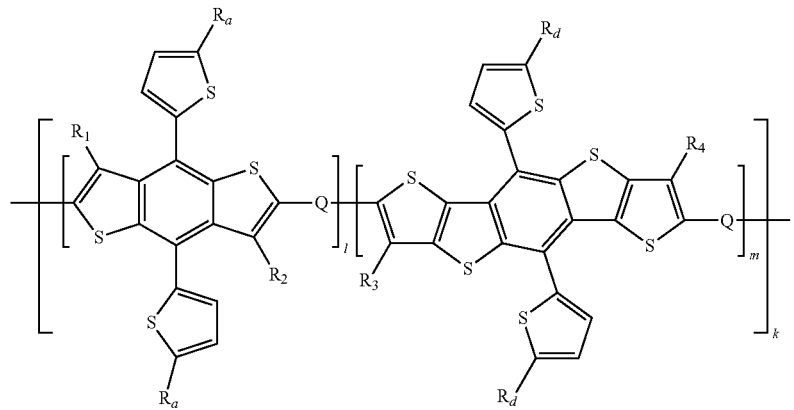
[Chemical Formula 7-8]
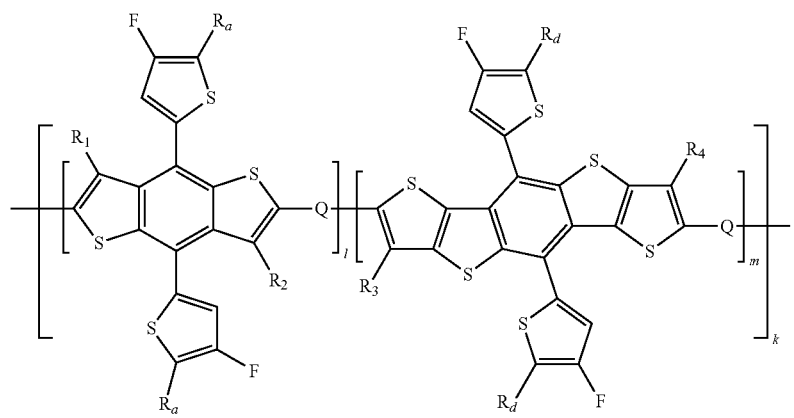

[Chemical Formula 7-9]
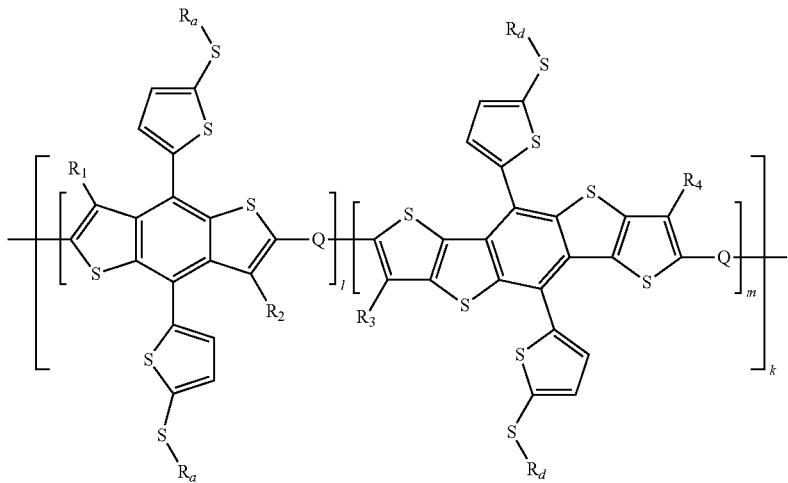
[Chemical Formula 7-10]
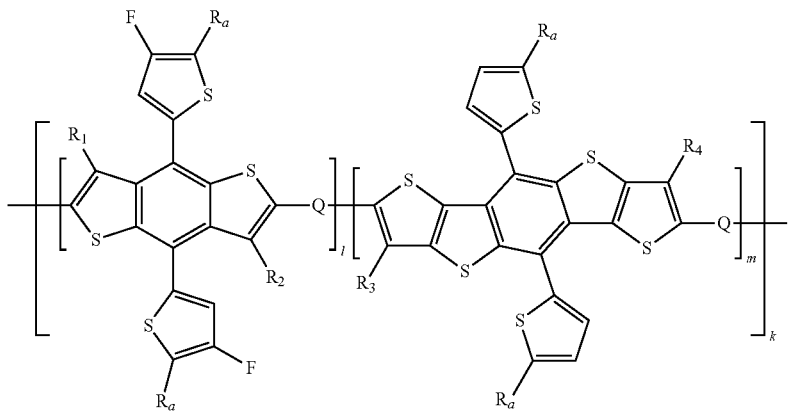
wherein:
R₁ to R₄, R_a, l, m, k and Q have the same definitions as in Chemical Formulae 5 and 7; and
R_d is a substituted or unsubstituted alkyl group, and is different from R_a.
9. The polymer of claim 6, wherein the polymer comprises a unit of any one of Chemical Formulae 8 to 19:
[Chemical Formula 8]
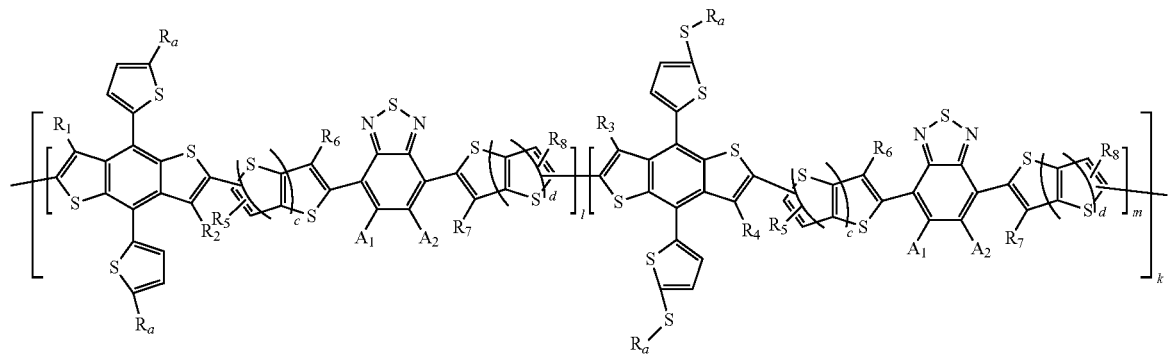

[Chemical Formula 9]
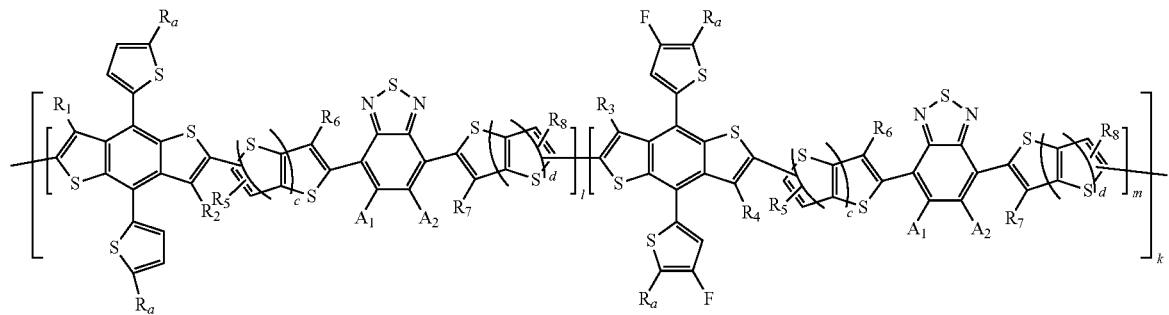
[Chemical Formula 10]
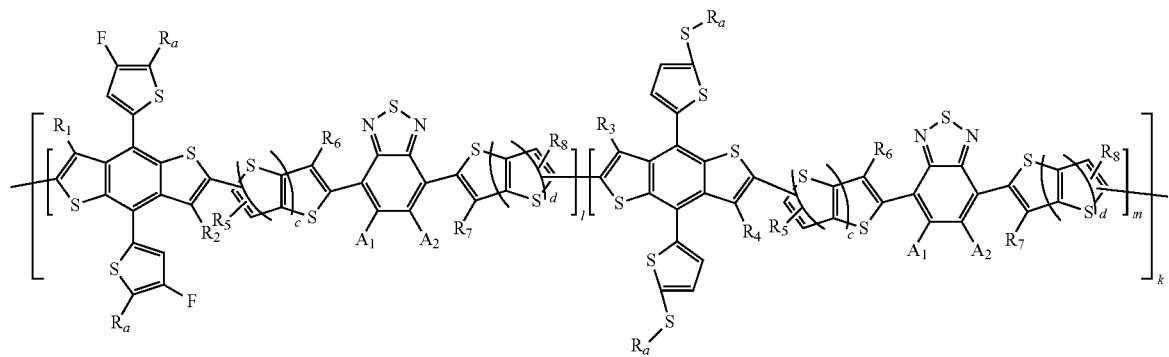
[Chemical Formula 11]
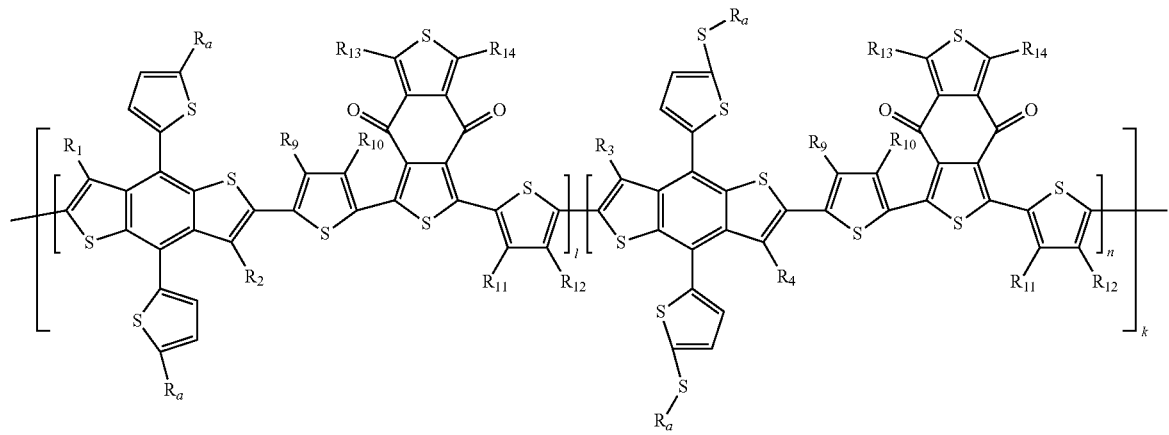
[Chemical Formula 12]
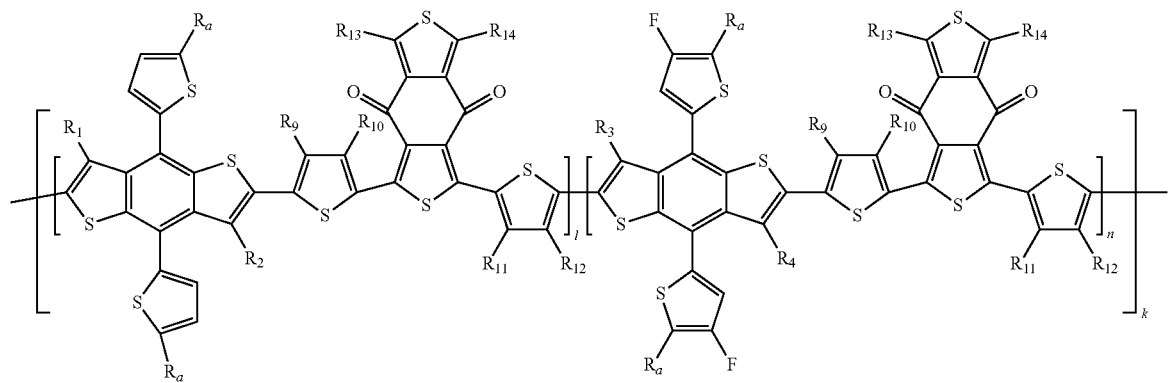

[Chemical Formula 13]
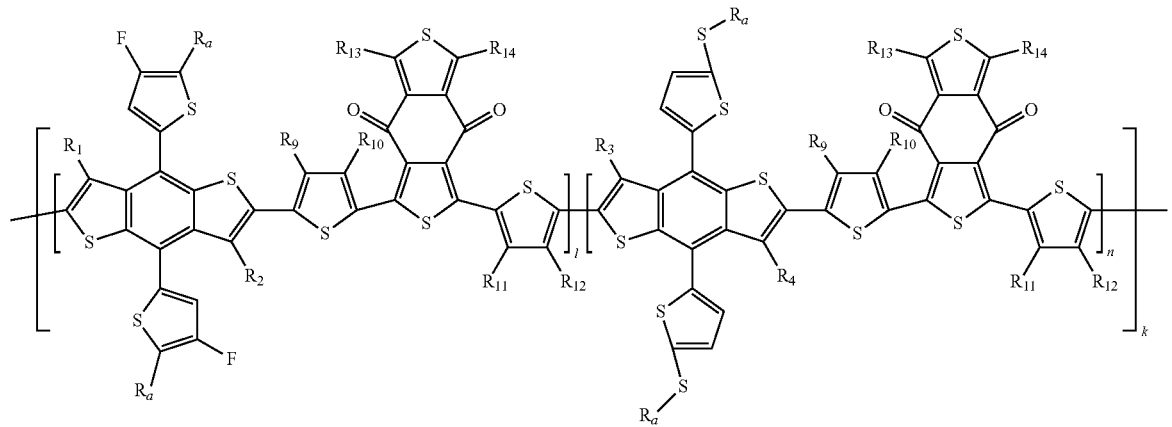
[Chemical Formula 14]
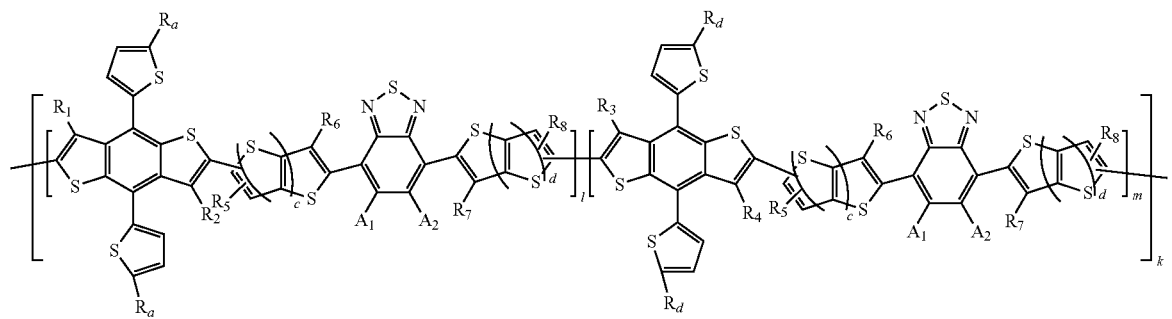
[Chemical Formula 15]
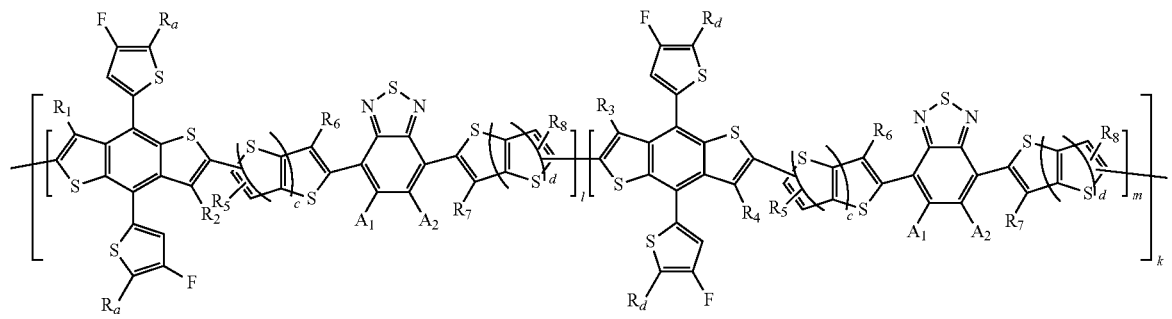
[Chemical Formula 16]
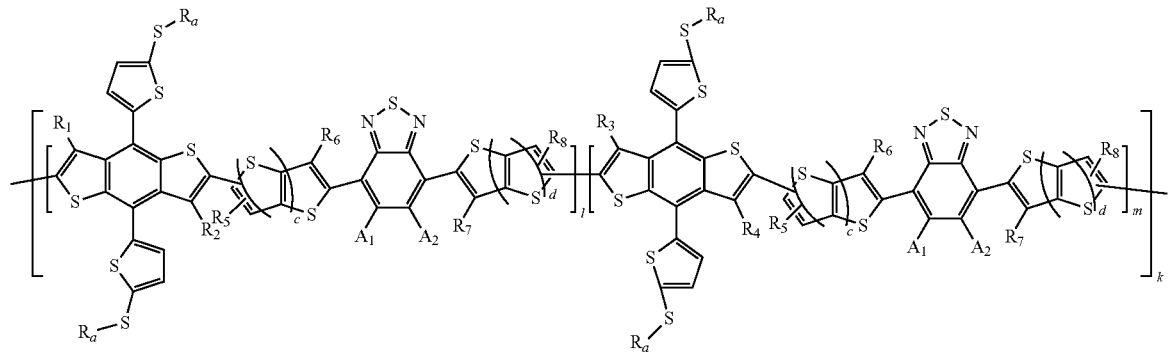

[Chemical Formula 17]
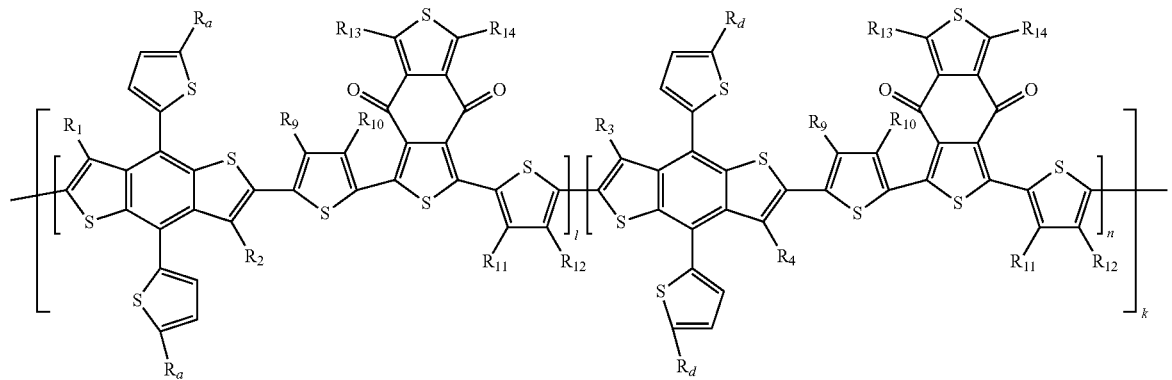
[Chemical Formula 18]
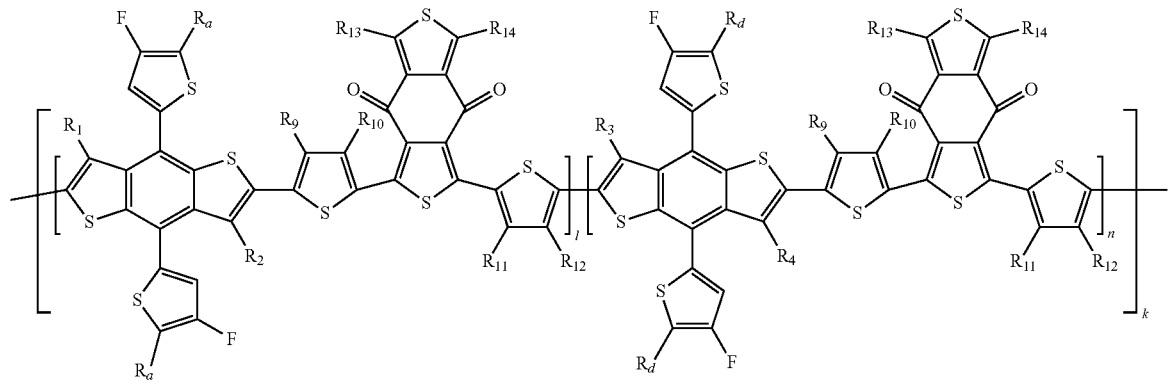
[Chemical Formula 19]
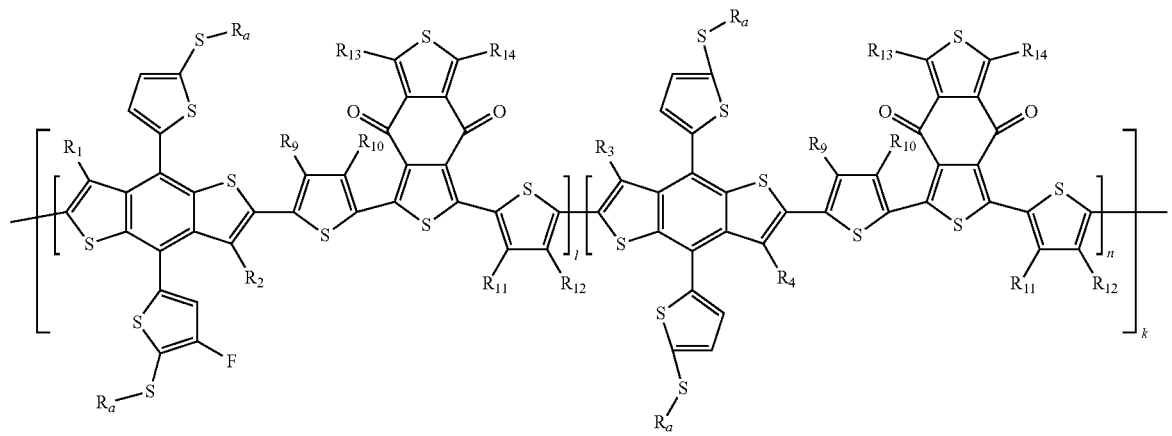
wherein:
$R_1$ to $R_{14}$, $R_a$, $A_1$, $A_2$, c, d, l, m and k have the same definitions as in Chemical Formulae 1 to 6; and
$R_d$ is a substituted or unsubstituted alkyl group, and is different from $R_a$.
10. The polymer of claim 6, wherein the polymer comprises a unit of any one of Chemical Formulae 20 to 37:

[Chemical Formula 20]
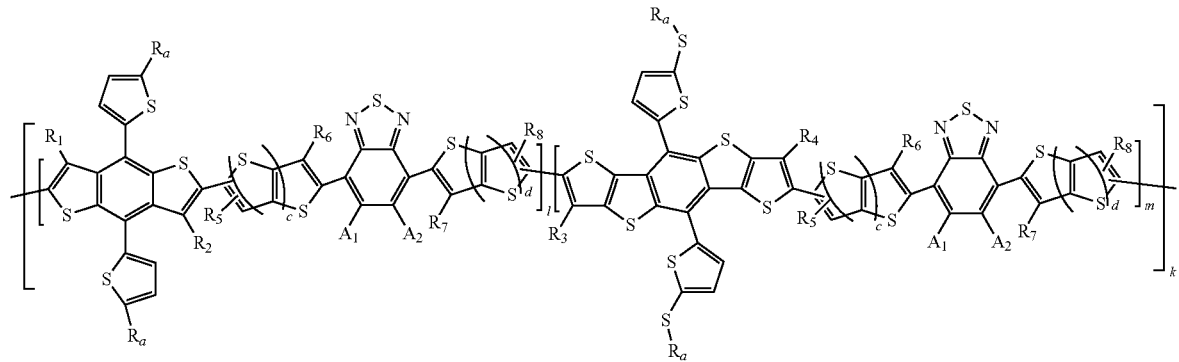
[Chemical Formula 21]
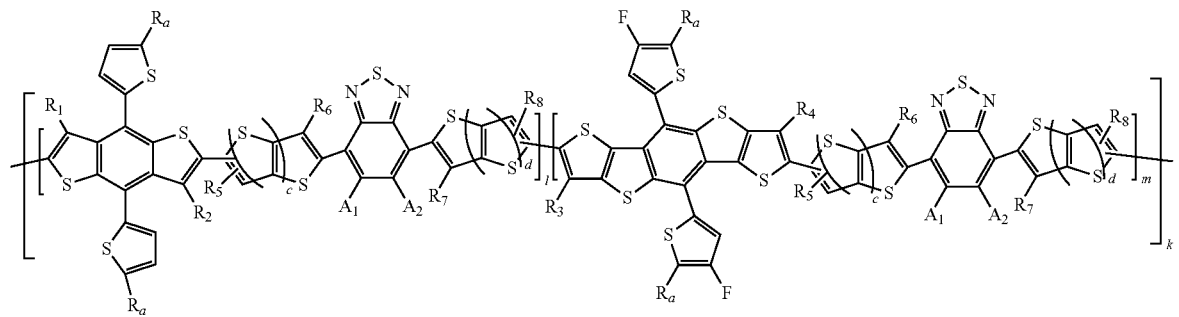
[Chemical Formula 22]
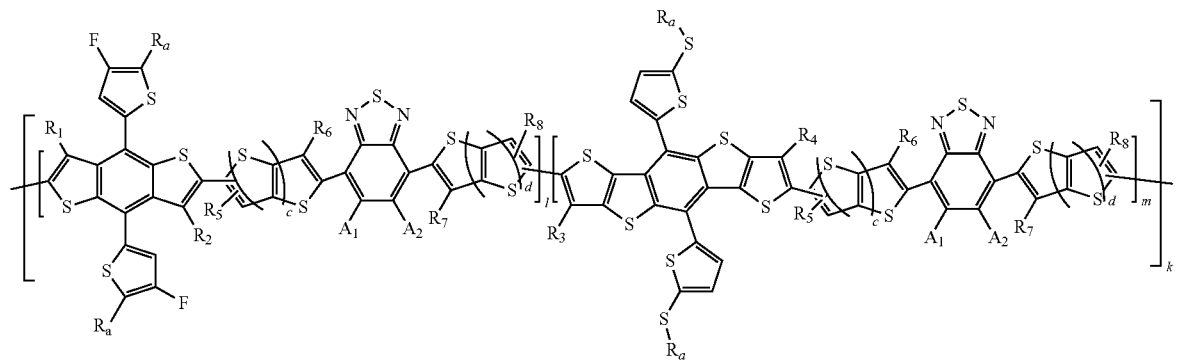
[Chemical Formula 23]
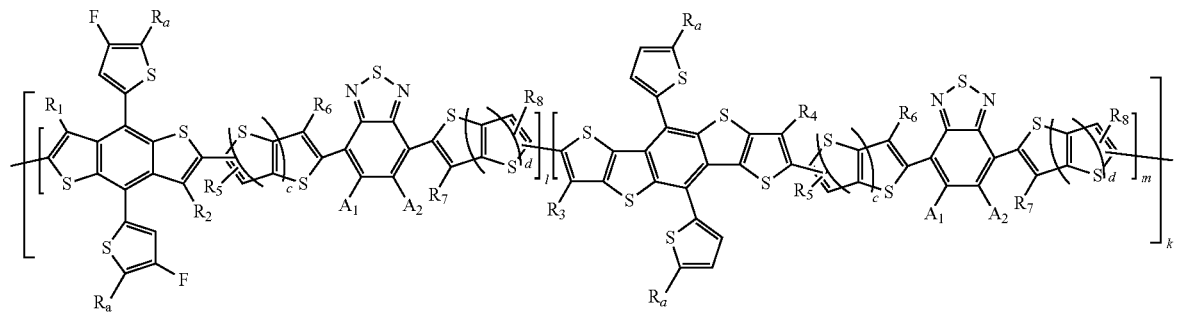

[Chemical Formula 24]
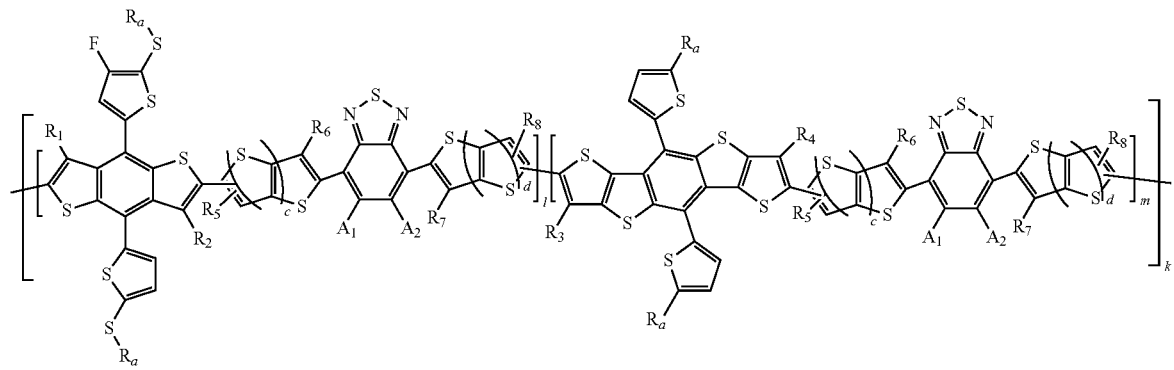
[Chemical Formula 25]
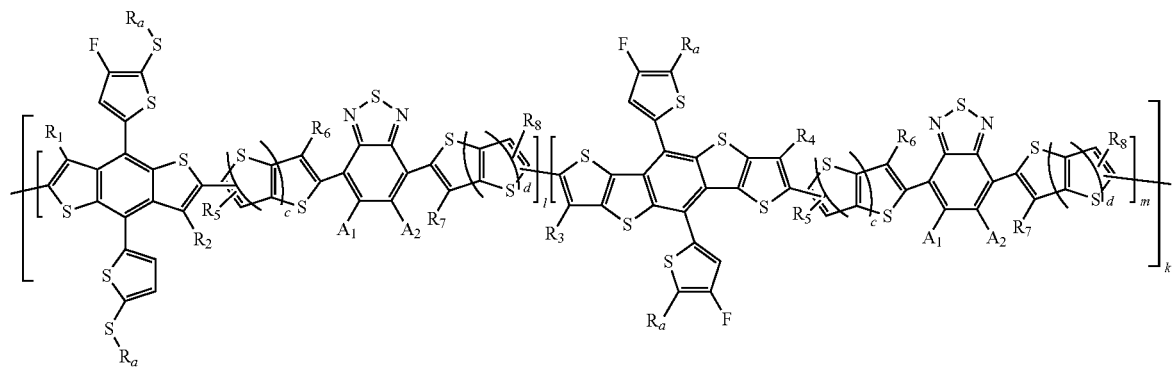
[Chemical Formula 26]
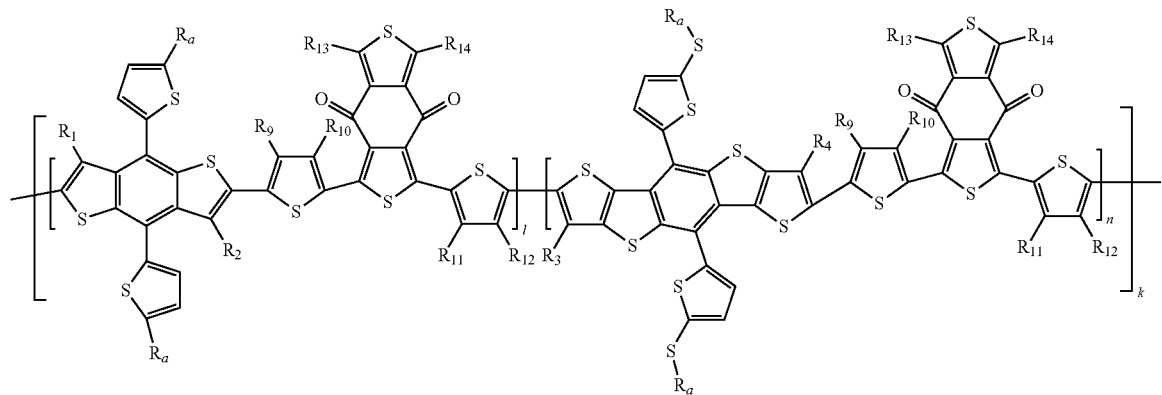
[Chemical Formula 27]
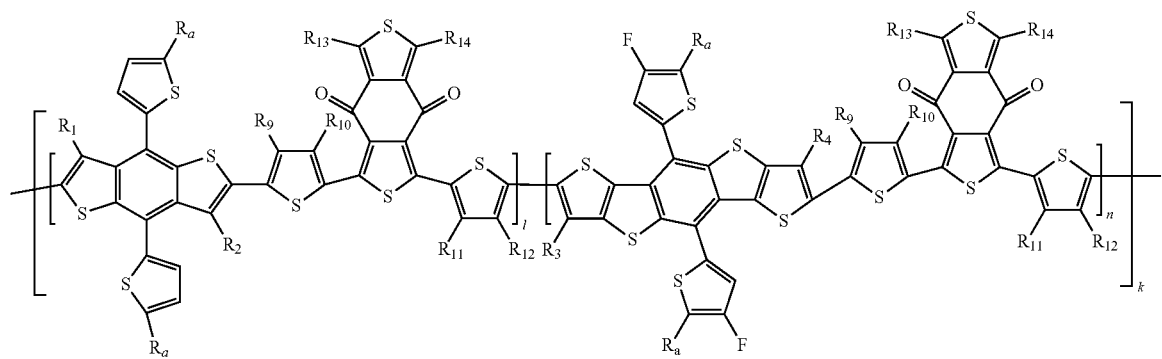

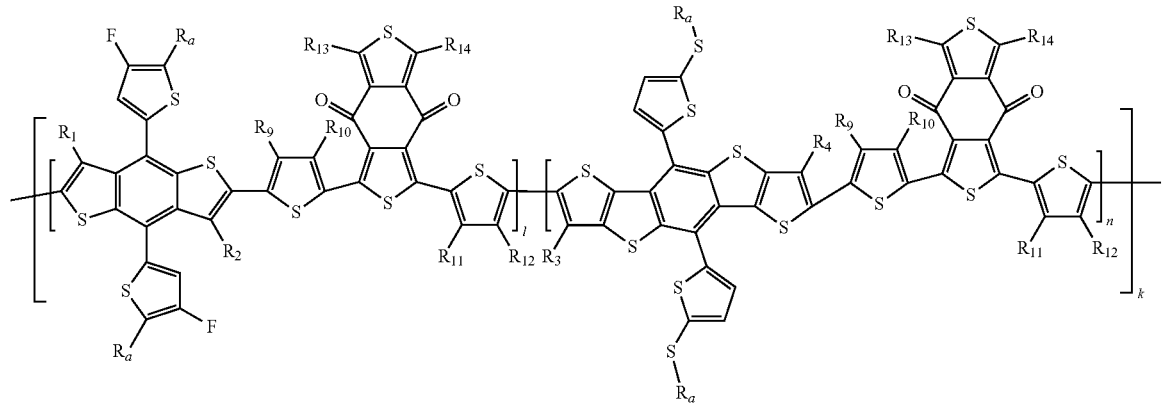
[Chemical Formula 28]
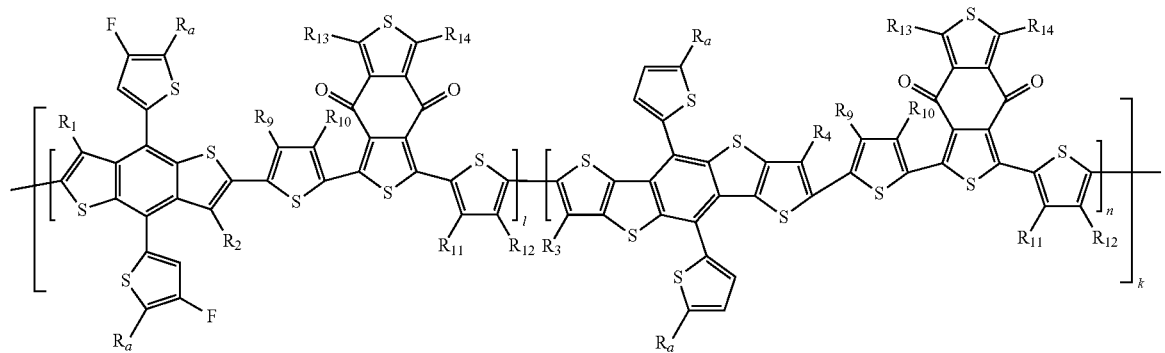
[Chemical Formula 29]
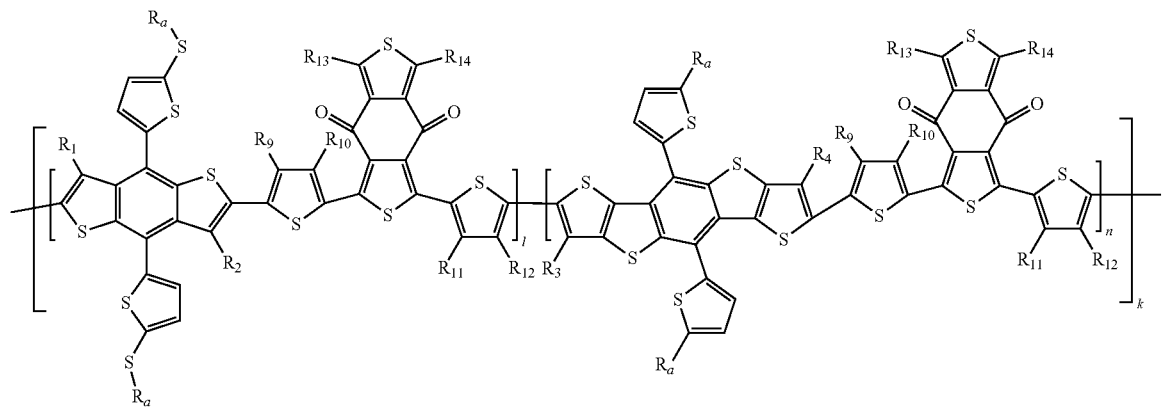
[Chemical Formula 30]

-continued
[Chemical Formula 31]
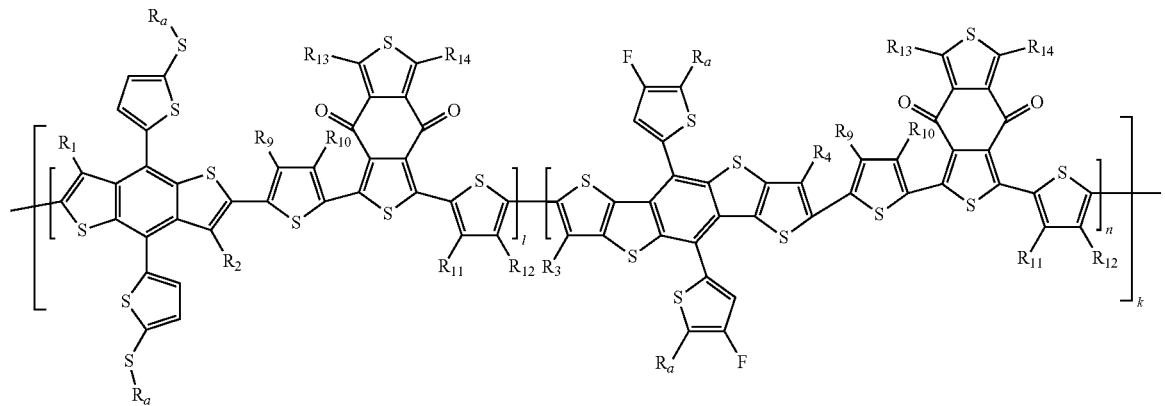
[Chemical Formula 32]
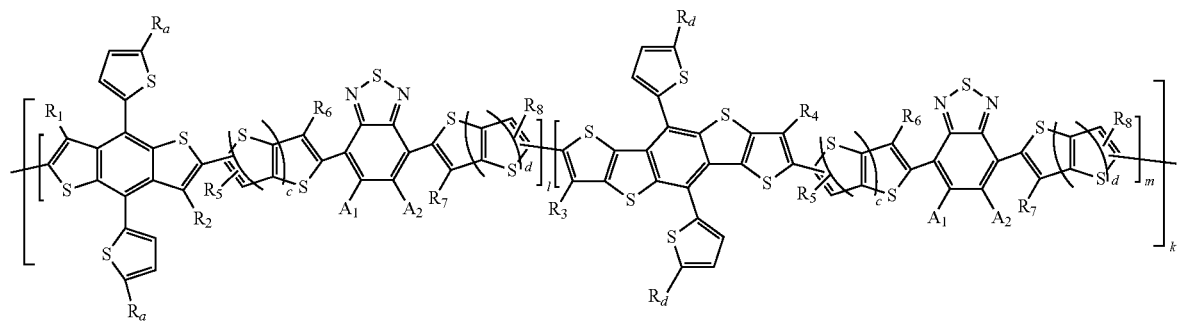
[Chemical Formula 33]
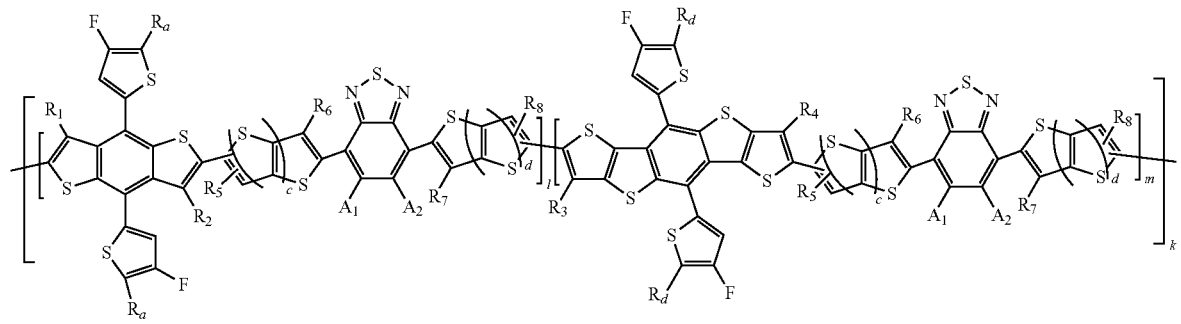
[Chemical Formula 34]
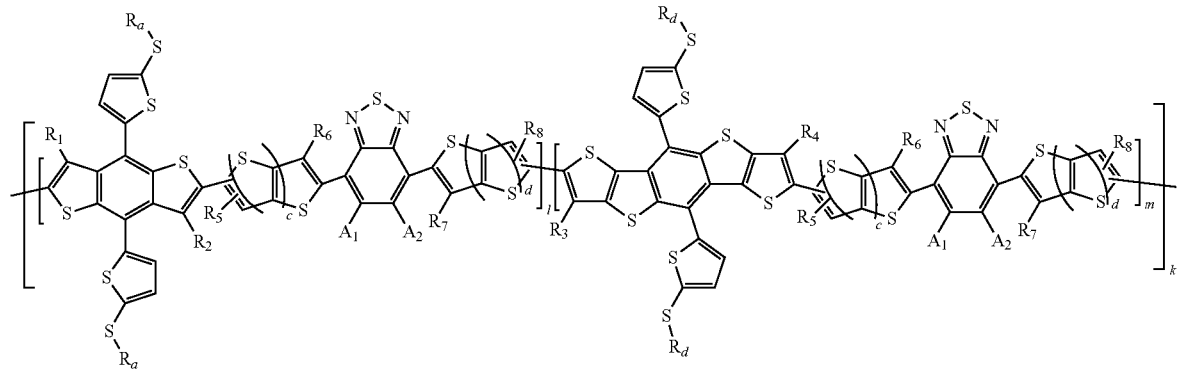

[Chemical Formula 35]

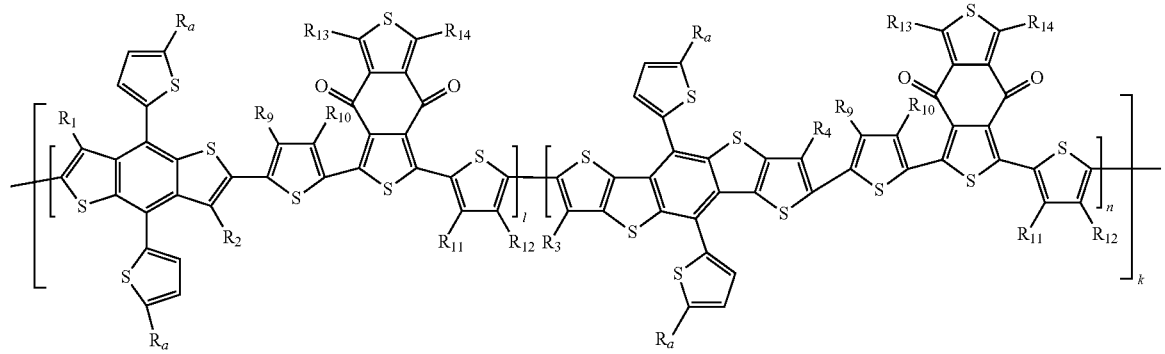

[Chemical Formula 36]

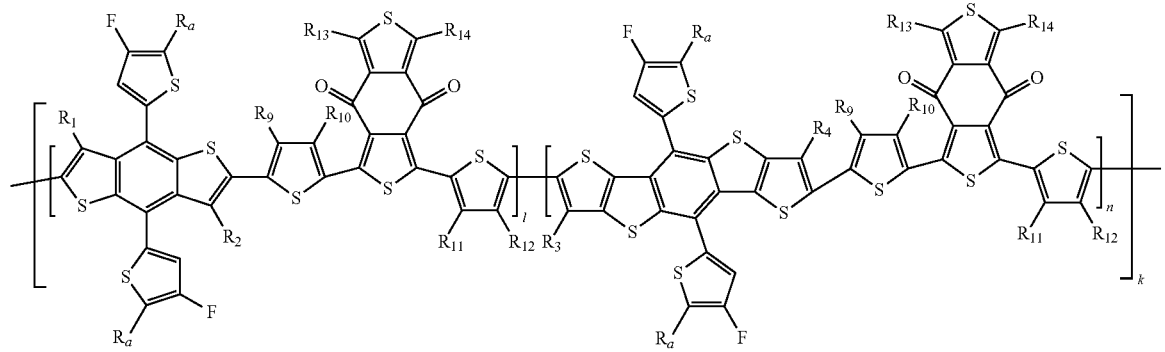

[Chemical Formula 37]

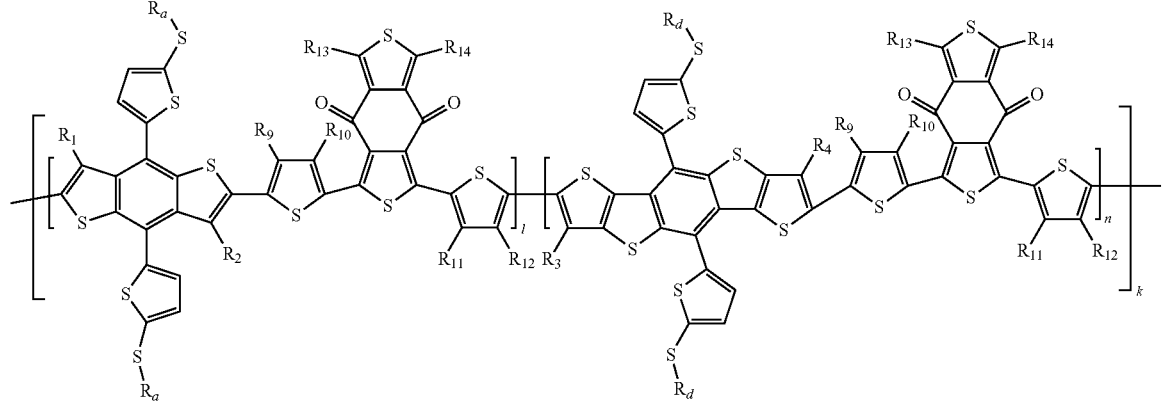

wherein:
$R_1$ to $R_{14}$, $R_a$, $A_1$, $A_2$, c, d, l, m and k have the same definitions as in Chemical Formulae 1 to 7; and
$R_d$ is a substituted or unsubstituted alkyl group, and is different from $R_a$.

11. The polymer of claim 1, wherein the polymer is a random polymer.

12. The polymer of claim 1, wherein the polymer has a number average molecular weight of 5,000 g/mol to 1,000,000 g/mol.

13. An organic solar cell comprising:
a first electrode;
a second electrode on the first electrode; and
one or more organic material layers between the first electrode and the second electrode and including a photoactive layer,
wherein the photoactive layer includes an electron donor and an electron acceptor, and
the electron donor includes the polymer of claim 1, and the electron acceptor includes a non-fullerene-based compound.

14. The organic solar cell of claim 13, wherein the non-fullerene-based compound is a compound of Chemical Formula A:

[Chemical Formula A]

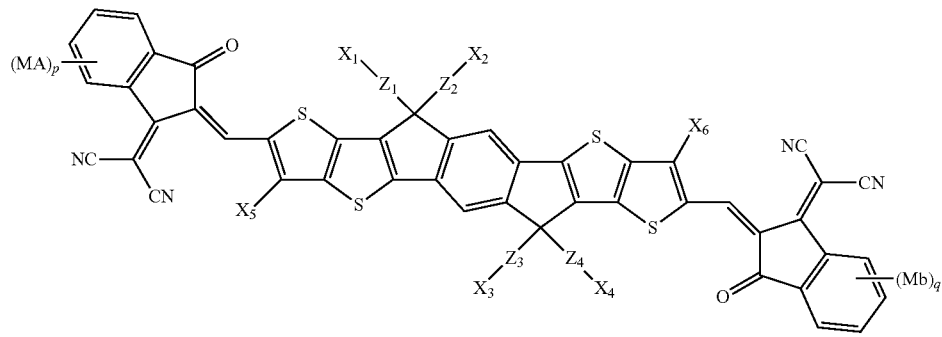

wherein:

$X_1$ to $X_6$ are the same as or different from each other, and are each independently hydrogen, or a substituted or unsubstituted alkyl group;

$Z_1$ to $Z_4$ are the same as or different from each other, and are each independently a substituted or unsubstituted arylene group, or a substituted or unsubstituted divalent heterocyclic group;

Ma and Mb are the same as or different from each other, and are each independently hydrogen, a halogen group, or a substituted or unsubstituted alkyl group;

p and q are the same as or different from each other, and are each independently an integer of 0 to 2; and when p or q is 2, structures in the parentheses are the same as each other.

15. The organic solar cell of claim 14, wherein Chemical Formula A is a compound of any one of Chemical Formulae A-1 to A-5:

[Chemical Formula A-1]

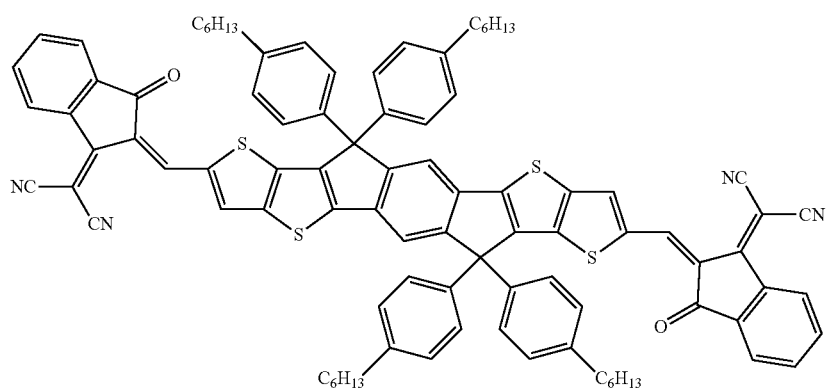

[Chemical Formula A-2]

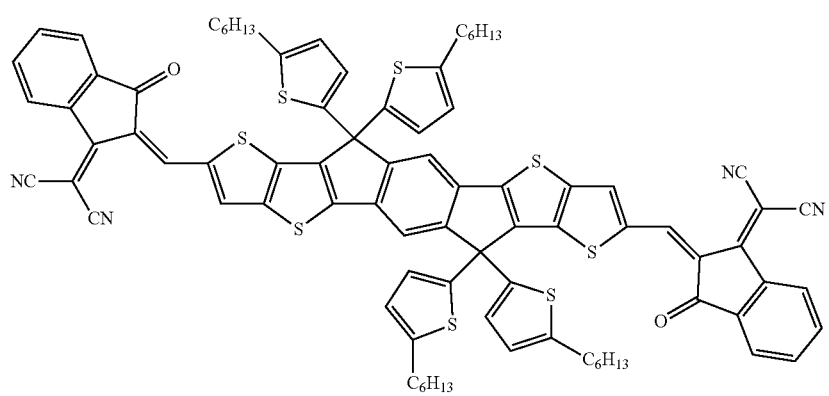

-continued
[Chemical Formula A-3]
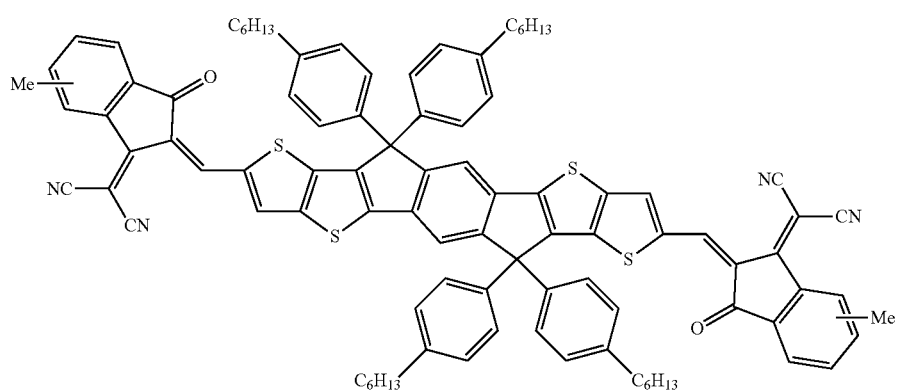
[Chemical Formula A-4]
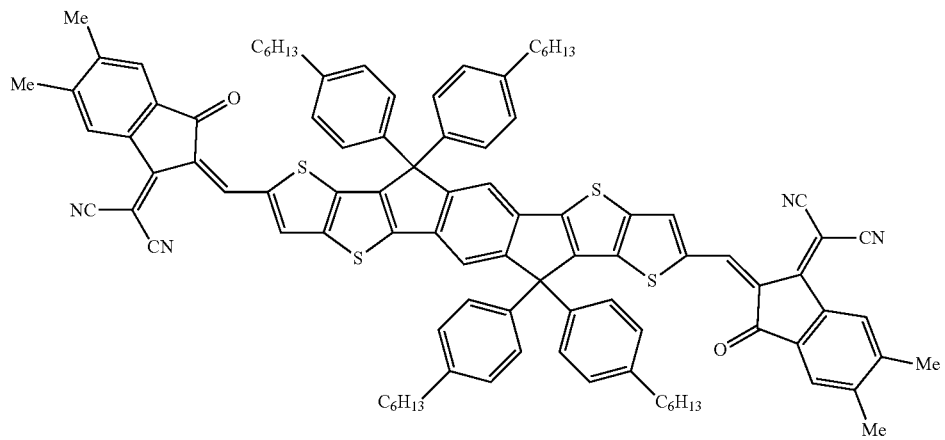
[Chemical Formula A-5]
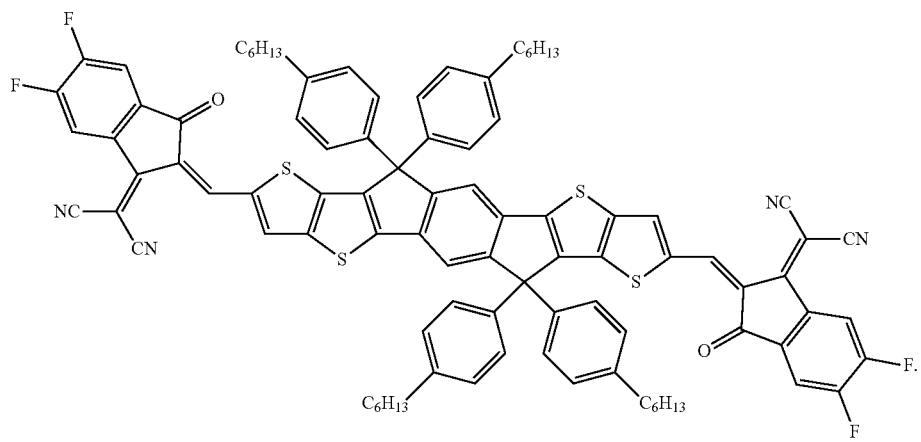
16. The organic solar cell of claim 13, wherein the electron donor and the electron acceptor have a mass ratio of 1:2 to 2:1.
* * * * *

UNITED STATES PATENT AND TRADEMARK OFFICE
CERTIFICATE OF CORRECTION

PATENT NO. : 10,982,042 B2
APPLICATION NO. : 16/484838
DATED : April 20, 2021
INVENTOR(S) : Kim et al.

Page 1 of 6

It is certified that error appears in the above-identified patent and that said Letters Patent is hereby corrected as shown below:

In the Claims

Column 70, Lines 1-18, Claim 7: Please delete Chemical Formula 6-6 and replace it with the following:

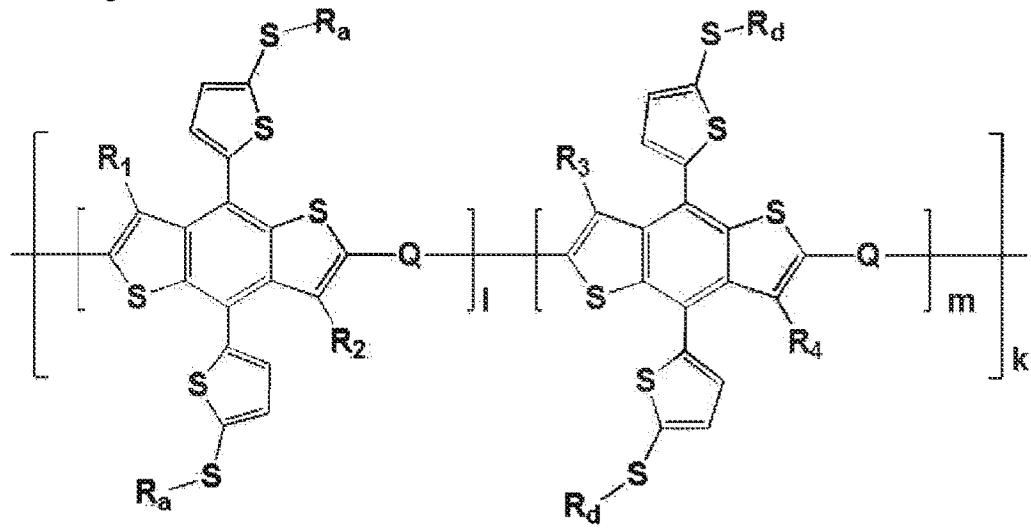

Signed and Sealed this
Fourteenth Day of September, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,982,042 B2

Columns 77-78, Claim 9: Please delete Chemical Formula 11 and replace it with the following:

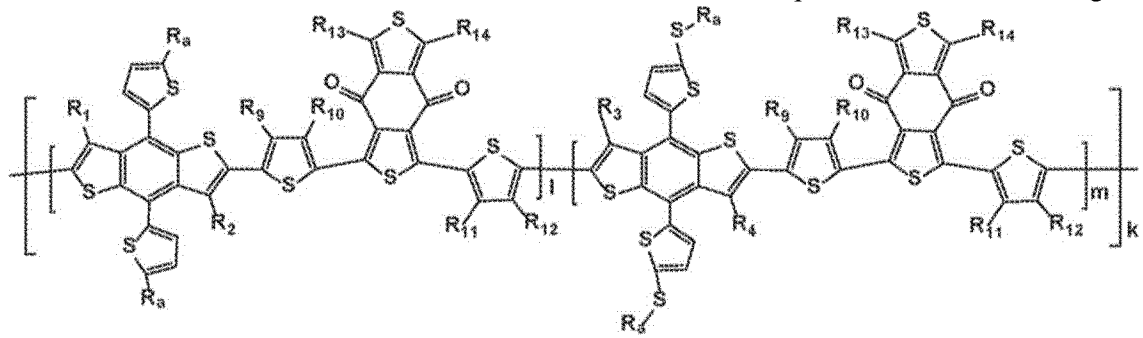

Columns 77-78, Claim 9: Please delete Chemical Formula 12 and replace it with the following:

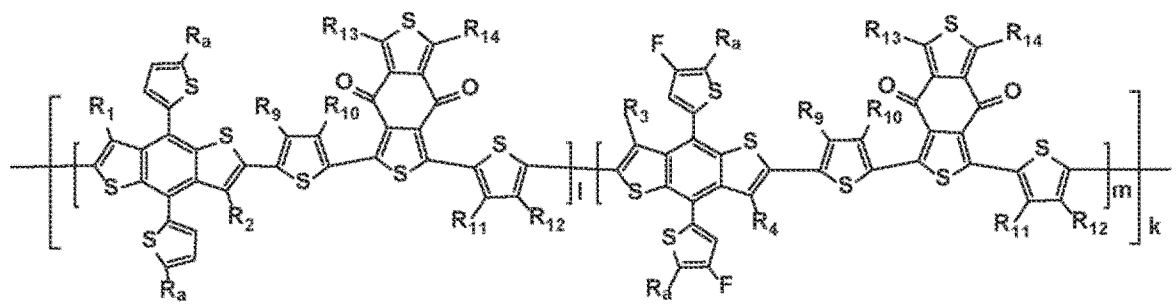

Columns 79-80, Claim 9: Please delete Chemical Formula 13 and replace it with the following:

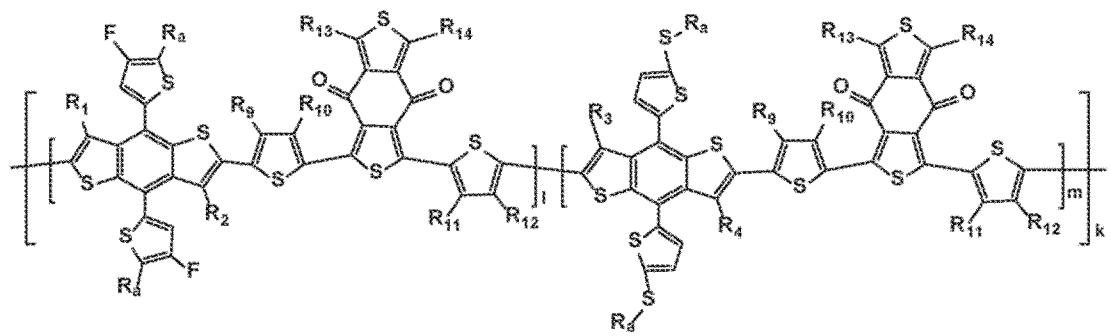

Columns 79-80, Claim 9: Please delete Chemical Formula 16 and replace it with the following:

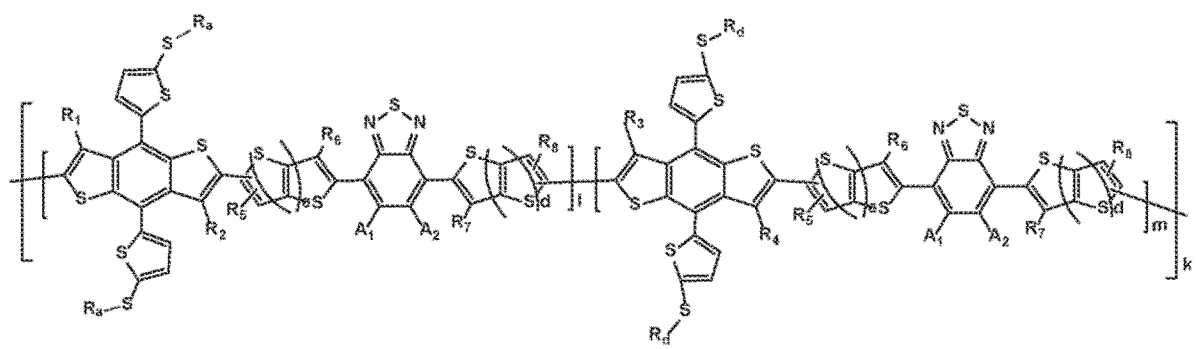

Columns 81-82, Claim 9: Please delete Chemical Formula 17 and replace it with the following:
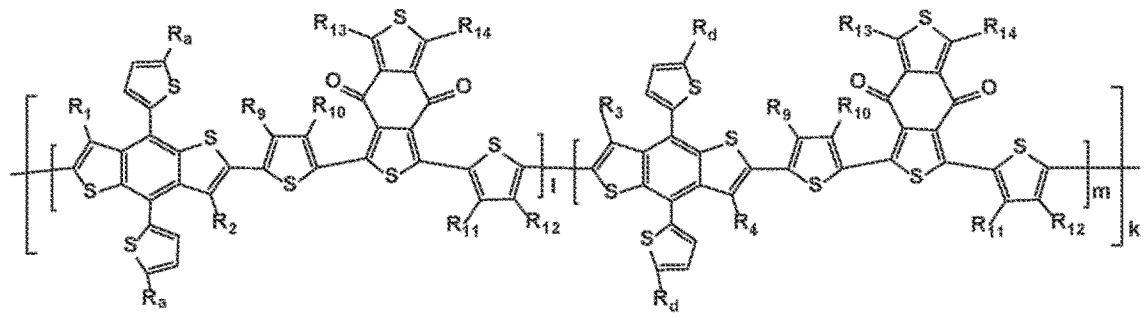
Columns 81-82, Claim 9: Please delete Chemical Formula 18 and replace it with the following:
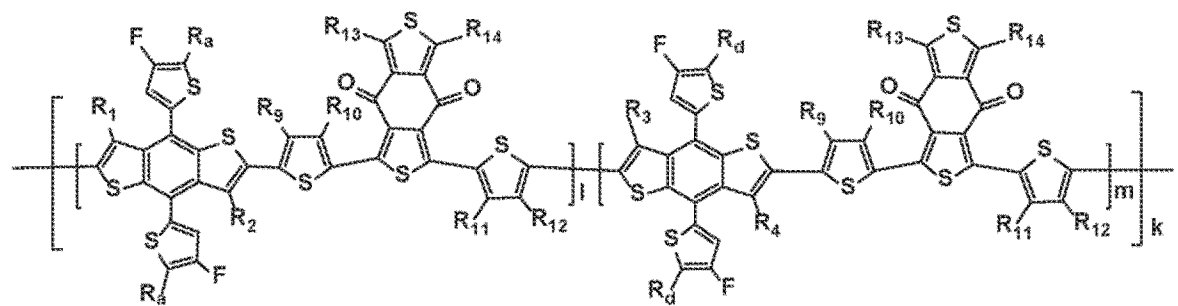
Columns 81-82, Claim 9: Please delete Chemical Formula 19 and replace it with the following:
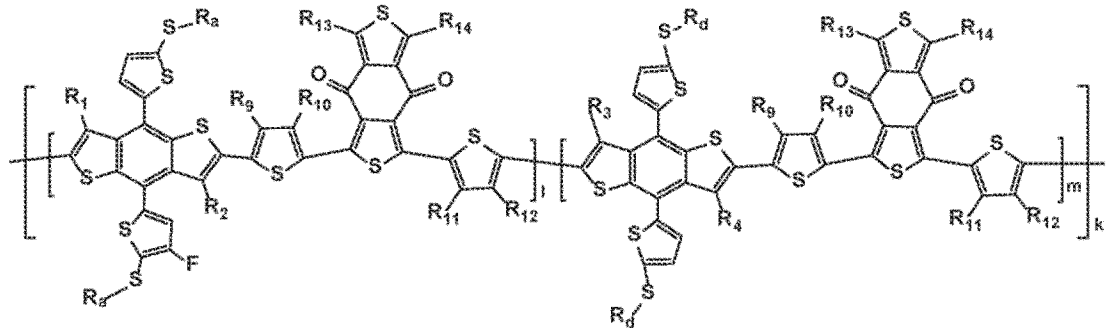
Columns 85-86, Claim 10: Please delete Chemical Formula 24 and replace it with the following:
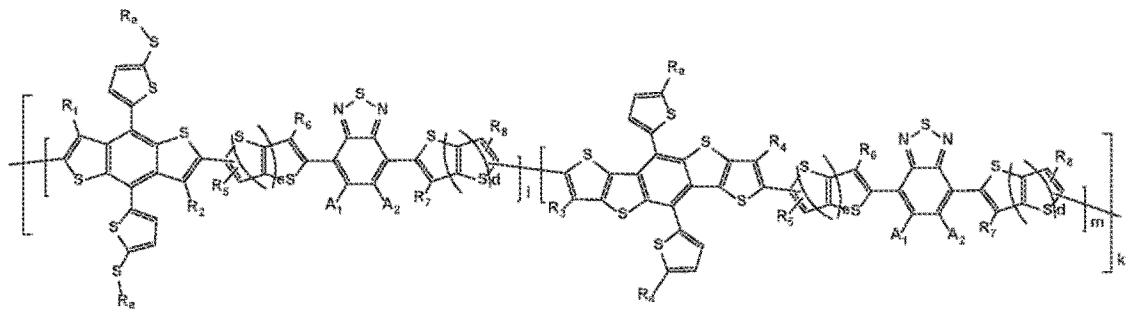

Columns 85-86, Claim 10: Please delete Chemical Formula 25 and replace it with the following:
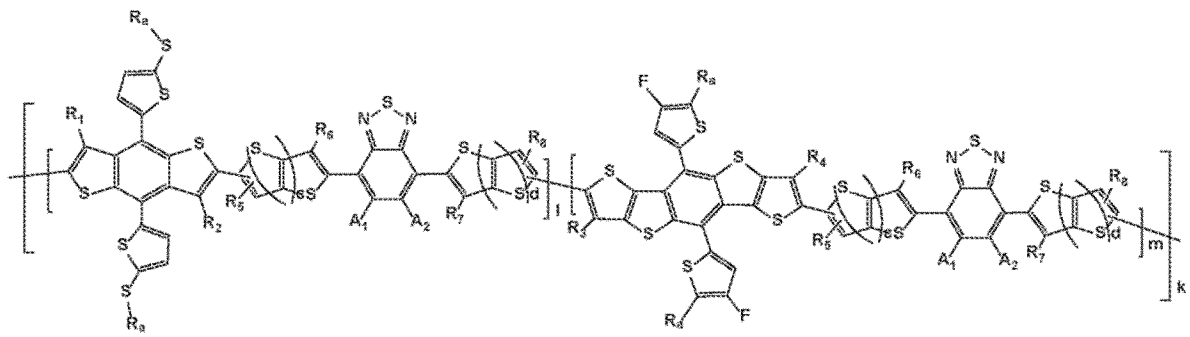
Columns 85-86, Claim 10: Please delete Chemical Formula 26 and replace it with the following:
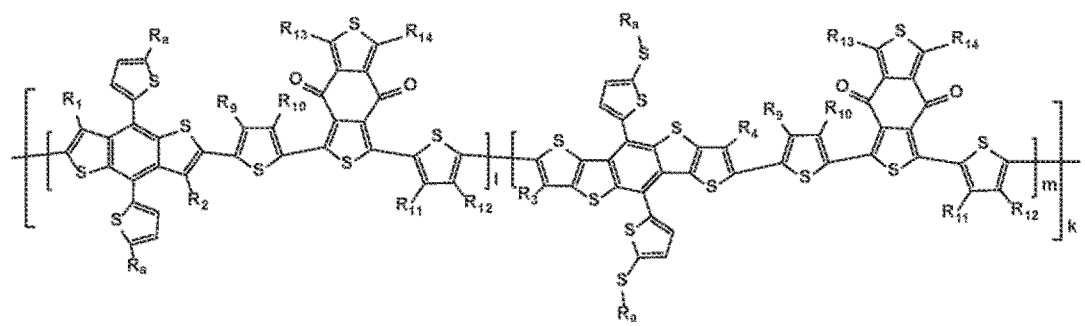
Columns 85-86, Claim 10: Please delete Chemical Formula 27 and replace it with the following:
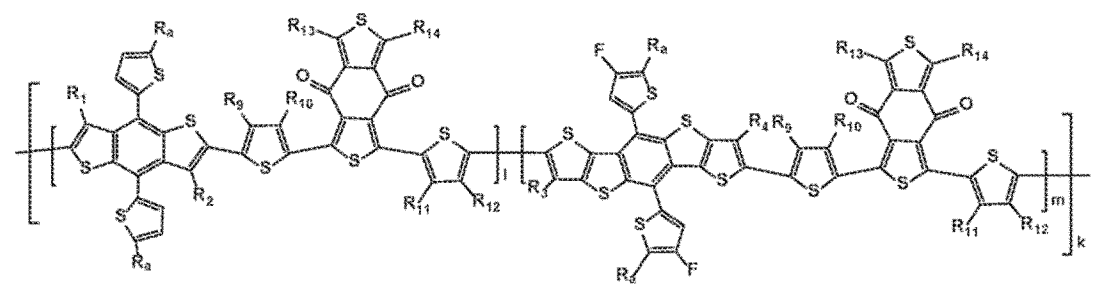
Columns 87-88, Claim 10: Please delete Chemical Formula 28 and replace it with the following:
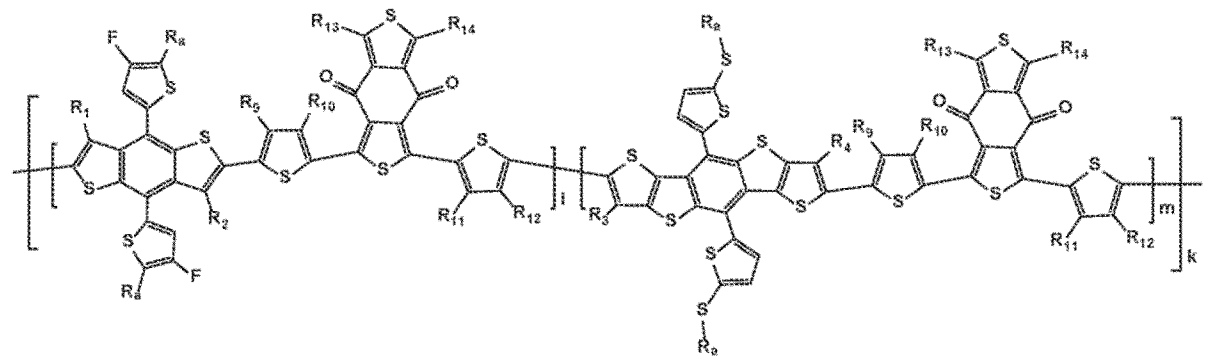

CERTIFICATE OF CORRECTION (continued)

Columns 87-88, Claim 10: Please delete Chemical Formula 29 and replace it with the following:

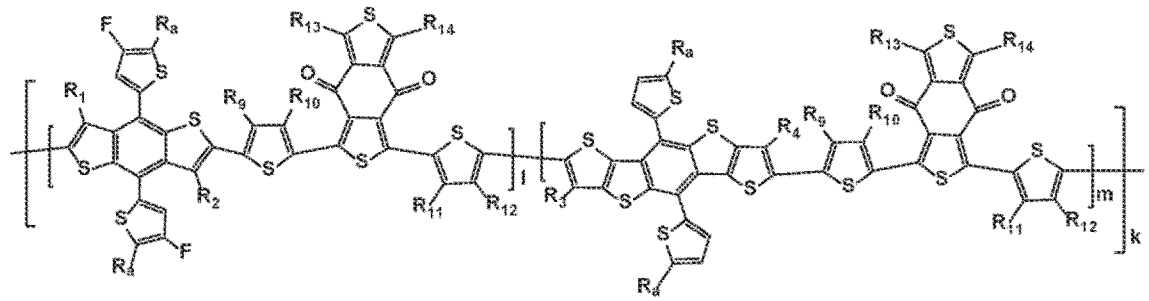

Columns 87-88, Claim 10: Please delete Chemical Formula 30 and replace it with the following:

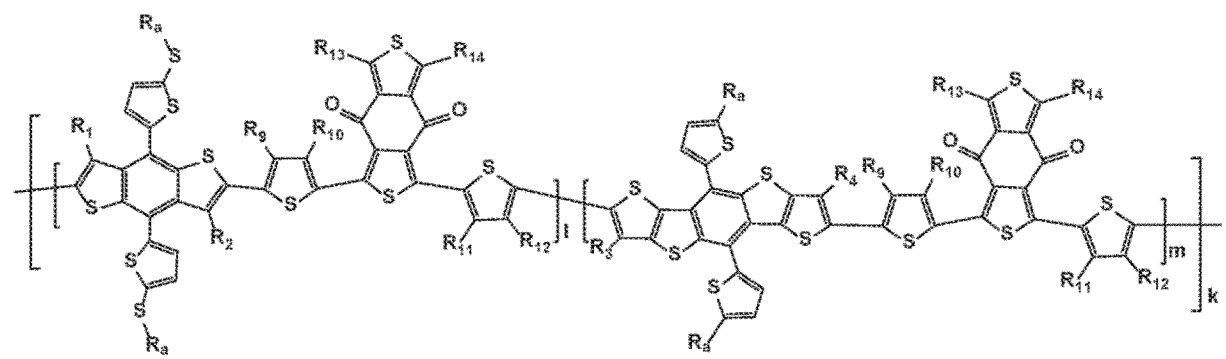

Columns 89-90, Claim 10: Please delete Chemical Formula 31 and replace it with the following:

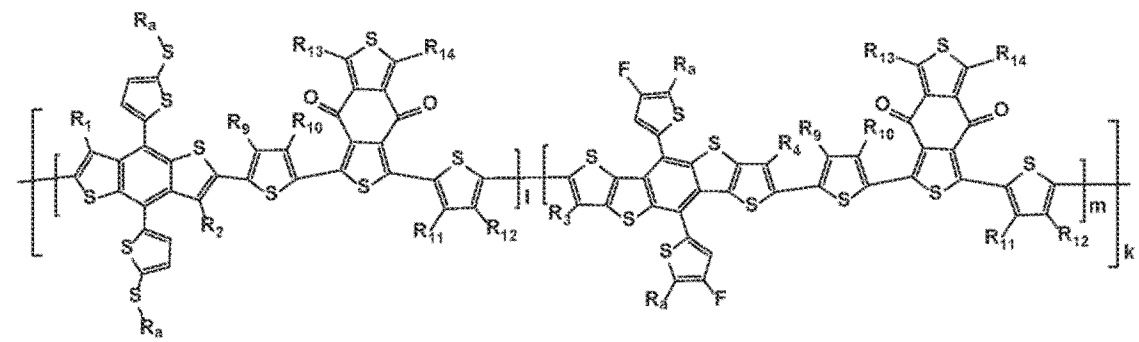

Columns 91-92, Claim 10: Please delete Chemical Formula 35 and replace it with the following:

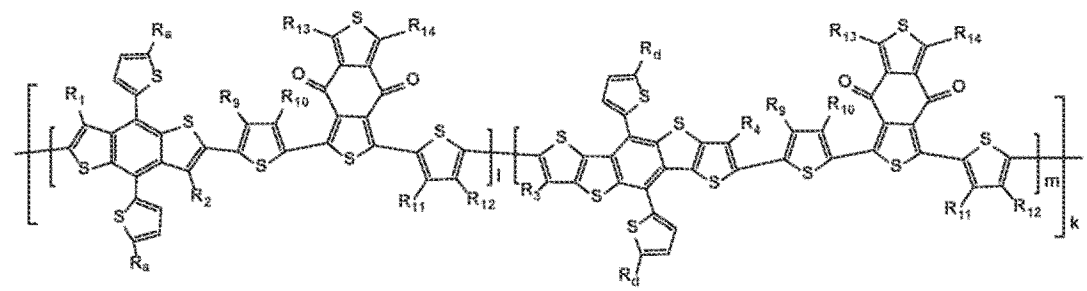

CERTIFICATE OF CORRECTION (continued)
U.S. Pat. No. 10,982,042 B2

Columns 91-92, Claim 10: Please delete Chemical Formula 36 and replace it with the following:

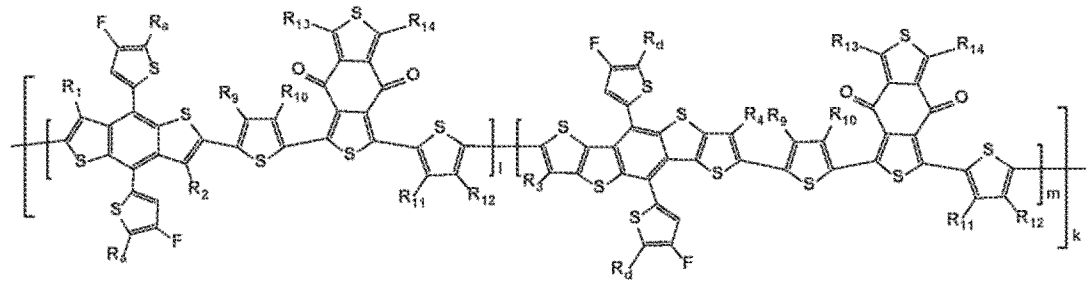

Columns 91-92, Claim 10: Please delete Chemical Formula 37 and replace it with the following: